(12) United States Patent
Cho et al.

(10) Patent No.: US 12,666,830 B2
(45) Date of Patent: Jun. 23, 2026

(54) DISPLAY DEVICE INCLUDING FIRST CONNECTION ELECTRODE BETWEEN DATA CONNECTION LINE AND DATA LINE

(71) Applicant: Samsung Display Co., LTD., Yongin-si (KR)

(72) Inventors: Young Jin Cho, Yongin-si (KR); Joong Soo Moon, Yongin-si (KR); Jeong Hun Bang, Yongin-si (KR); Min Cheol Lee, Yongin-si (KR); Kyung Hoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 392 days.

(21) Appl. No.: 18/311,778

(22) Filed: May 3, 2023

(65) Prior Publication Data

US 2023/0397462 A1     Dec. 7, 2023

(30) Foreign Application Priority Data

| | | |
|---|---|---|
| Jun. 3, 2022 | (KR) | 10-2022-0068052 |
| Nov. 8, 2022 | (KR) | 10-2022-0148038 |
| Mar. 23, 2023 | (KR) | 10-2023-0037943 |

(51) Int. Cl.
*H10K 59/131* (2023.01)
*H10K 59/121* (2023.01)
*H10K 59/88* (2023.01)

(52) U.S. Cl.
CPC ....... *H10K 59/131* (2023.02); *H10K 59/1213* (2023.02); *H10K 59/88* (2023.02)

(58) Field of Classification Search
CPC ... H10K 59/131; H10K 59/1213; H10K 59/88
See application file for complete search history.

(56) References Cited

U.S. PATENT DOCUMENTS

| | | |
|---|---|---|
| 11,404,523 B2 | 8/2022 | Kang et al. |
| 11,580,906 B2 | 2/2023 | Wang et al. |
| 12,295,220 B2 | 5/2025 | Lee et al. |

(Continued)

FOREIGN PATENT DOCUMENTS

| | | |
|---|---|---|
| KR | 10-2021-0041163 A | 4/2021 |
| KR | 10-2021-0111945 A | 9/2021 |
| KR | 10-2022-0033637 A | 3/2022 |

*Primary Examiner* — Chad M Dicke
*Assistant Examiner* — Jeremy Daniel Watts
(74) *Attorney, Agent, or Firm* — Womble Bond Dickinson (US) LLP

(57) ABSTRACT

A display device includes a plurality of sub-pixels arranged in a first direction and in a second direction; a plurality of data lines extending in the second direction; first data connection lines in the display area, and extending in the second direction, a first data connection line of the first data connection lines being spaced in the first direction from a data line of the plurality of data lines in a sub-pixel of the plurality of sub-pixels; and second data connection lines in the display area, extending in the first direction and coupled to at least one of the first data connection lines. The sub-pixel includes a first connection electrode coupled to a first electrode of a driving transistor of the sub-pixel, and the first connection electrode does not overlap the first data connection line and is between the first data connection line and the data line.

44 Claims, 38 Drawing Sheets

(56) References Cited

U.S. PATENT DOCUMENTS

| 2021/0005697 A1* | 1/2021 | Kang | ...................... | H10K 59/88 |
| 2021/0273035 A1 | 9/2021 | Cho et al. | | |
| 2021/0320163 A1 | 10/2021 | Bang et al. | | |
| 2022/0005886 A1* | 1/2022 | Jeong | ...................... | H10K 59/88 |
| 2022/0069044 A1* | 3/2022 | Kwak | ................ | H10K 59/1213 |
| 2022/0156477 A1* | 5/2022 | Lee | .................... | G06V 40/1318 |
| 2024/0257730 A1* | 8/2024 | Liu | .................... | H10K 59/1201 |

\* cited by examiner

DISPLAY DEVICE INCLUDING FIRST CONNECTION ELECTRODE BETWEEN DATA CONNECTION LINE AND DATA LINE

CROSS-REFERENCE TO RELATED APPLICATIONS

This application claims priority to and the benefit of Korean Patent Application No. 10-2022-0068052, filed on Jun. 3, 2022, Korean Patent Application No. 10-2022-0148038, filed on Nov. 8, 2022, and Korean Patent Application No. 10-2023-0037943, filed on Mar. 23, 2023, in the Korean Intellectual Property Office, the entire contents of each of which are hereby incorporated by reference.

BACKGROUND

1. Field

The present disclosure relates to a display device.

2. Description of the Related Art

With the advance of information-oriented society, more demands are placed on display devices for displaying images in one or more suitable ways. For example, display devices are employed in one or more suitable electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, because each of pixels of a display panel includes a light emitting element capable of emitting light by itself, an image can be displayed without a backlight unit providing light to the display panel.

The display device may further include pixels that emit set or predetermined light, scan lines, data lines, and power lines for driving the pixels, a scan driver that outputs scan signals to the scan lines, and a display driver that outputs data voltages to the data lines.

The display device includes a display area including pixels to display an image, and a non-display area disposed around the display area. Recently, because the size of the non-display area has been being reduced or minimized in the display device, a space for arranging fan-out lines that couple (e.g., connect) the display driver to the data lines may be insufficient in the non-display area.

SUMMARY

Aspects of the present disclosure relate to a display device capable of removing a spot on a display surface caused by fan-out lines due to a reduction in the size of a non-display area.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to one embodiment of the present disclosure, there is provided a display device including: a display area having a plurality of sub-pixels arranged in a first direction and in a second direction crossing the first direction and a non-display area around (e.g., partially or entirely surrounding) the display area; a plurality of data lines in the display area and extending in the second direction; first data connection lines in the display area and extending in the second direction, a first data connection line of the first data connection lines being spaced in the first direction from a data line of the plurality of data lines in a sub-pixel of the plurality of sub-pixels; and second data connection lines in the display area, extending in the first direction, and coupled (e.g., connected) to at least one of the first data connection lines, wherein the sub-pixel includes a first connection electrode coupled (e.g., connected) to a first electrode of a driving transistor of the sub-pixel, and the first connection electrode does not overlap the first data connection line and is between the first data connection line and the data line.

The first connection electrode may not overlap the data line, and a part of the first data connection line may overlap the first electrode of the driving transistor.

The display device may further include an initialization voltage line extending in the first direction and including a protrusion protruding in the second direction to be adjacent to the first connection electrode. The protrusion of the initialization voltage line may overlap the first data connection line.

A width of the protrusion of the initialization voltage line may be greater than a width of the first data connection line.

The display device may further include a plurality of first vertical lines extending in the second direction, a first vertical line of the plurality of first vertical lines being spaced in the first direction from the first data connection line and from the data line. A distance between the first vertical line and the data line may be smaller than a distance between the first vertical line and the first data connection line.

The display device may further include a voltage connection electrode in the sub-pixel and coupled (e.g., connected) to the first vertical line. At least a part of the voltage connection electrode may overlap the first data connection line.

The voltage connection electrode may overlap the first electrode of the driving transistor.

A greatest (e.g., maximum) line width of the voltage connection electrode may be greater than a width of the first data connection line.

The display device may further include a bias voltage line extending in the first direction; and a first transistor coupled (e.g., connected) to the bias voltage line. The first transistor may be coupled (e.g., connected) to the first connection electrode.

The display area may include a first display area and a second display area adjacent to the first display area in the first direction, and the plurality of data lines may include first data lines in the first display area and coupled (e.g., connected) to the second data connection lines, and second data lines in the second display area and not coupled (e.g., connected) to the second data connection lines.

At least some of the first data connection lines may be electrically coupled (e.g., connected) to the first data lines through the second data connection lines.

The display device may further include first fan-out lines in the non-display area and coupled (e.g., connected) to the first data connection lines; and second fan-out lines in the non-display area and coupled (e.g., connected) to the second data connection lines.

The display device may further include a plurality of vertical dummy patterns in the second display area and spaced from the first data connection lines in the second direction; and a plurality of horizontal dummy patterns spaced from the second data connection lines in the first direction.

The display device may further include a horizontal power line extending in the first direction in the display area and spaced from the second data connection lines in the second direction; and a vertical power line extending in the second direction in the first display area and spaced from the first data line.

The first connection electrode may overlap the data line, and a part of the first data connection line may overlap the first electrode of the driving transistor.

According to another embodiment of the present disclosure, there is provided a display device including: a first sub-pixel and a second sub-pixel, each including a driving transistor and a first connection electrode coupled (e.g., connected) to a first electrode of the driving transistor, and being adjacent to each other in a first direction; a plurality of first data connection lines in the first sub-pixel and the second sub-pixel, spaced from each other in the first direction, and extending in a second direction crossing the first direction; a plurality of data lines spaced from each other in the first direction with the plurality of first data connection lines interposed therebetween and extending in the second direction; a second data connection line extending in the first direction, in the first sub-pixel and the second sub-pixel, and coupled (e.g., connected) to any one of the first data connection lines; and a plurality of first vertical lines extending in the second direction and spaced from the plurality of data lines in the first direction, wherein the first connection electrode of the first sub-pixel is between a first data connection line corresponding to the first sub-pixel of the plurality of first data connection lines and a data line corresponding to the first sub-pixel of the plurality of data lines, and the first connection electrode of the second sub-pixel is between a first data connection line corresponding to the second sub-pixel of the plurality of first data connection lines and a data line corresponding to the second sub-pixel of the plurality of data lines.

A distance between the first data connection line corresponding to the first sub-pixel and the first data connection line corresponding to the second sub-pixel may be smaller than a distance between the data line corresponding to the first sub-pixel and the data line corresponding to the second sub-pixel.

The first data connection line corresponding to the first sub-pixel and the first data connection line corresponding to the second sub-pixel may be between the first connection electrodes of the first sub-pixel and the second sub-pixel.

The first data connection lines corresponding to the first and second sub-pixels respectively may overlap the corresponding first electrode of the driving transistor without overlapping the corresponding first connection electrode.

The display device may further include an initialization voltage line extending in the first direction and in the first sub-pixel and the second sub-pixel. The initialization voltage line may be between the first connection electrodes of the first sub-pixel and the second sub-pixel, and include a protrusion protruding in the second direction.

The protrusion may overlap the first data connection lines corresponding to the first sub-pixel and the second sub-pixel, and a width of the protrusion may be greater than a width of the first data connection lines corresponding to the first sub-pixel and the second sub-pixel.

The width of the protrusion may be greater than a distance between the first data connection line corresponding to the first sub-pixel and the first data connection line corresponding to the second sub-pixel.

The display device may further include a voltage connection electrode coupled (e.g., connected) to a first vertical line of the plurality of first vertical lines, and between the first data connection lines corresponding to the first sub-pixel and the second sub-pixel. The voltage connection electrode may overlap the first data connection lines corresponding to the first sub-pixel and the second sub-pixel.

The voltage connection electrode may overlap each of the first electrode of the driving transistor of the first sub-pixel and the first electrode of the driving transistor of the second sub-pixel.

A smallest (e.g., minimum) line width of the voltage connection electrode may be greater than a distance between the first data connection lines corresponding to the first sub-pixel and the second sub-pixel.

A greatest (e.g., maximum) line width of the voltage connection electrode may be greater than a sum of widths of each of the first data connection lines corresponding to the first sub-pixel and the second sub-pixel and a distance between the first data connection lines corresponding to the first sub-pixel and the second sub-pixel.

The display device may further include a first sub-initialization voltage line extending in the first direction and coupled (e.g., connected) to the second sub-pixel, and a second sub-initialization voltage line extending in the first direction and coupled (e.g., connected) to the first sub-pixel.

The display device may further include a second connection electrode on the same layer as the second sub-initialization voltage line and in the second sub-pixel to be coupled (e.g., connected) to the first sub-initialization voltage line.

A distance between the first data connection line corresponding to the first sub-pixel and the first data connection line corresponding to the second sub-pixel may be equal to a distance between the data line corresponding to the first sub-pixel and the data line corresponding to the second sub-pixel.

The data lines corresponding to the first sub-pixel and the second sub-pixel respectively may overlap the first connection electrodes of the first sub-pixel and the second sub-pixel.

According to still another embodiment of the present disclosure, there is provided a display device including: a display area having a plurality of sub-pixels arranged in a first direction and in a second direction crossing the first direction, and a non-display area around (e.g., partially or entirely surrounding) the display area; a plurality of data lines in the display area and extending in the second direction; first data connection lines in the display area, extending in the second direction, and spaced in the first direction from a data line of the plurality of data lines in a sub-pixel of the plurality of sub-pixels; and second data connection lines in the display area, extending in the first direction, and coupled (e.g., connected) to at least one of the first data connection lines, wherein the sub-pixel includes a first connection electrode coupled (e.g., connected) to a first electrode of a driving transistor of the sub-pixel, and wherein the first connection electrode does not overlap a first data connection line of the first data connection lines in the sub-pixel, and includes a first portion extending in a diagonal direction crossing (e.g., intersecting) the first direction and the second direction, and a second portion coupled (e.g., connected) to the first portion and extending in the second direction.

The first connection electrode may include a first contact portion in the first portion and in which an electrode contact hole is disposed, and a second contact portion in the second portion and in which a first contact hole is disposed, and each lateral side of the first contact portion may not be parallel (e.g., may be substantially non-parallel) to the first data connection line.

The first contact portion may include a first lateral side, and a distance between the first data connection line and a first end of the first lateral side may be smaller than a distance between the first data connection line and a second end of the first lateral side.

At least some of lateral sides of the second contact portion may be parallel (e.g., substantially parallel) to the first data connection line.

A greatest (e.g., maximum) width of the electrode contact hole in the second direction may be different from a greatest (e.g., maximum) width of the first contact hole in the second direction.

An extension direction of a long axis of the electrode contact hole may be different from an extension direction of a long axis of the first contact hole.

An angle between an extension direction of the first portion of the first connection electrode and an extension direction of the second portion of the first connection electrode may be in a range of about 30° to about 60°.

At least a part of the first connection electrode may overlap the data line, and a part of the first data connection line may overlap the first electrode of the driving transistor.

The display device may further include an initialization voltage line extending in the first direction and including a protrusion protruding in the second direction to be adjacent to the first connection electrode, and the protrusion of the initialization voltage line may overlap the first data connection line.

A width of the protrusion of the initialization voltage line may be greater than a width of the first data connection line.

The display device may further include a voltage connection electrode in the sub-pixel and overlapping the first data connection line, and the voltage connection electrode may overlap the first electrode of the driving transistor.

A greatest (e.g., maximum) line width of the voltage connection electrode may be greater than a width of the first data connection line.

At least a part of the voltage connection electrode may have a recessed shape corresponding to the first portion of the first connection electrode.

A width of a portion of the voltage connection electrode adjacent to the first portion of the first connection electrode may be smaller than a width of a portion of the voltage connection electrode adjacent to the second portion of the first connection electrode.

The display device according to one embodiment may have a wiring arrangement structure or a pattern structure that does not affect the amount of light emitted even when an electrical signal is applied to other wires when sub-pixels emit light. Accordingly, even when the display device includes wires to which different signals are applied depending on their positions in a display area, it is possible to prevent, or reduce the likelihood of, a spot from being recognized from the outside by a change in the amount of light emitted.

However, the features of the present disclosure are not limited to the aforementioned features, and one or more suitable other features are included in the present disclosure.

BRIEF DESCRIPTION OF THE DRAWINGS

The above and other aspects and features of the present disclosure will become more apparent by describing in more detail embodiments thereof with reference to the attached drawings, in which:

FIG. 4 is a plan view illustrating area A of FIG. 3 in more detail;

FIG. 7 is a plan view illustrating wires disposed in a first display area and a second display area in a display device according to one embodiment;

FIG. 8 is a plan view illustrating wires disposed in a third display area and a fourth display area in a display device according to one embodiment;

FIG. 14 is a cross-sectional view taken along line N2-N2' of FIG. 13;

DETAILED DESCRIPTION

Figure 1:
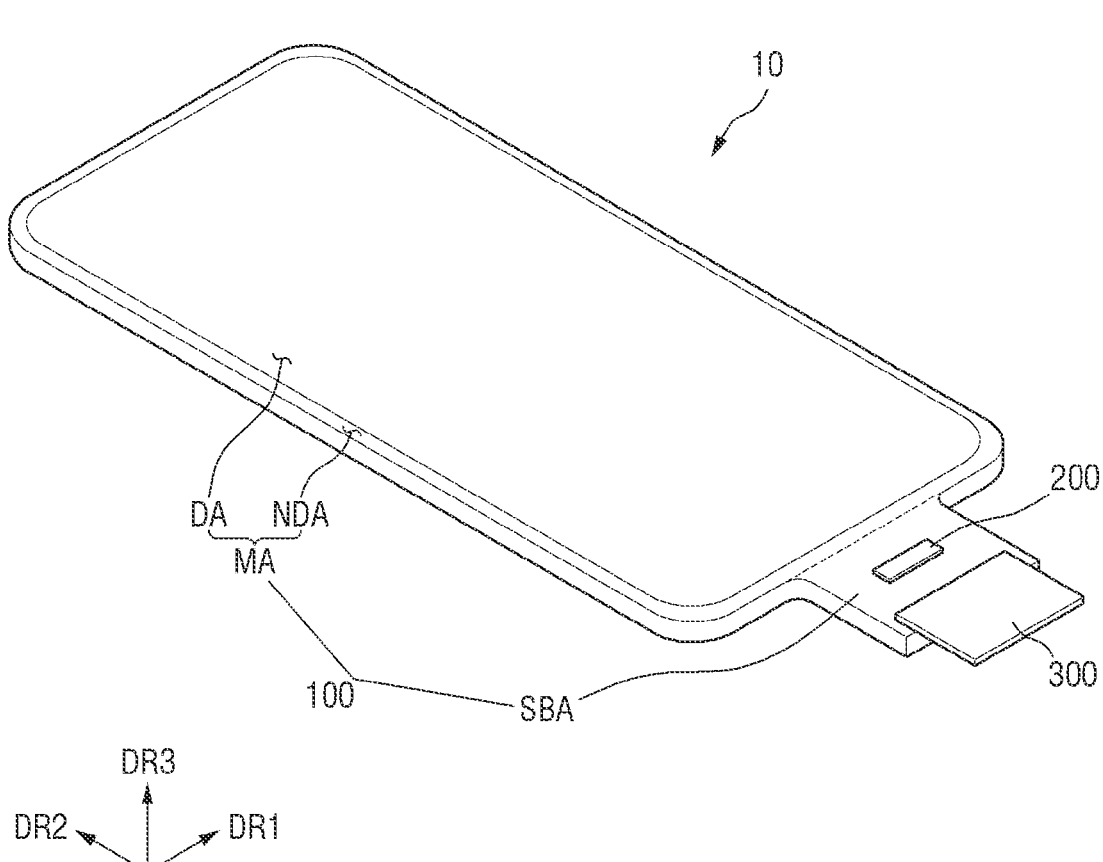
FIG. 1 is a perspective view illustrating a display device according to one embodiment.

Aspects and features of the present disclosure and methods of accomplishing the same may be understood more readily by reference to the following detailed description of example embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the present disclosure to those skilled in the art, and the present disclosure will only be defined by the appended claims and equivalents thereof.

As utilized herein, the term "and/or" includes any and all combinations of one or more of the associated listed items. Expressions such as "at least one of," when preceding a list of elements, modify the entire list of elements and do not modify the individual elements of the list. As utilized herein, the utilize of the term "may," when describing embodiments of the present disclosure, refers to "one or more embodiments of the present disclosure."

As utilized herein, the term "substantially" and similar terms are utilized as terms of approximation and not as terms of degree, and are intended to account for the inherent deviations in measured or calculated values that would be recognized by those of ordinary skill in the art. Also, the term "about" and similar terms, when utilized herein in connection with a numerical value or a numerical range, are inclusive of the stated value and refer to within an acceptable range of deviation for the particular value as determined by one of ordinary skill in the art, considering the measurement in question and the error associated with measurement of the particular quantity (e.g., the limitations of the measurement system). For example, "about" may refer to within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

When an element or layer is referred to as being "on" another element or layer, it may be directly on the other element or layer, or one or more intervening elements or layers may be present. Similarly, when an element or layer is referred to as being "below", "to the left of", or "to the right of" another element or layer, it may be immediately adjacent to the other element or layer, or one or more intervening elements or layers may be present. The same reference numbers indicate the same components throughout the specification.

Although the terms first, second, etc. may be utilized herein to describe one or more suitable components, these components should not be limited by these terms. These terms are utilized to distinguish one component from another component. Thus, a first component discussed could be termed a second component without departing from the teachings of the present disclosure.

Hereinafter, embodiments will be described with reference to the accompanying drawings.

FIG. 1 is a perspective view illustrating a display device according to one embodiment.

Referring to FIG. 1, a display device 10 is a device for displaying a moving image or a still image. The display device 10 may be utilized as a display screen of one or more suitable devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 10 may be alight emitting display device such as an organic light emitting display utilizing (e.g., using) an organic light emitting diode, a quantum dot light emitting display including a quantum dot light emitting layer, an inorganic light emitting display including (e.g., being) an inorganic semiconductor, and a micro light emitting display utilizing (e.g., using) a micro or nano light emitting diode (LED). In the following description, it is assumed that the display device 10 is an organic light emitting display device, but the present disclosure is not limited thereto.

The display device 10 includes a display panel 100, a display driving circuit 200, and a circuit board 300.

The display panel 100 may, in plan view, be formed in a rectangular shape having short sides in a first direction DR1 and long sides in a second direction DR2 crossing the first direction DR1. A corner where a short side in the first direction DR1 and a long side in the second direction DR2 meet may be rounded to have a set or predetermined curvature, or may be right-angled. The planar shape of the display panel 100 is not limited to the rectangular shape, and may be formed, for example, in another polygonal shape, a circular shape, or an elliptical shape. The display panel 100 may be formed to be flat, but is not limited thereto. For example, the display panel 100 may include a curved portion formed at left and right ends and having a constant curvature or a varying curvature. In some embodiments, the display panel 100 may be formed flexibly so that it can be curved, bent, folded, and/or rolled.

A substrate SUB of the display panel 100 may include a main region MA and a sub-region SBA. The main region MA may include a display area DA for displaying an image and a non-display area NDA that is a peripheral area of the display area DA. The display area DA may include sub-pixels SPX (see FIG. 5) for displaying an image.

The sub-region SBA may protrude from one side of the main region MA in the second direction DR2. Although it is shown in FIG. 1 that the sub-region SBA is unfolded, the sub-region SBA may be bent and, in this case, arranged on a bottom surface of the display panel 100. In the case where the sub-region SBA is bent, it may overlap the main region MA in a thickness direction DR3 (or third direction) of the substrate SUB. The display driving circuit 200 may be arranged in the sub-region SBA.

The display driving circuit 200 may generate signals and voltages for driving the display panel 100. The display driving circuit 200 may be formed as an integrated circuit (IC) and coupled (e.g., attached) onto the display panel 100 by a chip on glass (COG) method, a chip on plastic (COP) method, and/or an ultrasonic bonding method, but the present disclosure is not limited thereto. For example, the display driving circuit 200 may be coupled (e.g., attached) onto the circuit board 300 by a chip on film (COF) method.

The circuit board 300 may be coupled (e.g., attached) to one end of the sub-region SBA of the display panel 100. Thus, the circuit board 300 may be electrically coupled (e.g., connected) to the display panel 100 and the display driving circuit 200. The display panel 100 and the display driving circuit 200 may receive digital video data, timing signals, and/or driving voltages through the circuit board 300. The circuit board 300 may be a flexible printed circuit board, a printed circuit board, or a flexible film such as a chip on film.

Figure 2:
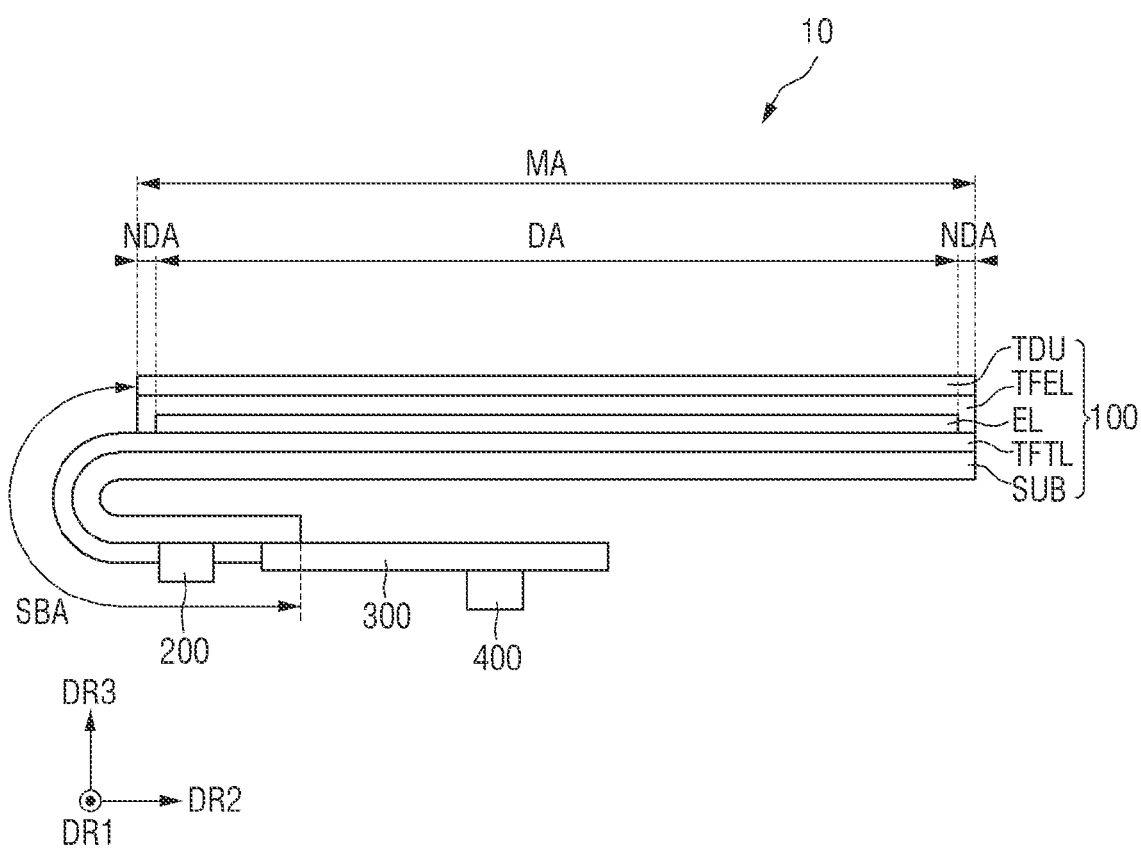
FIG. 2 is a side view illustrating a display device according to one embodiment.

FIG. 2 is a side view illustrating a display device according to one embodiment. FIG. 2 illustrates that the sub-region SBA of the display device 10 is bent toward the bottom surface of the display device 10.

Referring to FIG. 2, the display panel 100 may include the substrate SUB, a thin film transistor layer TFTL, a light emitting element layer EL, an encapsulation layer TFEL, and a touch sensing layer TDU.

The substrate SUB may be formed of an insulating material such as polymer resin. For example, the substrate SUB may be formed of polyimide. The substrate SUB may be a flexible substrate which can be bent, folded and/or rolled.

The thin film transistor layer TFTL may be disposed on the substrate SUB. The thin film transistor layer TFTL may be arranged in the main region MA and the sub-region SBA. The thin film transistor layer TFTL includes thin film transistors.

The light emitting element layer EL may be disposed on the thin film transistor layer TFTL. The light emitting element layer EL may be arranged in the display area DA of the main region MA. The light emitting element layer EL includes light emitting elements arranged in emission portions.

The encapsulation layer TFEL may be disposed on the light emitting element layer EL. The encapsulation layer TFEL may be arranged in the display area DA and the non-display area NDA of the main region MA. The encapsulation layer TFEL may include at least one inorganic layer and/or at least one organic layer for encapsulating the light emitting element layer EL.

The touch sensing layer TDU may be disposed on the encapsulation layer TFEL. The touch sensing layer TDU may be disposed in the display area DA and the non-display area NDA of the main region MA. The touch sensing layer TDU may sense (e.g., be configured to sense) a touch of a person or an object utilizing (e.g., using) touch electrodes.

A cover window may be disposed on the touch sensing layer TDU to protect an upper portion of the display panel 100. The cover window may be coupled (e.g., attached) onto the touch sensing layer TDU with a transparent adhesive material such as an optically clear adhesive (OCA) film or an optically clear resin (OCR). The cover window may be made of an inorganic material such as glass, and/or an organic material such as plastic and/or a polymer material.

In some embodiments, an anti-reflection member may be further disposed between the touch sensing layer TDU and the cover window to prevent or reduce a decrease in visibility of the image displayed by the display panel 100 due to reflection of external light by the display panel 100. The anti-reflection member may be a polarizing film. In some embodiments, the anti-reflection member may include a color filter and a light blocking organic layer such as a black matrix, or may include an anti-reflection organic layer and a light blocking organic layer such as a black matrix.

A touch driving circuit 400 may be disposed on the circuit board 300. The touch driving circuit 400 may be formed as an integrated circuit (IC) and coupled (e.g., attached) to the circuit board 300.

The touch driving circuit 400 may be electrically coupled (e.g., connected) to a plurality of driving electrodes and a plurality of sensing electrodes of the touch sensing layer TDU. The touch driving circuit 400 applies a touch driving signal to the plurality of driving electrodes, and senses a touch sensing signal of each of the plurality of sensing electrodes, for example, a charge change amount of mutual capacitance through the plurality of sensing electrodes. The touch driving circuit 400 may determine whether a user's touch occurs, whether the user is proximate, and/or the like, according to the touch sensing signals of each of the plurality of sensing electrodes. The user's touch may refer to how an object such as a user's finger or pen is in direct contact with the front surface of the display device 10 disposed on the touch sensing layer TDU. The proximity of the user may refer to an object such as a user's finger or a pen being positioned away from the front surface of the display device 10, such as hovering.

Figure 3:
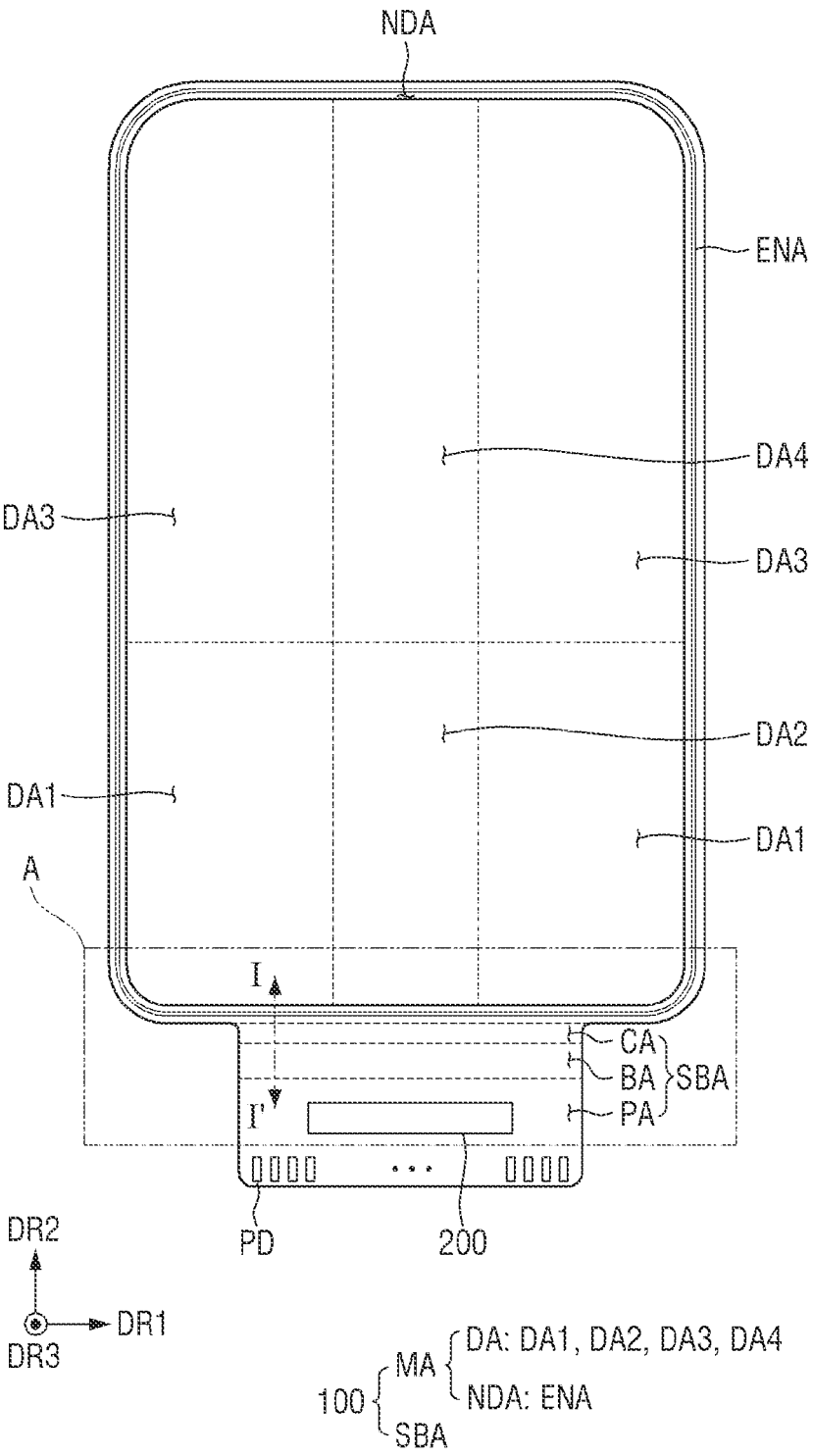
FIG. 3 is a plan view of a display device according to one embodiment.

FIG. 3 is a plan view of a display device according to one embodiment. FIG. 3 illustrates a state in which the sub-region SBA of the display device 10 is unfolded without being bent.

Referring to FIG. 3, the display panel 100 may include a main region MA and a sub-region SBA.

The main region MA may include a display area DA for displaying an image and a non-display area NDA that is a peripheral area of the display area DA. The display area DA may occupy most of the main region MA. The display area DA may be disposed at the center of the main region MA.

The display area DA may include first to fourth display areas DA1, DA2, DA3, and DA4. The first display area DA1 and the second display area DA2 in the display area DA may be disposed adjacent to the sub-region SBA, and the third display area DA3 and the fourth display area DA4 may be disposed next to the first display area DA1 and the second display area DA2 in the second direction DR2, respectively. Each of the first display area DA1 and the third display area DA3 may be disposed in the first direction DR1 and in a direction opposite to the first direction DR1 with respect to the center of the display area DA, and each of the second display area DA2 and the fourth display area DA4 may be disposed in the center of the display area DA. The first display areas DA1 may be respectively disposed on both (e.g., left and right) sides of the display area DA in the first direction DR1 in the lower side of the display area DA, and the second display area DA2 may be disposed therebetween. The third display areas DA3 may be respectively disposed on both sides of the display area DA in the first direction DR1 at the upper side of the display area DA, and the fourth display area DA4 may be disposed therebetween.

In each of the first display area DA1 and the third display area DA3, first data lines coupled (e.g., connected) to data fan-out lines through data connection lines are disposed. In the second display area DA2 and the fourth display area DA4, second data lines directly coupled (e.g., connected) to the data fan-out lines may be disposed. In the first display area DA1 and the second display area DA2, data connection holes through which the data connection lines and the data lines are coupled (e.g., connected) to each other may be disposed. In the third display area DA3 and the fourth display area DA4, power holes through which horizontal power lines extending in the first direction DR1 and vertical power lines extending in the second direction DR2 are coupled (e.g., connected) may be disposed.

The length of the first display area DA1 (e.g., of one of the first display areas DA1) in the first direction DR1 may be greater than the length of the second display area DA2 in the first direction DR1. The length of the first display area DA1 (e.g., of one of the first display areas DA1) in the second direction DR2 may be substantially the same as the length of the second display area DA2 in the second direction DR2.

The length of the first display area DA1 (e.g., of one of the first display areas DA1) in the first direction DR1 may be substantially the same as the length of the third display area DA3 (e.g., of an adjacent one of the third display areas DA3) in the first direction DR1. The length of the first display area DA1 (e.g., of one of the first display areas DA1) in the second direction DR2 may be smaller than the length of the third display area DA3 (e.g., of an adjacent one of the third display areas DA3) in the second direction DR2. Similarly, the length of the second display area DA2 in the first direction DR1 may be substantially the same as the length of the fourth display area DA4 in the first direction DR1. The length of the second display area DA2 in the second direction DR2 may be smaller than the length of the fourth display area DA4 in the second direction DR2.

For example, when the display area DA includes 1080× 2340 pixels, 484 pixels may be arranged in the first direction DR1 in each of the first display area DA1 and the third display area DA3, and 112 pixels may be arranged in the first direction DR1 in each of the second display area DA2 and the fourth display area DA4. A more detailed description of wires disposed in the first to fourth display areas DA1, DA2, DA3, and DA4 will be given later with reference to other drawings.

The non-display area NDA may be disposed adjacent to the display area DA. The non-display area NDA may be an area outside the display area DA. The non-display area NDA may be disposed to surround (e.g., partially or entirely surround) the display area DA. The non-display area NDA may be an edge area ENA of the display panel 100.

The sub-region SBA may protrude from one side of the main region MA in the second direction DR2. The length of the sub-region SBA in the second direction DR2 may be less than the length of the main region MA in the second direction DR2. The length of the sub-region SBA in the first direction DR1 may be substantially equal to or less than the length of the main region MA in the first direction DR1. The sub-region SBA may be foldable to be disposed under the display panel 100. In this case, the sub-region SBA may overlap the main region MA in a third direction DR3.

The sub-region SBA may include a connection area CA, a pad area PA, and a bending area BA.

The connection area CA may be an area protruding from one side of the main region MA in the second direction DR2. The connection area CA may be disposed between the non-display area NDA of the main region MA and the bending area BA in the second direction DR2.

The pad area PA may be an area on which pads PD and the display driving circuit 200 are disposed. The display driving circuit 200 may be coupled (e.g., attached) to driving pads of the pad area PA utilizing (e.g., using) a conductive adhesive member such as an anisotropic conductive film. The circuit board 300 may be coupled (e.g., attached) to the pads PD of the pad area PA utilizing (e.g., using) a conductive adhesive member such as an anisotropic conductive film.

The bending area BA is a bendable area. When the bending area BA is bent, the pad area PA may be disposed under the connection area CA and the main region MA. The bending area BA may be disposed between the connection area CA and the pad area PA in the second direction DR2.

Figure 4:
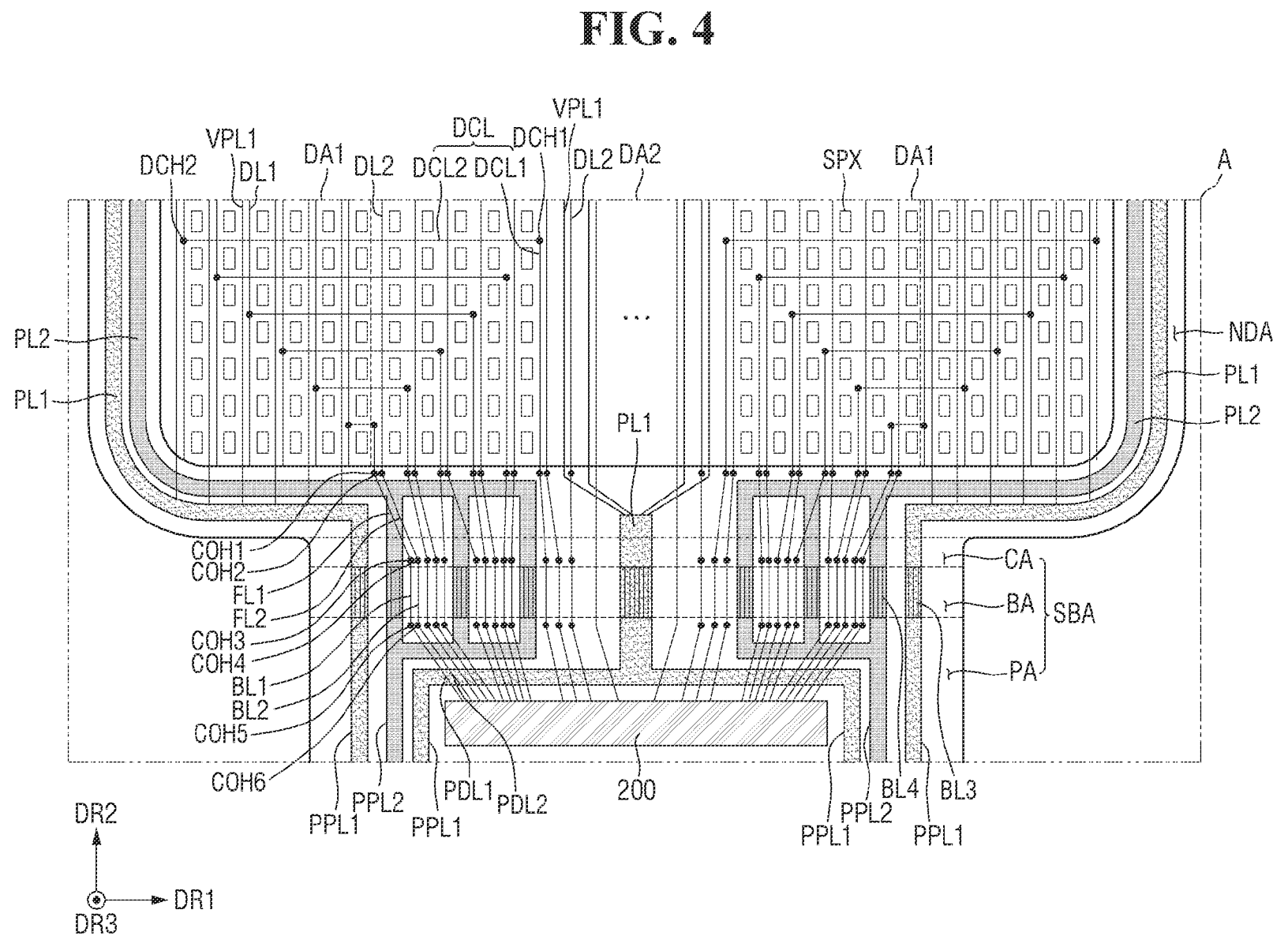

FIG. 4 is a plan view illustrating area A of FIG. 3 in more detail.

FIG. 4 schematically illustrates wires disposed in the first display area DA1, the second display area DA2, the non-display area NDA, and the sub-region SBA of FIG. 3.

Referring to FIG. 4, a plurality of first data lines DL1, a plurality of second data lines DL2, a plurality of data connection lines DCL, and a plurality of first vertical power lines VPL1 may be disposed in the first display area DA1 and the second display area DA2. In some embodiments, a plurality of horizontal power lines, vertical dummy lines, and horizontal dummy lines may be disposed in the first display area DA1 and the second display area DA2.

The first data lines DL1 and the second data lines DL2 may each extend in the second direction DR2 and may be arranged in the first direction DR1. The first data lines DL1 may be disposed in the first display area DA1 and may be spaced apart from other adjacent first data lines DL1 in the first direction DR1. The second data lines DL2 may be disposed in the second display area DA2 and may be spaced apart from other adjacent second data lines DL2 in the first direction DR1.

The plurality of data connection lines DCL may be disposed in the first display area DA1 and the second display area DA2. The plurality of data connection lines DCL may include first data connection lines DCL1 and second data connection lines DCL2. The first data connection lines DCL1 may extend in the second direction DR2 and may be arranged in the first direction DR1. The second data connection lines DCL2 may extend in the first direction DR1 and may be arranged in the second direction DR2. The first data connection lines DCL1 may be spaced apart from other adjacent first data connection lines DCL1 in the first direction DR1, and the second data connection lines DCL2 may be spaced apart from other adjacent second data connection lines DCL2 in the second direction DR2.

The first data connection line DCL1 may be coupled (e.g., connected) to a first fan-out line FL1 through a first connection hole COH1. The second data connection line DCL2 may be coupled (e.g., connected) to the first data connection line DCL1 through a first data connection hole DCH1. Each of the plurality of first data lines DL1 may be coupled (e.g., connected) to the second data connection line DCL2 through a second data connection hole DCH2. Each of the plurality of second data lines DL2 may be coupled (e.g., connected) to a second fan-out line FL2 through a second connection hole COH2.

In the first display area DA1 and the second display area DA2, the first data connection holes DCH1 through which the first data connection lines DCL1 and the second data connection lines DCL2 are connected, and the second data connection holes DCH2 through which the second data connection lines DCL2 and the first data lines DL1 are coupled (e.g., connected) may be arranged in a "v" shape. In some embodiments, the first data connection holes DCH1 and the second data connection holes DCH2 may be repeatedly arranged in a "A" shape, or may be arranged in a pattern other than "v" and "A."

The first data lines DL1 disposed in the first display area DA1 may be electrically coupled (e.g., connected) to the first fan-out lines FL1 through the data connection lines DCL. The second data lines DL2 disposed in the second display area DA2 may be directly coupled (e.g., connected) to the second fan-out lines FL2.

The plurality of first vertical power lines VPL1 may be disposed in the first display area DA1 and the second display area DA2. Each of the plurality of first vertical power lines VPL1 may extend in the second direction DR2 and may be arranged in the first direction DR1. The first vertical power lines VPL1 disposed in the first display area DA1 may extend in the second direction DR2 from first power lines PL1 disposed at the left and right sides of the non-display area NDA. The first vertical power lines VPL1 disposed in the second display area DA2 may be coupled (e.g., connected) to a first power line PL1 disposed at the center of the non-display area NDA.

The first fan-out lines FL1, the second fan-out lines FL2, the first power lines PL1, and second power lines PL2 may be disposed in the non-display area NDA. Each of the first fan-out lines FL1 may be coupled (e.g., connected) to the first data connection line DCL1 through the first connection hole COH1. Each of the second fan-out lines FL2 may be coupled (e.g., connected) to the second data line DL2 through the second connection hole COH2.

Among the first power lines PL1, the first power line PL1 disposed at the center of the display panel 100 may be coupled (e.g., connected) to the plurality of first vertical power lines VPL1. Among the first power lines PL1, the first power lines PL1 disposed at the left and right sides of the display panel 100 may be disposed to surround (e.g., partially or entirely surround) the second power lines PL2. The second power lines PL2 may be disposed to surround (e.g., partially or entirely surround) the display area DA. A first power voltage may be applied to each of the first power lines PL1, and a second power voltage higher than the first power voltage may be applied to each of the second power lines PL2.

First bending lines BL1, second bending lines BL2, third bending lines BL3, and fourth bending lines BL4 may be disposed in the bending area BA. Each of the first bending lines BL1 may be coupled (e.g., connected) to the first fan-out line FL1 through a third connection hole COH3. Each of the second bending lines BL2 may be coupled (e.g., connected) to the second fan-out line FL2 through a fourth connection hole COH4. Each of the third bending lines BL3 may be coupled (e.g., connected) to the first power line PL1, and each of the fourth bending lines BL4 may be coupled (e.g., connected) to the second power line PL2.

First pad lines PDL1, second pad lines PDL2, first power pad lines PPL1, and second power pad lines PPL2 may be disposed in the pad area PA. Each of the first pad lines PDL1 may be coupled (e.g., connected) to the first bending line BL1 through a fifth connection hole COH5. Each of the second pad lines PDL2 may be coupled (e.g., connected) to the second bending line BL2 through a sixth connection hole COH6. The first power pad lines PPL1 may be coupled (e.g., connected) to the third bending lines BL3, and the second power pad lines PPL2 may be coupled (e.g., connected) to the fourth bending lines BL4.

The first pad lines PDL1 and the second pad lines PDL2 may be electrically coupled (e.g., connected) to the display driving circuit 200. The first power pad lines PPL1 and the second power pad lines PPL2 may be directly coupled (e.g., connected) to the pads PD. The display driving circuit 200 may be coupled (e.g., connected) to the pads PD through third pad lines.

The plurality of first data lines DL1 disposed at the left and right sides of the display panel 100 may be coupled (e.g., connected) to the first fan-out lines FL1 through the data connection lines DCL. The first fan-out lines FL1 are not required to be disposed in the non-display area NDA at the lower side of the display panel 100 so as to be coupled (e.g., connected) to the plurality of first data lines DL1 disposed adjacent to the left and right sides of the display area DA. Therefore, even when the size of the non-display area NDA at the lower side of the display panel 100 is reduced, the arrangement space of the fan-out lines FL1 and FL2 may not be insufficient.

Figure 5:
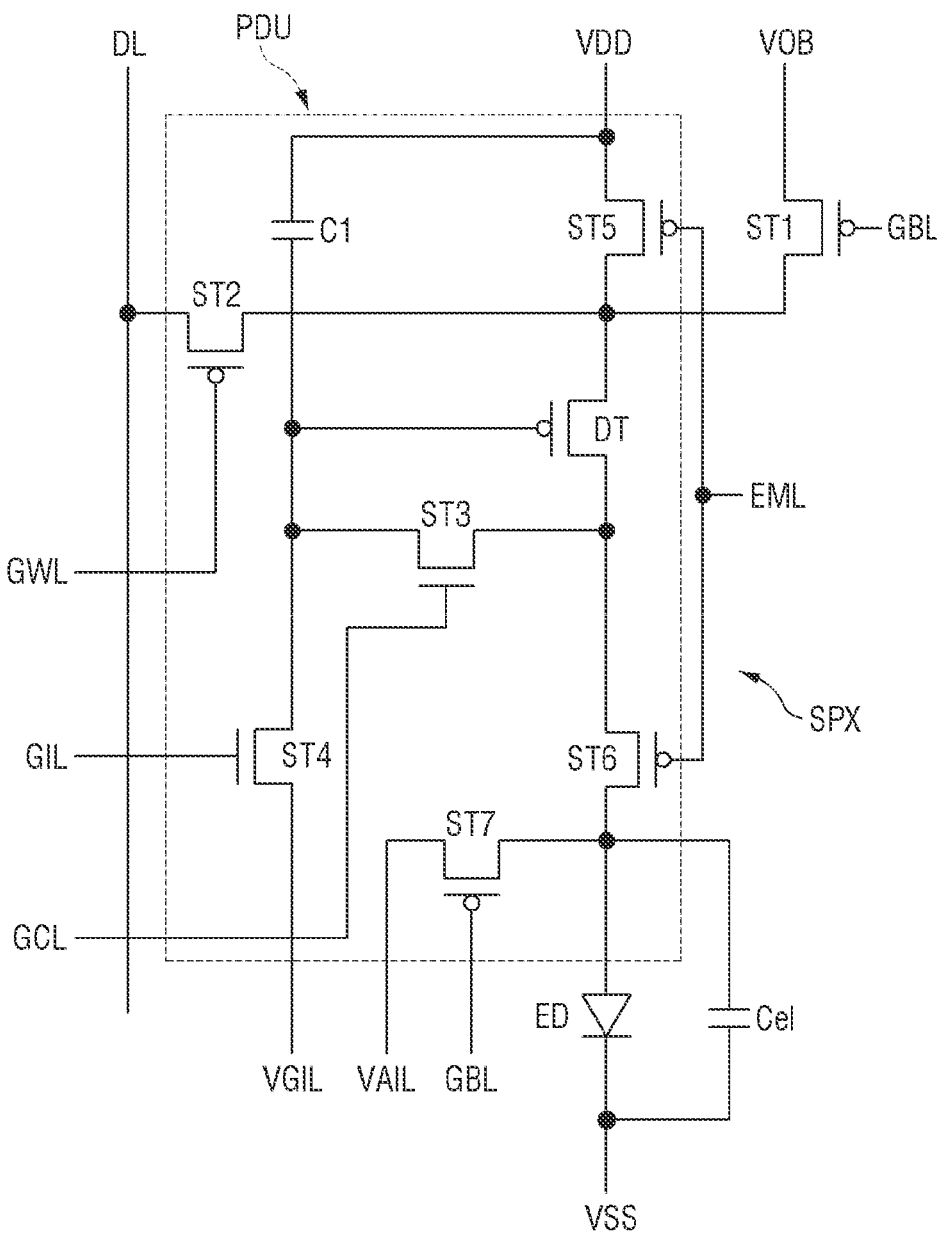
FIG. 5 is a pixel circuit diagram of one sub-pixel according to one embodiment.

FIG. 5 is a pixel circuit diagram of one sub-pixel according to one embodiment.

Referring to FIG. 5, the sub-pixel SPX may be coupled (e.g., connected) to at least one of the scan lines GWL, GIL, GCL, and GBL, any one of emission lines EML, and any one of the data lines. For example, the sub-pixel SPX may be coupled (e.g., connected) to a write scan line GWL, an initialization scan line GIL, a control scan line GCL, a bias scan line GBL, the emission line EML, and a data line DL.

The sub-pixel SPX includes a light emitting element ED and a pixel driver PDU. The pixel driver PDU includes a driving transistor DT, switch elements, and a capacitor C1. The switch elements include first to seventh transistors ST1, ST2, ST3, ST4, ST5, ST6, and ST7.

The driving transistor DT includes a gate electrode, a first electrode, and a second electrode. The driving transistor DT controls a drain-source current (hereinafter, referred to as "driving current") flowing between the first electrode and the second electrode according to a data voltage applied to the gate electrode.

The light emitting element ED emits light by the driving current. A light emission amount of the light emitting element ED may be proportional to the driving current.

The light emitting element ED may be an organic light emitting diode including an anode electrode, a cathode electrode, and an organic light emitting layer disposed between the anode electrode and the cathode electrode. In some embodiments, the light emitting element ED may be an inorganic light emitting element including an anode electrode, a cathode electrode, and an inorganic semiconductor disposed between the anode electrode and the cathode electrode. In some embodiments, the light emitting element ED may be a quantum dot light emitting element including an anode electrode, a cathode electrode, and a quantum dot light emitting layer disposed between the anode electrode and the cathode electrode. In some embodiments, the light emitting element ED may be a micro light emitting diode.

The anode electrode of the light emitting element ED may be coupled (e.g., connected) to one electrode of the sixth transistor ST6 and one electrode of the seventh transistor ST7, and the cathode electrode may be coupled (e.g., connected) to a second voltage line VSS. A parasitic capacitance Cel may be formed between the anode electrode and the cathode electrode of the light emitting element ED.

The capacitor C1 may be formed between the gate electrode of the driving transistor DT and a first voltage line VDD. One electrode of the capacitor C1 may be coupled (e.g., connected) to the gate electrode of the driving transistor DT, and the other electrode thereof may be coupled (e.g., connected) to the first voltage line VDD.

The gate electrode of the first transistor ST1 and the gate electrode of the seventh transistor ST7 may be coupled (e.g., connected) to the bias scan line GBL, and the gate electrode of the second transistor ST2 may be coupled (e.g., connected) to the write scan line GWL. The gate electrode of the third transistor ST3 may be coupled (e.g., connected) to the control scan line GCL, and the gate electrode of the fourth transistor ST4 may be coupled (e.g., connected) to the initialization scan line GIL. One electrode of the first transistor ST1 may be coupled (e.g., connected) to a bias voltage line VOB, and one electrode of the second transistor ST2 may be coupled (e.g., connected) to the data line DL. One electrode of the third transistor ST3 may be coupled (e.g., connected) to the second electrode of the driving transistor DT, and the other electrode thereof may be coupled (e.g., connected) to the second electrode of the capacitor C1. One electrode of the fourth transistor ST4 may be coupled (e.g., connected) to a first initialization voltage line VGIL, and one electrode of the seventh transistor ST7 may be coupled (e.g., connected) to a second initialization voltage line VAIL. A first initialization voltage applied to the first initialization voltage line VGIL and a second initialization voltage applied to the second initialization voltage line VAIL may be different from each other.

In the display device 10 according to one embodiment, the driving transistor DT, the first transistor ST1, the second transistor ST2, the fifth transistor ST5, the sixth transistor ST6, and the seventh transistor ST7 of one sub-pixel SPX may be formed of a P-type or kind (e.g., P-kind) MOSFET, and the third transistor ST3 and the fourth transistor ST4 may be formed of an N-type or kind (e.g., N-kind) MOSFET. An active layer of each of the driving transistor DT, the first transistor ST1, the second transistor ST2, the fifth transistor ST5, the sixth transistor ST6 and the seventh transistor ST7 configured as the P-type or kind MOSFETs may be formed of polysilicon, whereas an active layer of each of the third transistor ST3 and the fourth transistor ST4 configured as the N-type or kind MOSFETs may be formed of an oxide semiconductor. In this case, because the transistors formed of the polysilicon and the transistors formed of the oxide semiconductor may be disposed on different layers, the placement area of the respective transistors of each pixel PX can be reduced. In some embodiments, the seventh transistor ST7 may be formed of an N-type or kind MOSFET. In this case, the active layer of the seventh transistor ST7 may also be formed of an oxide semiconductor.

Because the third transistor ST3 and the fourth transistor ST4 are configured as the N-type or kind MOSFETs, they may be turned on when a scan signal of a gate high voltage is applied to the control scan line GCL and the initialization scan line GIL. In contrast, because the first transistor ST1, the second transistor ST2, the fifth transistor ST5, the sixth transistor ST6, and the seventh transistor ST7 are formed of a P-type or kind MOSFET, they may be turned on when a scan signal and an emission signal of a gate low voltage are applied to the bias scan line GBL, the write scan line GWL, and the emission line EML.

Figure 6:
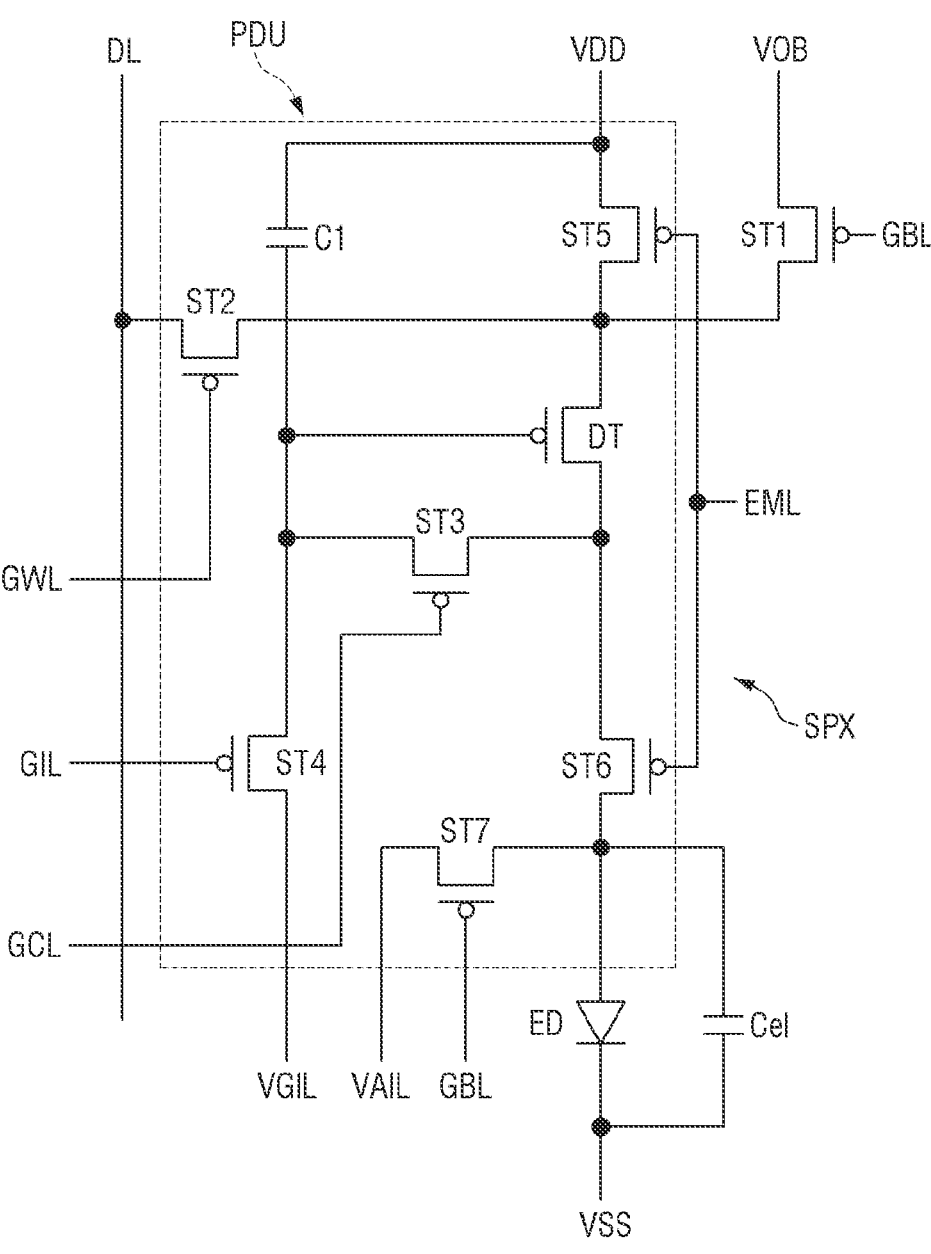
FIG. 6 is a pixel circuit diagram of one sub-pixel according to another embodiment.

FIG. 6 is a pixel circuit diagram of one sub-pixel according to another embodiment.

Referring to FIG. 6, in the display device 10 according to one embodiment, the first to seventh transistors ST1, ST2, ST3, ST4, ST5, ST6, and ST7 and the driving transistor DT of one sub-pixel SPX may all be formed of a P-type or kind MOSFET. The active layer of each of the driving transistor DT and the first to seventh transistors ST1 to ST7 may be formed of polysilicon or an oxide semiconductor. Because the first to seventh transistors ST1 to ST7 are formed of a P-type or kind MOSFET, they may be turned on when a scan signal and an emission signal of a gate low voltage are applied to the control scan line GCL, the initialization scan line GIL, the write scan line GWL, the bias scan line GBL, and the emission line EML.

In some embodiments, in some embodiments, the first to seventh transistors ST1 to ST7 and the driving transistor DT may all be formed of an N-type or kind MOSFET.

Figure 7:
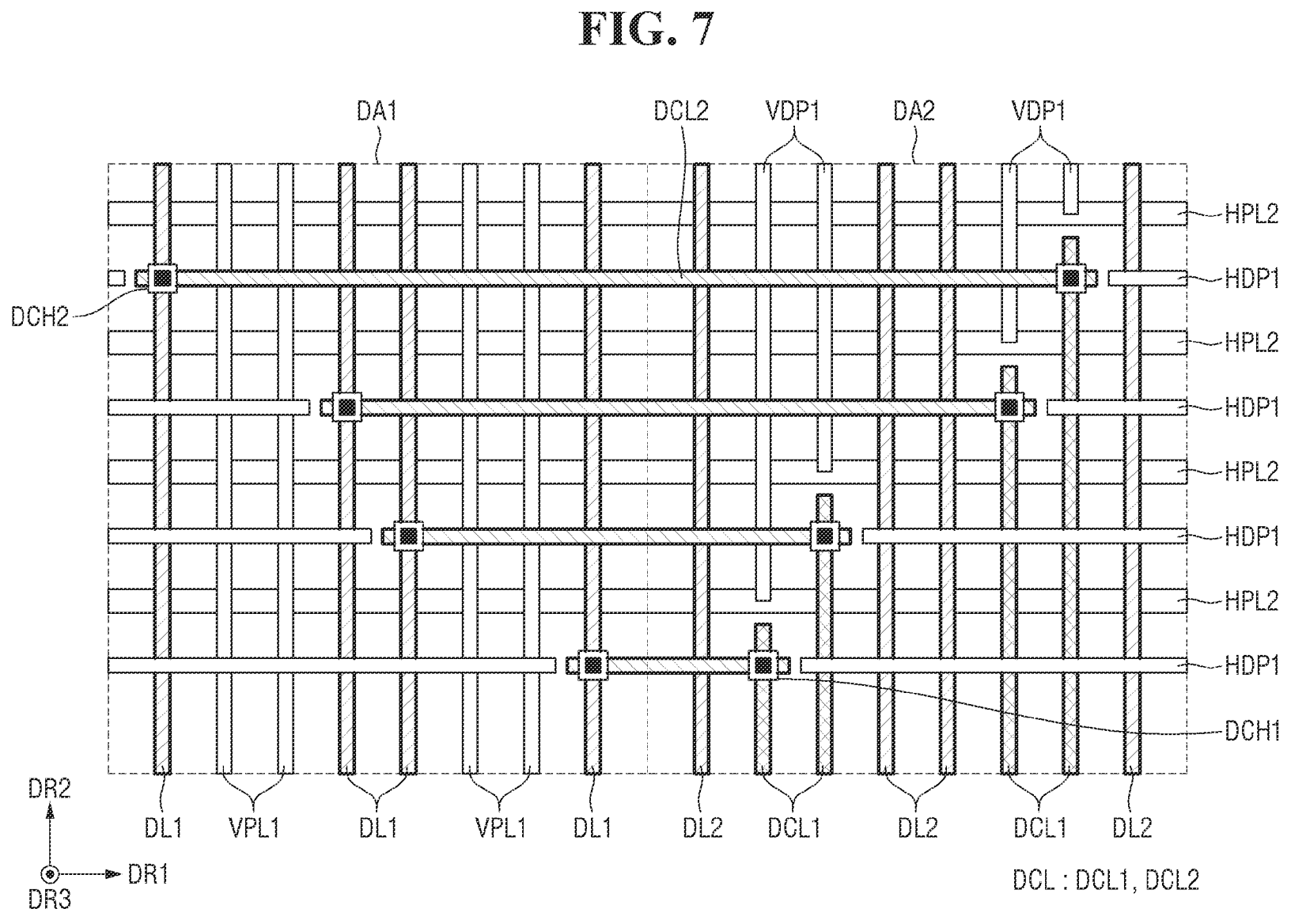

FIG. 7 is a plan view illustrating wires disposed in a first display area and a second display area in a display device according to one embodiment. FIG. 7 illustrates the arrangement of the data lines DL1 and DL2, the data connection lines DCL1 and DCL2, the first vertical power line VPL1, and a second horizontal power line HPL2 disposed in the first display area DA1 and the second display area DA2.

Referring to FIG. 7, the first data lines DL1 and the first vertical power lines VPL1 may be disposed in the first display area DA1, and the second data lines DL2 and the first data connection lines DCL1 may be disposed in the second display area DA2. The first data lines DL1, the second data lines DL2, the first data connection lines DCL1, and the first vertical power lines VPL1 may each extend in the second direction DR2, and may be spaced apart from each other in the first direction DR1. In the first display area DA1, the first data lines DL1 and the first vertical power lines VPL1 may be disposed to be spaced apart from each other in the first direction DR1, and in the second display area DA2, the second data lines DL2 and the first data connection lines DCL1 may be disposed to be spaced apart from each other in the first direction DR1.

In the first display area DA1, a pair of first data lines DL1 and a pair of first vertical power lines VPL1 may be alternately disposed. For example, a pair of first vertical power lines VPL1 adjacent to each other in the first direction DR1 may be spaced apart in the first direction DR1 from a pair of first data lines DL1 adjacent to each other in the first direction DR1. With respect to any one first data line DL1, a pair of first vertical power lines VPL1 and another first data line DL1 may be disposed along the first direction DR1. A pair of first vertical power lines VPL1 may be disposed between two different first data lines DL1. In one embodiment, a distance between a pair of adjacent first data lines DL1 may be greater than a distance between a pair of adjacent first vertical power lines VPL1, and a distance between the first data line DL1 and the first vertical power line VPL1 may be the same as the distance between a pair of adjacent first vertical power lines VPL1.

In the second display area DA2, a pair of second data lines DL2 and a pair of first data connection lines DCL1 may be alternately disposed. For example, a pair of first data connection lines DCL1 adjacent to each other in the first direction DR1 may be spaced apart in the first direction DR1 from a pair of second data lines DL2 adjacent to each other in the first direction DR1. With respect to any one second data line DL2, a pair of first data connection lines DCL1 and another second data line DL2 may be disposed along the first direction DR1. A pair of first data connection lines DCL1 may be disposed between two different second data lines DL2. In one embodiment, a distance between a pair of adjacent second data lines DL2 may be greater than a distance between a pair of adjacent first data connection lines DCL1, and a distance between the second data line DL2 and the first data connection line DCL1 may be the same as the distance between a pair of adjacent first data connection lines DCL1.

As will be described later, in the display device 10 according to one embodiment, wires and patterns coupled (e.g., connected) to two sub-pixels SPX adjacent in the first direction DR1 may be arranged to have a symmetrical structure or a flip structure, and accordingly, the data lines DL1 and DL2, the first data connection lines DCL1, and the first vertical power lines VPL1 may have the arrangement shown in FIG. 7. One first vertical power line VPL1 and one first data line DL1 adjacent to each other, or one first data connection line DCL1 and one second data line DL2 adjacent to each other may be coupled (e.g., connected) to any one sub-pixel SPX (e.g., first sub-pixel), and wires spaced apart from them in the first direction DR1 and arranged in a symmetrical structure may be coupled (e.g., connected) to another sub-pixel SPX (e.g., second sub-pixel).

The arrangement of the first data lines DL1 in the first display area DA1 may be substantially the same as the arrangement of the second data lines DL2 in the second display area DA2, and the arrangement of the first vertical power lines VPL1 in the first display area DA1 may be substantially similar to the arrangement of the first data connection lines DCL1 in the second display area DA2. In the arrangement of the wires in the display area DA, the first data line DL1 and the second data line DL2 may be substantially the same wires, and the first vertical power line VPL1 and the first data connection line DCL1 may have a similar overall arrangement, but may be distinguished depending on a connection relationship with the second data connection line DCL2 and an arrangement position.

The second data connection lines DCL2 and the second horizontal power lines HPL2 may be disposed across the first display area DA1 and the second display area DA2. The second data connection lines DCL2 and the second horizontal power lines HPL2 may each extend in the first direction DR1 and may be arranged in the second direction DR2. For example, the second data connection lines DCL2 and the second horizontal power lines HPL2 may be alternately disposed along the second direction DR2. One second data connection line DCL2 may be disposed between two second horizontal power lines HPL2 adjacent in the second direction DR2, and one second horizontal power line HPL2 may be disposed between two second data connection lines DCL2 adjacent in the second direction DR2.

A plurality of first vertical dummy patterns VDP1 may be disposed in the second display area DA2. Similarly to the first data connection lines DCL1, the first vertical dummy patterns VDP1 may extend in the second direction DR2 and may be arranged to be spaced apart from each other in the first direction DR1. The first vertical dummy patterns VDP1 may be disposed to respectively correspond to the first data connection lines DCL1 in the second display area DA2, and may be spaced apart respectively from the first data connection lines DCL1 in the second direction DR2. For example, a first vertical dummy pattern VDP1 may be aligned in the second direction DR2 with a corresponding first data connection line DCL1, and a gap or break may be provided between the first vertical dummy pattern VDP1 and the corresponding first data connection line DCL1, for example, so that the first vertical dummy pattern VDP1 is not coupled (e.g., connected to) the first data connection line DCL1 via the gap or break.

A plurality of first horizontal dummy patterns HDP1 may be disposed in the first display area DA1 and the second display area DA2. Similarly to the second data connection lines DCL2, the first horizontal dummy patterns HDP1 may extend in the first direction DR1 and may be arranged to be spaced apart from each other in the second direction DR2. The first horizontal dummy patterns HDP1 and the second horizontal power lines HPL2 may be alternately disposed in the second direction DR2. The first horizontal dummy patterns HDP1 may be disposed to respectively correspond to the second data connection lines DCL2 and may be spaced apart respectively from the second data connection lines DCL2 in the first direction DR1. For example, a first horizontal dummy pattern HDP1 may be aligned in the first direction DR1 with a corresponding one of the second data connection lines DCL2, and a gap or break may be provided between the first horizontal dummy pattern HDP1 and the corresponding one of the second data connection lines DCL2, for example, so that the first horizontal dummy pattern HDP1 is not coupled (e.g., connected) to the corresponding one of the second data connection lines DCL2.

A separation portion between the first data connection line DCL1 and the first vertical dummy pattern VDP1 may overlap the second horizontal power line HPL2. However, the present disclosure is not limited thereto, and the separation portion may not overlap the second horizontal power line HPL2.

A separation portion between the second data connection line DCL2 and a first horizontal dummy pattern HDP1 may be disposed between the first data line DL1 and the first vertical power line VPL1 or between the second data line DL2 and the first data connection line DCL1. However, the present disclosure is not limited thereto, and the separation portion may overlap the data lines DL1 and DL2, the first data connection line DCL1, or the first vertical power line VPL1.

The first data connection line DCL1 may be electrically coupled (e.g., connected) to the second data connection line DCL2 in the second display area DA2. For example, the first data connection line DCL1 may be coupled (e.g., connected) to any one of the second data connection lines DCL2 through the first data connection hole DCH1. The plurality of first data connection holes DCH1 may be disposed in the second display area DA2.

The second data connection line DCL2 may be electrically coupled (e.g., connected) to the first data line DL1 in the first display area DA1. For example, the second data connection line DCL2 may be coupled (e.g., connected) to any one of the first data lines DL1 through the second data connection hole DCH2. The plurality of second data connection holes DCH2 may be disposed in the first display area DA1.

The first data connection holes DCH1 may be arranged in a first diagonal direction DD1 in the second display area DA2. The second data connection holes DCH2 may be arranged in a second diagonal direction DD2 in the first display area DA1.

The first data connection line DCL1 and the second data line DL2 in the second display area DA2 may be coupled (e.g., connected) to the fan-out lines FL1 and FL2 (see FIG. 4) to respectively receive data signals. The first data connection line DCL1 may be electrically coupled (e.g., connected) to the second data connection line DCL2, and the first data line DL1 in the first display area DA1 may be electrically coupled (e.g., connected) to the second data connection line DCL2 to receive a data signal. The first vertical power line VPL1 in the first display area DA1 may have an arrangement similar to that of the first data connection line DCL1, but may be coupled (e.g., connected) to the first power line PL1, so that the first power voltage may be applied thereto. The second horizontal power line HPL2 may be coupled (e.g., connected) to the first power line PL1, so that the first power voltage may be applied thereto.

Figure 8:
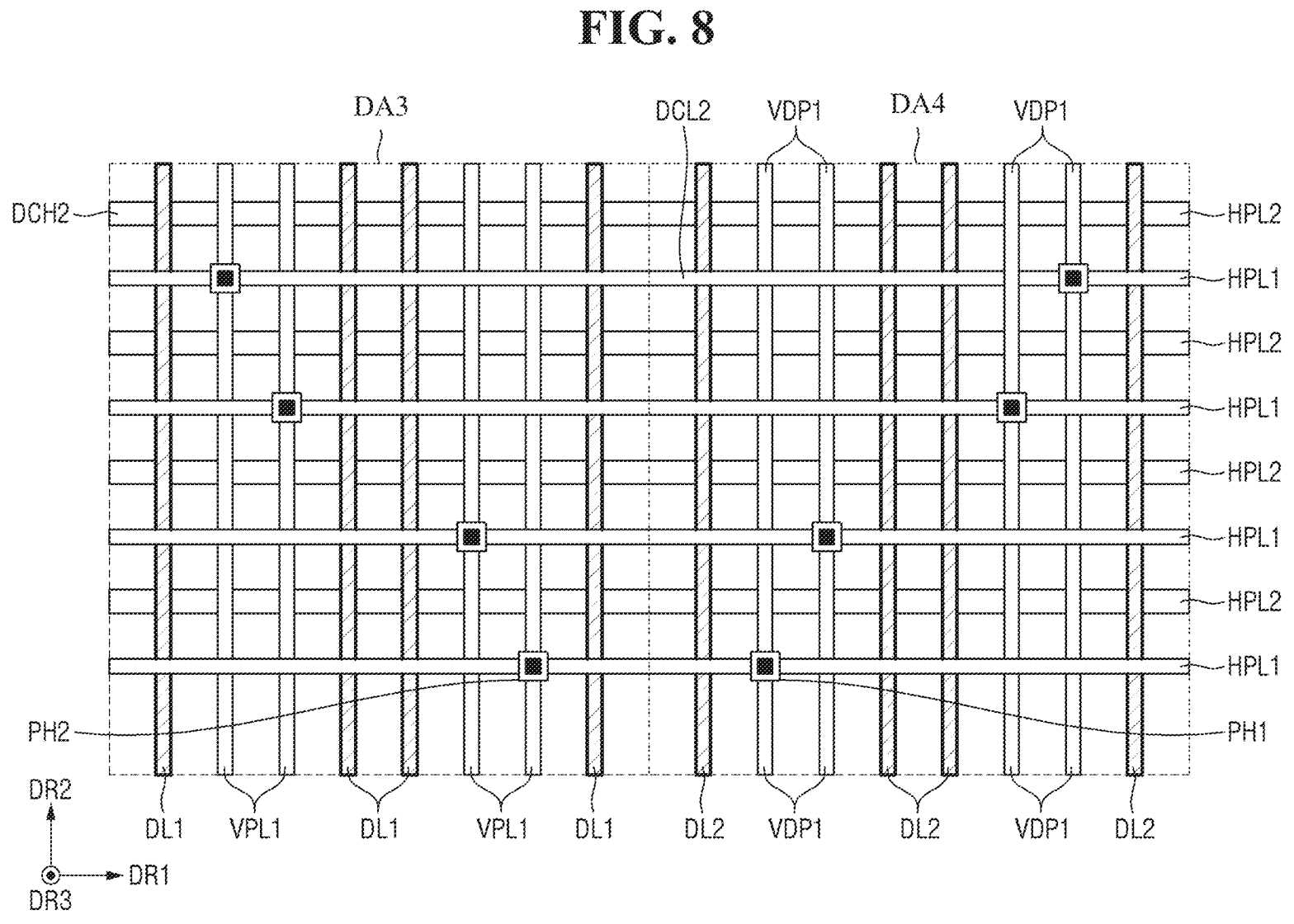

FIG. 8 is a plan view illustrating wires disposed in a third display area and a fourth display area in a display device according to one embodiment. FIG. 8 illustrates the arrangement of the data lines DL1 and DL2, the first vertical power lines VPL1, first horizontal power lines HPL1, and the second horizontal power lines HPL2 disposed in the third display area DA3 and the fourth display area DA4.

Referring to FIG. 8, the first data lines DL1 and the first vertical power lines VPL1 may be disposed in the third display area DA3, and the second data lines DL2 and the first vertical dummy patterns VDP1 may be disposed in the fourth display area DA4. A description of the arrangement thereof is substantially the same as described above with reference to FIG. 7.

The first horizontal power lines HPL1 and second horizontal power lines HPL2 may be disposed across the third display area DA3 and the fourth display area DA4. The first horizontal power lines HPL1 and the second horizontal power lines HPL2 may each extend in the first direction DR1 and may be arranged in the second direction DR2. For example, the first horizontal power lines HPL1 and the second horizontal power lines HPL2 may be alternately disposed along the second direction DR2. One first horizontal power line HPL1 may be disposed between two second horizontal power lines HPL2 adjacent in the second direction DR2, and one second horizontal power line HPL2 may be disposed between two first horizontal power lines HPL1 adjacent in the second direction DR2.

The first horizontal power line HPL1 may be electrically coupled (e.g., connected) to the first vertical power line VPL1 in the third display area DA3. For example, the first horizontal power line HPL1 may be coupled (e.g., connected) to any one of the first vertical power lines VPL1 through a second power hole PH2. A plurality of second power holes PH2 may be disposed in the third display area DA3.

The first horizontal power line HPL1 may be electrically coupled (e.g., connected) to the first vertical dummy pattern VDP1 in the fourth display area DA4. For example, the first horizontal power line HPL1 may be coupled (e.g., connected) to any one of the first vertical dummy patterns VDP1 through a first power hole PH1. A plurality of first power holes PH1 may be disposed in the fourth display area DA4. The first horizontal power line HPL1 may be electrically coupled (e.g., connected) to the first power line PL1, so that the first power voltage may be applied thereto.

The first power holes PH1 may be arranged in the first diagonal direction DD1 in the fourth display area DA4. The second power holes PH2 may be arranged in the second diagonal direction DD2 in the third display area DA3.

The first display area DA1 and the second display area DA2, and the third display area DA3 and the fourth display area DA4 may be distinguished from each other depending on whether the data connection lines DCL1 and DCL2 are disposed. Although the arrangement structure of the wires in the display area DA may be similar regardless of positions, the types (kinds) of electrical signals applied thereto may be different from each other. Accordingly, in some regions of the display area DA, a signal different from that of other regions may be applied, and thus a spot that is visually recognized from the outside may occur.

For example, conductive layers disposed in the sub-pixels SPX disposed in the display area DA may have the same arrangement structure regardless of positions of the sub-pixels SPX. However, different electrical signals may be applied to the wires adjacent to the conductive layer depending on their positions in the display area DA, and a spot may occur due to the difference in the applied signals. The display device 10 according to one embodiment may include wires to which different signals are applied depending on their positions in the display area DA, and may have a structure capable of preventing or reducing occurrence, or reducing the likelihood of occurrence, of a spot caused by the wires. Hereinafter, the structure of the sub-pixels SPX will be described in more detail with reference to other drawings.

Figure 9:
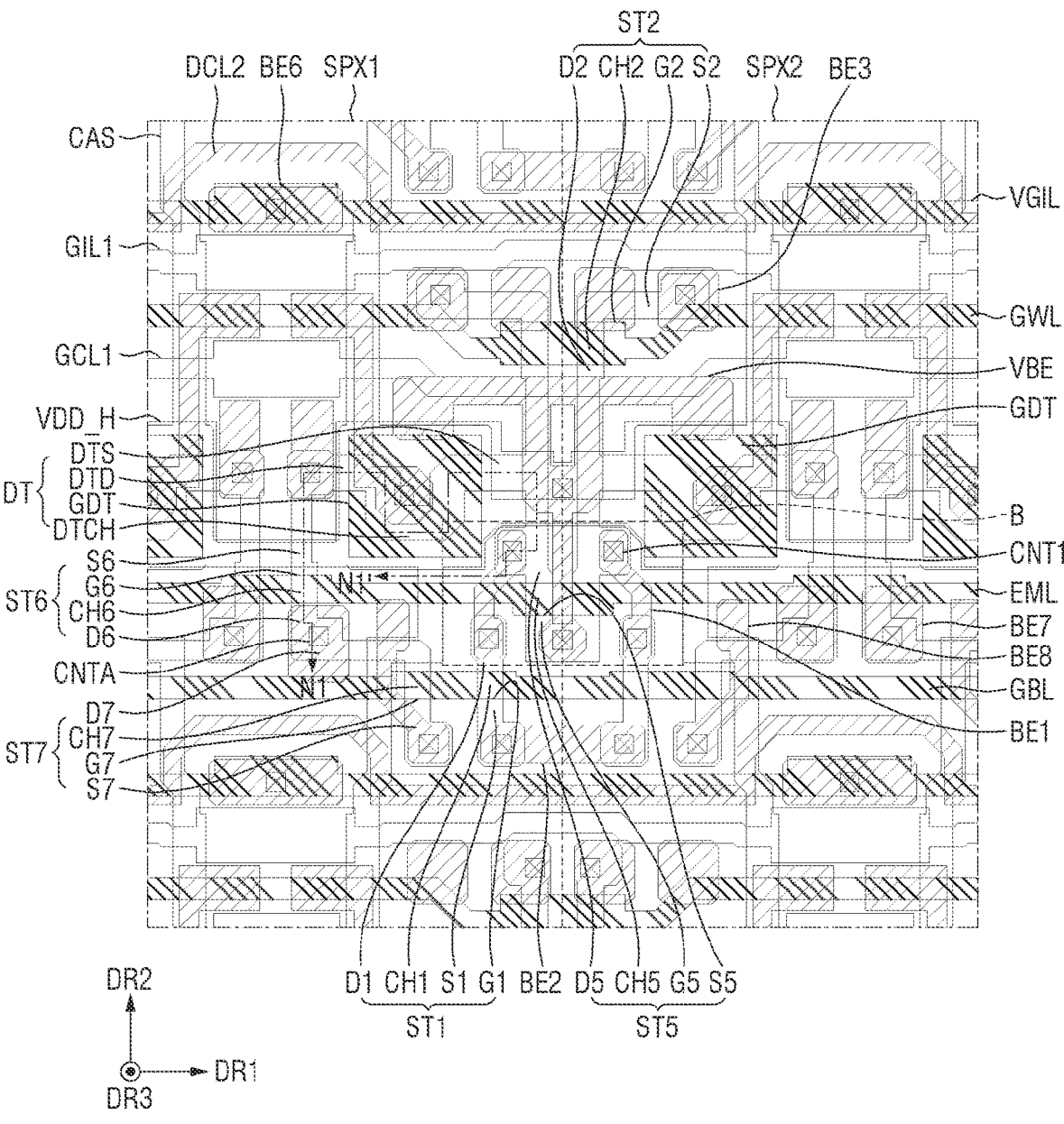
FIGS. 9 and 10 are layout views showing two adjacent sub-pixels in a display device according to one embodiment.
Figure 10:
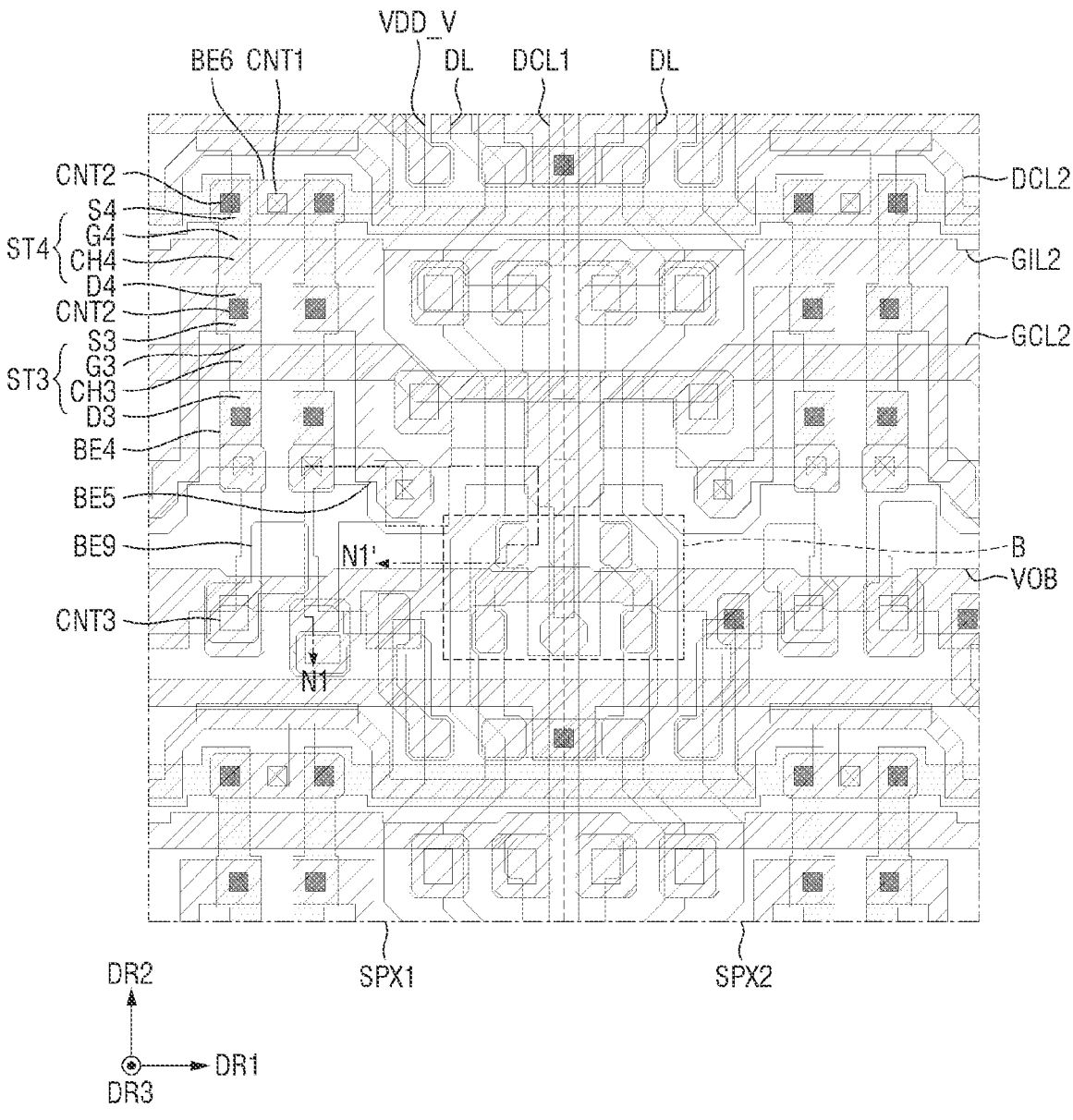
Figure 11:
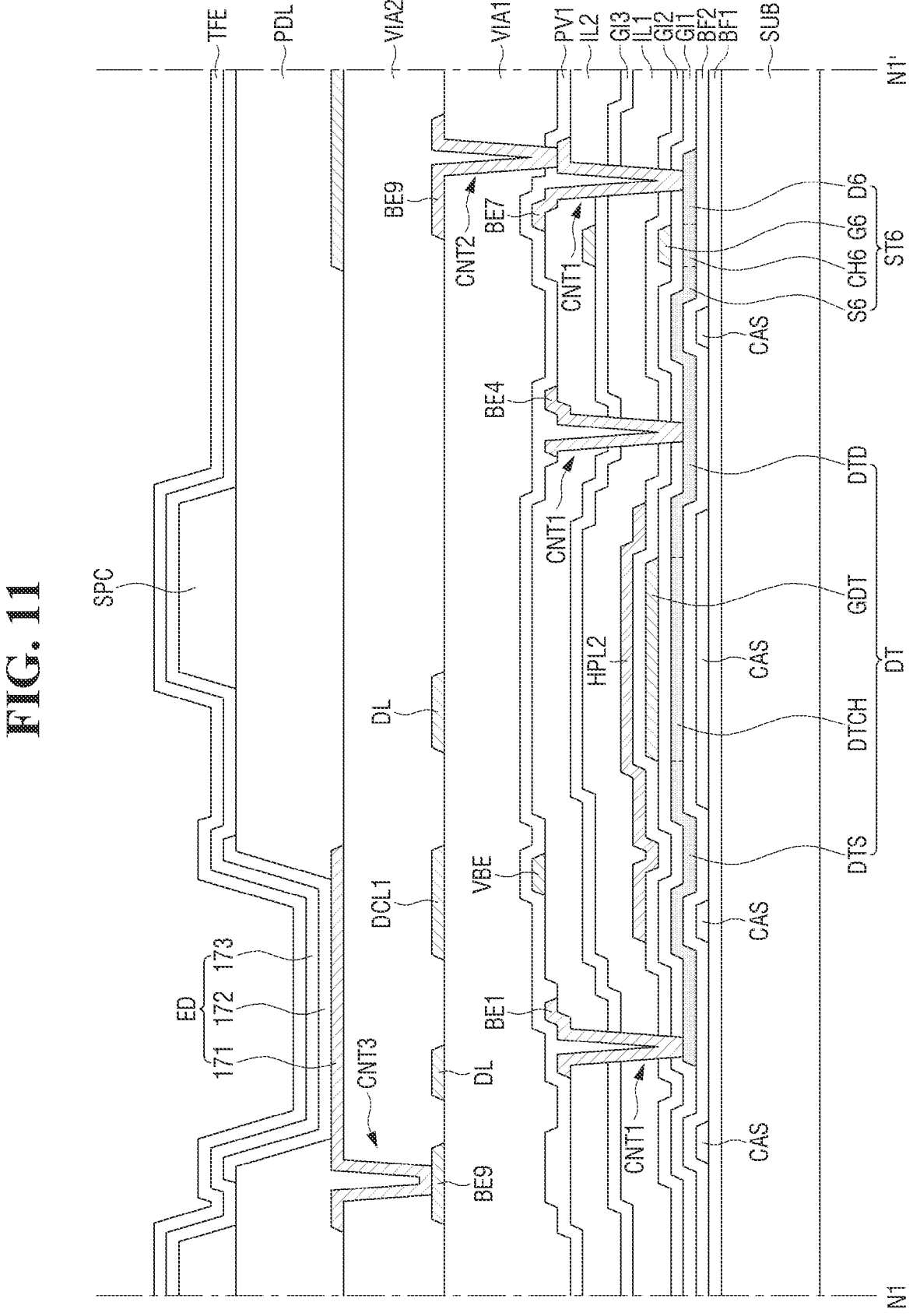
FIG. 11 is a cross-sectional view taken along line N1-N1' of FIGS. 9 and 10.

FIGS. 9 and 10 are layout views showing two adjacent sub-pixels in a display device according to one embodiment. FIG. 11 is a cross-sectional view taken along line N1-N1' of FIGS. 9 and 10.

FIGS. 9 and 10 illustrate a plurality of wires and electrodes disposed in the pixel driver PDU of two sub-pixels SPX1 and SPX2 adjacent to each other in the first direction DR1 and are layout views showing a plurality of semiconductor layers and a plurality of conductive layers. FIG. 9 illustrates wires and electrodes of a lower metal layer CAS, a first semiconductor layer, a first gate conductive layer, a second gate conductive layer, and a first source/drain layer. FIG. 10 illustrates wires and electrodes of the first semiconductor layer, a second semiconductor layer, a third gate conductive layer, the first source/drain layer, and a second source/drain layer. FIG. 11 illustrates a cross section traversing the driving transistor DT and the sixth transistor ST6 of a first sub-pixel SPX1.

Referring to FIGS. 9 to 11, the display device 10 may include the plurality of sub-pixels SPX, and two sub-pixels SPX1 and SPX2 adjacent in the first direction DR1 may include wires and electrodes disposed symmetrically to each other. For example, in the first sub-pixel SPX1 and a second sub-pixel SPX2, wires coupled (e.g., connected) to each of them and semiconductor layers of transistors may be disposed in a specific pattern, and the pattern of the first sub-pixel SPX1 and the pattern of the second sub-pixel SPX2 may have a symmetrical structure. As shown in FIGS. 9 and 10, the pattern of wires and electrodes disposed in the first sub-pixel SPX1 and the pattern of wires and electrodes disposed in the second sub-pixel SPX2 may have a symmetrical structure or a flip structure with respect to an imaginary line extending in the second direction DR2. In the display device 10, the pattern of wires and electrodes may be repeatedly disposed with respect to a pair of sub-pixels SPX1 and SPX2 instead of one sub-pixel SPX. In some embodiments, the same patterns as those of the wires and electrodes of the first sub-pixel SPX1 and the second sub-pixel SPX2 may be repeatedly arranged in the sub-pixels SPX adjacent to the first sub-pixel SPX1 and the second sub-pixel SPX2 in the first direction DR1 or the second direction DR2.

When describing a plurality of layers disposed in the sub-pixels SPX of the display device 10, the display device 10 may include the substrate SUB, and a plurality of semiconductor layers, a plurality of conductive layers, and a plurality of insulating layers disposed on the substrate SUB. The semiconductor layers, the conductive layers, and the insulating layers may each constitute elements of the pixel driver PDU of the sub-pixel SPX, or wires coupled (e.g., connected) to the sub-pixel SPX.

The substrate SUB may be a base substrate or a base member. The substrate SUB may be a flexible substrate which can be bent, folded and/or rolled. For example, the substrate SUB may include (e.g., be) a polymer resin such as polyimide (PI), but is not limited thereto. In another embodiment, the substrate SUB may include (e.g., be) a glass material and/or a metal material.

The first buffer layer BF1 may be disposed on the substrate SUB. The first buffer layer BF1 may protect the thin film transistors and an organic light emitting layer 172 of the light emitting element layer EL from moisture permeating through the substrate SUB susceptible to moisture permeation. The first buffer layer BF1 may be formed of a plurality of inorganic layers that are alternately stacked. For example, the first buffer layer BF1 may be formed of multiple layers in which one or more inorganic layers including a silicon nitride layer, a silicon oxynitride layer, a silicon oxide layer, a titanium oxide layer and/or an aluminum oxide layer are alternately stacked. In some embodiments, the first buffer layer BF1 may not be provided, or may not be included.

The lower metal layer CAS may be disposed on the first buffer layer BF1. The lower metal layer CAS may be disposed across the entire surface of the display panel 100 and may be disposed to overlap a part of the first semiconductor layer. The lower metal layer CAS may be disposed to extend substantially in the first direction DR1 and the second direction DR2, and may be disposed in a mesh shape over the entire display area DA. A relatively wide extension may be disposed at a crossing (e.g., at an intersection) of portions of the lower metal layer CAS extending in the first direction DR1 and the second direction DR2, and the extension may overlap the active layer of the driving transistor DT of the first semiconductor layer in the third direction DR3, which is the thickness direction.

The lower metal layer CAS may include (e.g., be) a light blocking material to prevent, reduce, or block light from being incident on the active layer of the driving transistor DT, or may be electrically coupled (e.g., connected) to the active layer of the driving transistor DT to perform a function of stabilizing electrical characteristics of the driving transistor DT. In an embodiment, the lower metal layer CAS may be formed as a single layer or multiple layers including (e.g., being) molybdenum (Mo), aluminum (Al), chromium (Cr), gold (Au), titanium (Ti), nickel (Ni), neodymium (Nd), copper (Cu), and/or an alloy of any one thereof. In some embodiments, the lower metal layer CAS may not be provided or is not included.

A second buffer layer BF2 may be disposed on the lower metal layer CAS. Similarly to the first buffer layer BF1, the second buffer layer BF2 may protect the thin film transistors and the organic light emitting layer 172 of the light emitting element ED from moisture permeating through the substrate SUB susceptible to moisture permeation.

The first semiconductor layer may be disposed on the second buffer layer BF2. The first semiconductor layer may include (e.g., be) polycrystalline silicon and/or monocrystalline silicon. However, the present disclosure is not limited thereto.

The first semiconductor layer may include the active layers of the driving transistor DT, the first transistor ST1, the second transistor ST2, the fifth transistor ST5, the sixth transistor ST6, and the seventh transistor ST7. As will be described later, the active layers of the third transistor ST3 and the fourth transistor ST4 may be disposed in the second semiconductor layer.

In an embodiment in which two sub-pixels SPX adjacent in the first direction DR1 have a symmetric structure, the first semiconductor layer of the first sub-pixel SPX1 and the first semiconductor layer of the second sub-pixel SPX2 may have a structure coupled (e.g., connected) to each other. With respect to the boundary between the first sub-pixel SPX1 and the second sub-pixel SPX2, the pattern shapes of the first semiconductor layers disposed in the sub-pixels SPX may have a symmetrical structure. A portion where the first semiconductor layer of the first sub-pixel SPX1 and the first semiconductor layer of the second sub-pixel SPX2 are coupled (e.g., connected) may be a first electrode S5 of the fifth transistor ST5 to be described later.

The active layer of the driving transistor DT may include a channel layer DTCH, a first electrode DTS, and a second electrode DTD. The channel layer DTCH of the driving transistor DT may overlap a gate electrode GDT of a first gate conductive layer and the extension of the lower metal layer CAS. The first electrode DTS of the driving transistor DT may be coupled (e.g., connected) to a second electrode D2 of the second transistor ST2 and a second electrode D5 of the fifth transistor ST5. The second electrode DTD of the driving transistor DT may be coupled (e.g., connected) to a first electrode S3 of the third transistor ST3 and a first electrode S6 of the sixth transistor ST6.

The active layer of the first transistor ST1 may include a channel layer CH1, a first electrode S1, and a second electrode D1. The channel layer CH1 of the first transistor ST1 may overlap the bias scan line GBL of the first gate conductive layer. A part of the bias scan line GBL may serve as a gate electrode G1 of the first transistor ST1. The first electrode S1 of the first transistor ST1 may be electrically coupled (e.g., connected) to the first electrode DTS of the driving transistor DT. The second electrode D1 of the first transistor ST1 may be electrically coupled (e.g., connected) to the bias voltage line VOB. The first electrode S1 of the first transistor ST1 may be electrically coupled (e.g., connected) to the first electrode DTS of the driving transistor DT through a first connection electrode BE1 of the first source/drain layer, and the second electrode D1 of the first transistor ST1 may be electrically coupled (e.g., connected) to the bias voltage line VOB through a second connection electrode BE2 of the first source/drain layer.

The active layer of the second transistor ST2 may include a channel layer CH2, a first electrode S2, and the second electrode D2. The channel layer CH2 of the second transistor ST2 may overlap the write scan line GWL of the first gate conductive layer. A part of the write scan line GWL may serve as a gate electrode G2 of the second transistor ST2. The first electrode S2 of the second transistor ST2 may be electrically coupled (e.g., connected) to the data line DL. The second electrode D2 of the second transistor ST2 may be coupled (e.g., connected) to the first electrode DTS of the driving transistor DT. The first electrode S2 of the second transistor ST2 may be in contact with a third connection electrode BE3 of the first source/drain layer, and may be electrically coupled (e.g., connected) to the data line DL of the second source/drain layer through the third connection electrode BE3.

The active layer of the fifth transistor ST5 may include a channel layer CH5, the first electrode S5, and the second electrode D5. The channel layer CH5 of the fifth transistor ST5 may overlap the emission line EML of the first gate conductive layer. A part of the emission line EML may serve as a gate electrode G5 of the fifth transistor ST5. The first electrode S5 of the fifth transistor ST5 may be electrically coupled (e.g., connected) to a first vertical line VDD_V. The second electrode D5 of the fifth transistor ST5 may be coupled (e.g., connected) to the first electrode DTS of the driving transistor DT. The first electrode S5 of the fifth transistor ST5 may be electrically coupled (e.g., connected) to the first vertical line VDD_V of the second source/drain layer through a voltage connection electrode VBE of the first source/drain layer.

The active layer of the sixth transistor ST6 may include a channel layer CH6, the first electrode S6, and a second electrode D6. The channel layer CH6 of the sixth transistor ST6 may overlap the emission line EML of the first gate conductive layer. A part of the emission line EML may serve as a gate electrode G6 of the sixth transistor ST6. The first electrode S6 of the sixth transistor ST6 may be coupled (e.g., connected) to the second electrode DTD of the driving transistor DT. The second electrode D6 of the sixth transistor ST6 may be electrically coupled (e.g., connected) to a second electrode D7 of the seventh transistor ST7, and a pixel electrode 171 of the light emitting element ED. The second electrode D6 of the sixth transistor ST6 may be electrically coupled (e.g., connected) to the pixel electrode 171 through a seventh connection electrode BE7 of the first source/drain layer and a ninth connection electrode BE9 of the second source/drain layer.

The active layer of the seventh transistor ST7 may include a channel layer CH7, a first electrode S7, and the second electrode D7. The channel layer CH7 of the seventh transistor ST7 may overlap the bias scan line GBL of the first gate conductive layer. A part of the bias scan line GBL may serve as a gate electrode G7 of the seventh transistor ST7. The first electrode S7 of the seventh transistor ST7 may be electrically coupled (e.g., connected) to the second initialization voltage line VAIL. The second electrode D7 of the seventh transistor ST7 may be electrically coupled (e.g., connected) to the second electrode D6 of the sixth transistor ST6 and the pixel electrode 171 of the light emitting element ED. The first electrode S7 of the seventh transistor ST7 may be electrically coupled (e.g., connected) to the second initialization voltage line VAIL of the third gate conductive layer through an eighth connection electrode BE8 of the first source/drain layer.

The active layers of the driving transistor DT, the second transistor ST2, the fifth transistor ST5, the sixth transistor ST6, and the seventh transistor ST7 may be coupled (e.g., connected) to each other in a single pattern in the first semiconductor layer, and the active layer of the first transistor ST1 may be formed in a pattern separated from the active layers of other transistors or in an island-shaped pattern. The first transistor ST1 may be electrically coupled (e.g., connected) to other transistors through the connection electrode of the first source/drain layer. As will be described later, unlike other transistors, the active layers of the third transistor ST3 and the fourth transistor ST4 may be disposed in the second semiconductor layer, which is a different layer from the first semiconductor layer. The third transistor ST3 and the fourth transistor ST4 may also be electrically coupled (e.g., connected) to other transistors through the connection electrode of the first source/drain layer.

A first gate insulating layer GI1 may be disposed on the first semiconductor layer and the second buffer layer BF2. The first gate insulating layer GI1 may serve as a gate insulating layer of the transistors.

The first gate conductive layer may be disposed on the first gate insulating layer GI1. The first gate conductive layer may include the first initialization voltage line VGIL, the write scan line GWL, a gate electrode GDT of the driving transistor DT, the emission line EML, and the bias scan line GBL.

The gate electrode GDT of the driving transistor DT may be disposed to overlap the channel layer DTCH of the driving transistor DT of the first semiconductor layer. In some embodiments, the gate electrode GDT of the driving transistor DT may overlap the extension of the lower metal layer CAS. The gate electrodes GDT of the plurality of driving transistors DT may be arranged to be spaced apart from each other in the first direction DR1 and the second direction DR2 over the entire display area DA. The gate electrode GDT of the driving transistor DT may be integrally formed with a first capacitance electrode of the capacitor C1. The first capacitance electrode of the capacitor C1 may be a part of the gate electrode GDT of the driving transistor DT.

The first initialization voltage line VGIL may extend in the first direction DR1. The first initialization voltage line VGIL may be disposed at the upper side, which is one side in the second direction DR2, of each sub-pixel SPX. The first initialization voltage line VGIL may be electrically coupled (e.g., connected) to a first electrode S4 of the fourth transistor ST4. The first initialization voltage line VGIL may be electrically coupled (e.g., connected) to the first electrode S4 of the fourth transistor ST4 through a sixth connection electrode BE6 of the first source/drain layer.

The write scan line GWL may extend in the first direction DR1. The write scan line GWL may be spaced apart from the first initialization voltage line VGIL in the second direction DR2, and may be disposed to the lower side, which is the other side in the second direction DR2, of the first initialization voltage line VGIL. The write scan line GWL may be disposed to overlap the channel layer CH2 of the second transistor ST2, and a part of the write scan line GWL may be the gate electrode G2 of the second transistor ST2.

The emission line EML may extend in the first direction DR1. The emission line EML may be spaced apart from the gate electrode GDT of the driving transistor DT in the second direction DR2 in the sub-pixel SPX, and may be disposed to the lower side of the gate electrode GDT. The emission line EML may be disposed to overlap the channel layers CH5 and CH6 of the fifth transistor ST5 and the sixth transistor ST6, and a part of the emission line EML may be the gate electrodes G5 and G6 of the fifth transistor ST5 and the sixth transistor ST6.

The bias scan line GBL may extend in the first direction DR1. The bias scan line GBL may be spaced apart from the emission line EML in the second direction DR2, and may be disposed to the lower side of the emission line EML. The bias scan line GBL may be disposed to overlap the channel layers CH1 and CH7 of the first transistor ST1 and the seventh transistor ST7, and a part of the bias scan line GBL may be the gate electrodes G1 and G7 of the first transistor ST1 and the seventh transistor ST7.

A second gate insulating layer GI2 may be disposed on the first gate conductive layer. The second gate insulating layer GI2 may function as an insulating layer between the first gate conductive layer and other layers disposed thereon, and may protect the first gate conductive layer.

The second gate conductive layer may be disposed on the second gate insulating layer G12. The second gate conductive layer may include a first initialization scan line GIL1, a first control scan line GCL1, and a second horizontal line VDD_H.

The first initialization scan line GIL1 may extend in the first direction DR1. The first initialization scan line GIL1 may be disposed at the upper side of each sub-pixel SPX. The first initialization scan line GIL1 may be disposed to overlap a channel layer CH4 of the fourth transistor ST4. A part of the first initialization scan line GIL1 may be a gate electrode G4 of the fourth transistor ST4.

The first control scan line GCL1 may extend in the first direction DR1. The first control scan line GCL1 may be spaced apart from the first initialization scan line GIL1 in the second direction DR2, and may be disposed to the lower side of the first initialization scan line GIL1. The first control scan line GCL1 may be disposed to overlap a channel layer CH3 of the third transistor ST3. A part of the first control scan line GCL1 may be a gate electrode G3 of the third transistor ST3.

The second horizontal line VDD_H may extend in the first direction DR1. The second horizontal line VDD_H may be spaced apart from the first control scan line GCL1 in the second direction DR2 and may be disposed to the lower side of the first control scan line GCL1. The second horizontal line VDD_H may be coupled (e.g., connected) to the first power line PL1 in the non-display area DA, may be disposed to overlap the gate electrode GDT of the first gate conductive layer in the sub-pixel SPX, and may serve as a second capacitance electrode of the capacitor C1.

A first interlayer insulating layer IL1 may be disposed on the second gate conductive layer. The first interlayer insulating layer IL1 may function as an insulating layer between the second gate conductive layer and other layers disposed thereon, and may protect the second gate conductive layer.

The second semiconductor layer may be disposed on the first interlayer insulating layer IL1. The second semiconductor layer may include an oxide semiconductor layer. The second semiconductor layer may include the active layers of the third transistor ST3 and the fourth transistor ST4.

The active layer of the third transistor ST3 may include the channel layer CH3, the first electrode S3, and a second electrode D3. The channel layer CH3 of the third transistor ST3 may overlap the first control scan line GCL1 of the second gate conductive layer and a second control scan line GCL2 of the third gate conductive layer. A part of each of the first control scan line GCL1 and the second control scan line GCL2 may serve as the gate electrode G3 of the third transistor ST3. The third transistor ST3 may have a structure in which the gate electrode is disposed above and below the active layer.

The first electrode S3 of the third transistor ST3 may be electrically coupled (e.g., connected) to the second electrode DTD of the driving transistor DT. The second electrode D3 of the third transistor ST3 may be coupled (e.g., connected) to the first capacitance electrode of the capacitor C1 and the first electrode S4 of the fourth transistor ST4. The second electrode D3 of the third transistor ST3 may be electrically coupled (e.g., connected) to the first capacitance electrode of the capacitor C1 and the gate electrode GDT of the driving transistor DT through a fifth connection electrode BE5 of the first source/drain layer. The first electrode S3 of the third transistor ST3 may be electrically coupled (e.g., connected)

to the second electrode DTD of the driving transistor DT through a fourth connection electrode BE4 of the first source/drain layer.

The active layer of the fourth transistor ST4 may include the channel layer CH4, the first electrode S4, and a second electrode D4. The channel layer CH4 of the fourth transistor ST4 may overlap the first initialization scan line GIL1 of the second gate conductive layer, and the second initialization scan line GIL2 of the third gate conductive layer. A part of each of the first initialization scan line GIL1 and the second initialization scan line GIL2 may serve as the gate electrode G4 of the fourth transistor ST4. Similarly to the third transistor ST3, the fourth transistor ST4 may have a structure in which the gate electrode is disposed above and below the active layer.

The first electrode S4 of the fourth transistor ST4 may be coupled (e.g., connected) to the second electrode D3 of the third transistor ST3. The second electrode D4 of the fourth transistor ST4 may be electrically coupled (e.g., connected) to the first initialization voltage line VGIL. The second electrode D4 of the fourth transistor ST4 may be electrically coupled (e.g., connected) to the first initialization voltage line VGIL through the sixth connection electrode BE6 of the first source/drain layer.

A third gate insulating layer G13 may be disposed on the second semiconductor layer. The third gate insulating layer G13 may serve as a gate insulating layer of the transistors.

The third gate conductive layer may be disposed on the third gate insulating layer G13. The third gate conductive layer may include the second initialization scan line GIL2, the second control scan line GCL2, the bias voltage line VOB, and the second initialization voltage line VAIL.

The second initialization scan line GIL2 may extend in the first direction DR1. The second initialization scan line GIL2 may be disposed at the upper side of each sub-pixel SPX. The second initialization scan line GIL2 may be disposed to overlap the channel layer CH4 of the fourth transistor ST4. The second initialization scan line GIL2 may overlap the first initialization scan line GIL1 of the second gate conductive layer in the thickness direction and extend in substantially the same direction as that of the first initialization scan line GIL1. In some embodiments, the first initialization scan line GIL1 and the second initialization scan line GIL2 may have substantially the same pattern shape in the plan view.

The second control scan line GCL2 may extend in the first direction DR1. The second control scan line GCL2 may be spaced apart from the second initialization scan line GIL2 in the second direction DR2 and may be disposed to the lower side of the second initialization scan line GIL2. The second control scan line GCL2 may be disposed to overlap the channel layer CH3 of the third transistor ST3. The second control scan line GCL2 may overlap the first control scan line GCL1 of the second gate conductive layer in the thickness direction and extend in substantially the same direction as that of the first control scan line GCL1. In some embodiments, the first control scan line GCL1 and the second control scan line GCL2 may have substantially the same pattern shape in the plan view.

The second initialization voltage line VAIL may extend in the first direction DR1. The second initialization voltage line VAIL may be disposed at the lower side of the sub-pixel SPX. The second initialization voltage line VAIL may overlap the emission line EML of the first gate conductive layer in the thickness direction and extend in substantially the same direction as that of the emission line EML. The second initialization voltage line VAIL may be electrically coupled (e.g., connected) to the first electrode S7 of the seventh transistor ST7. The second initialization voltage line VAIL may be electrically coupled (e.g., connected) to the first electrode S7 of the seventh transistor ST7 through the eighth connection electrode BE8 of the first source/drain layer.

The bias voltage line VOB may extend in the first direction DR1. The bias voltage line VOB may be spaced apart from the second initialization voltage line VAIL in the second direction DR2, and may be disposed to the lower side of the second initialization voltage line VAIL. The bias voltage line VOB may be disposed to overlap the bias scan line GBL of the first gate conductive layer. The bias voltage line VOB may be electrically coupled (e.g., connected) to the first electrode S1 of the first transistor ST1. The bias voltage line VOB may be coupled (e.g., connected) to the first electrode S1 of the first transistor ST1 through the second connection electrode BE2 of the first source/drain layer.

A second interlayer insulating layer IL2 may be disposed on the third gate conductive layer. The second interlayer insulating layer IL2 may function as an insulating layer between the third gate conductive layer and other layers disposed thereon, and may protect the third gate conductive layer.

The first source/drain layer may be disposed on the second interlayer insulating layer IL2. The first source/drain layer may include the second data connection line DCL2 and the plurality of connection electrodes BE1 to BE8. The plurality of connection electrodes BE1 to BE8 may be respectively coupled (e.g., connected) to wires disposed on different layers or semiconductor layers to electrically couple (e.g., connect) them to each other.

The second data connection line DCL2 may extend in the first direction DR1 and be disposed at the upper side of the sub-pixel SPX. As described above with reference to FIGS. 7 and 8, the electrical connection of the second data connection line DCL2 to other wires may vary depending on the display area DA1, DA2, DA3, DA4 in which the corresponding sub-pixel SPX is disposed. For example, the second data connection line DCL2 of the sub-pixel SPX disposed in the first display area DA1 or the second display area DA2 may be electrically coupled (e.g., connected) to the first data connection line DCL1 and the first data line DL1. In some embodiments, the second data connection line DCL2 may be the first horizontal dummy pattern HDP1 that is not coupled (e.g., connected) to the first data connection line DCL1 and the first data line DL1. The second data connection line DCL2 of the sub-pixel SPX disposed in the third display area DA3 or the fourth display area DA4 may be the first horizontal power line HPL1.

The second data connection line DCL2 shown in FIGS. 9 and 10 is not coupled (e.g., connected) to the first data line DL1 and the first data connection line DCL1. In this case, the second data connection line DCL2 may be the first horizontal dummy pattern HDP1 or the first horizontal power line HPL1. As will be described later, when the second data connection line DCL2 is coupled (e.g., connected) to the first data line DL1 and the first data connection line DCL1, it may be integrated with any one of the third connection electrodes BE3 disposed to the lower side of the second data connection line DCL2. The second data connection line DCL2 may be electrically coupled (e.g., connected) to the first data connection line DCL1 or the first data line DL1 through the third connection electrode BE3.

The first to eighth connection electrodes BE1 to BE8 may be coupled (e.g., connected) to layers disposed lower than the first source/drain layer through contact holes CNT1 and CNT2 penetrating insulating layers therebelow. For example, the first connection electrode BE1 may be coupled (e.g., connected) to the first semiconductor layer through a first contact hole CNT1 penetrating the first gate insulating layer G11, the second gate insulating layer G12, the third gate insulating layer G13, the first interlayer insulating layer IL1, and the second interlayer insulating layer IL2. The first connection electrode BE1 may be coupled (e.g., connected) to each of the second electrode D1 of the first transistor ST1 and the first electrode DTS of the driving transistor DT.

The second connection electrode BE2 may be coupled (e.g., connected) to the first electrode S1 of the first transistor ST1 of the first semiconductor layer through the first contact hole CNT1. In some embodiments, the second connection electrode BE2 may be coupled (e.g., connected) to the bias voltage line VOB through the first contact hole CNT1 penetrating the second interlayer insulating layer IL2.

The third connection electrode BE3 may be disposed to the lower side of the second data connection line DCL2. The third connection electrode BE3 may be coupled (e.g., connected) to the data line DL or the first data connection line DCL1 of the second data conductive layer through a second contact hole CNT2 penetrating a first via layer VIA1 and a first passivation layer PV1 to be described later. In some embodiments, any one of the third connection electrodes BE3 may be integrated with the second data connection line DCL2.

The fourth connection electrode BE4 may be coupled (e.g., connected) to the second electrode DTD of the driving transistor DT of the first semiconductor layer through the first contact hole CNT1, and may be coupled (e.g., connected) to the first electrode S3 of the third transistor ST3 of the second semiconductor layer through the first contact hole CNT1. The fifth connection electrode BE5 may be coupled (e.g., connected) to the gate electrode GDT of the first gate conductive layer through the first contact hole CNT1, and may be coupled (e.g., connected) to the second electrode D3 of the third transistor ST3 through the first contact hole CNT1. The sixth connection electrode BE6 may be coupled (e.g., connected) to the first initialization voltage line VGIL through the first contact hole CNT1, and may be coupled (e.g., connected) to the second electrode D4 of the fourth transistor ST4 of the second semiconductor layer through the first contact hole CNT1.

The seventh connection electrode BE7 may be coupled (e.g., connected) to the second electrode D6 of the sixth transistor ST6 through the first contact hole CNT1, and may be coupled (e.g., connected) to the ninth connection electrode BE9 through the second contact hole CNT2. The eighth connection electrode BE8 may be coupled (e.g., connected) to the first electrode S7 of the seventh transistor ST7 through the first contact hole CNT1, and may be coupled (e.g., connected) to the second initialization voltage line VAIL through the second contact hole CNT2.

The voltage connection electrode VBE may be coupled (e.g., connected) to each of the first semiconductor layer and the first vertical line VDD_V. The voltage connection electrode VBE may be coupled (e.g., connected) to the second electrode D6 of the sixth transistor ST6 of the first semiconductor layer through the first contact hole CNT1, and may be coupled (e.g., connected) to the first vertical line VDD_V through the second contact hole CNT2.

The first passivation layer PV1 may be disposed on the first source/drain layer. The first passivation layer PV1 may function as an insulating layer between the first source/drain layer and other layers disposed thereon, and may protect the first source/drain layer.

The first via layer VIA1 may be disposed on the first passivation layer PV1. The first via layer VIA1 may planarize a stepped portion formed by layers therebelow while protecting the layers therebelow.

The second source/drain layer may be disposed on the first via layer VIA1. The second source/drain layer may include the plurality of first data connection lines DCL1, the plurality of data lines DL, the first vertical line VDD_V, and a plurality of ninth connection electrodes BE9.

The first data connection lines DCL1 and the data lines DL may extend in the second direction DR2. One first data connection line DCL1 and one data line DL may be disposed in each of two adjacent sub-pixels SPX, e.g., the first sub-pixel SPX1 and the second sub-pixel SPX2. As described above with reference to FIGS. 7 and 8, in the display device 10 according to one embodiment, a pair of first data connection lines DCL1 may be disposed adjacent to each other, and two different data lines DL may be disposed to be spaced apart from each other with the pair of first data connection lines DCL1 interposed therebetween. A distance between the first data connection line DCL1 of the first sub-pixel SPX1 and the first data connection line DCL1 of the second sub-pixel SPX2 may be smaller than a distance between the first data line DL1 of the first sub-pixel SPX1 and the first data line DL1 of the second sub-pixel SPX2. The first data connection lines DCL1 of the first sub-pixel SPX1 and the second sub-pixel SPX2 shown in FIGS. 9 and 10 may be disposed adjacent to a boundary therebetween, the data line DL of the first sub-pixel SPX1 may be disposed to the left side of the first data connection line DCL1, and the data line DL of the second sub-pixel SPX2 may be disposed to the right side of the first data connection line DCL1.

In some embodiments, in the case of an $n^{th}$ sub-pixel SPX adjacent in the first direction DR1 to the first sub-pixel SPX1 or the second sub-pixel SPX2 of FIGS. 9 and 10, the data line DL and the first data connection line DCL1 of the corresponding sub-pixel may be disposed to be spaced apart far from a boundary that is in contact with the first sub-pixel SPX1 or the second sub-pixel SPX2. In some embodiments, in the display device 10, the pattern shape of the wires, the semiconductor layers, and the electrodes shown in FIGS. 9 and 10 may be repeatedly arranged in the first direction DR1 and the second direction DR2 over the entire display area DA. In the display device 10, the first data connection lines DCL1 may be disposed adjacent to each other at a part of the boundary between the two sub-pixels SPX adjacent in the first direction DR1, and the data lines DL may be disposed to be spaced apart from each other at another part of the boundary (see FIG. 12).

As described above with reference to FIGS. 7 and 8, the electrical connection of the first data connection line DCL1 to other wires may vary depending on the display area DA1, DA2, DA3, DA4 in which the corresponding sub-pixel SPX is disposed, and the data lines DL may be distinguished from each other as different data lines.

For example, the first data connection line DCL1 of the sub-pixel SPX disposed in the first display area DA1 or the third display area DA3 may be the first vertical power line VPL1. The first data connection line DCL1 of the sub-pixel SPX disposed in the second display area DA2 or the fourth display area DA4 may be a wire electrically coupled (e.g., connected) to the second data connection line DCL2 or may be a first vertical dummy pattern VDP1. The data line DL disposed in the first display area DA1 or the third display area DA3 may be the first data line DL1 coupled (e.g., connected) to the second data connection line DCL2, and the data line DL disposed in the second display area DA2 or the fourth display area DA4 may be the second data line DL2.

The first data connection line DCL1 shown in FIGS. 9 and 10 is not coupled (e.g., connected) to the second data connection line DCL2. In this case, the first data connection line DCL1 may be the first vertical power line VPL1 or the first vertical dummy pattern VDP1. In some embodiments, the first data connection line DCL1 may be a wire coupled (e.g., connected) to the second data connection line DCL2 at another position. The data line DL shown in FIGS. 9 and 10 may be the first data line DL1 or the second data line DL2.

The first data connection lines DCL1 and the data lines DL may each be coupled (e.g., connected) to the third connection electrode BE3 of the first source/drain layer through the second contact hole CNT2. Depending on the connection between the third connection electrode BE3 and the second data connection line DCL2, the types (kinds) and electrical connections of the first data connection line DCL1 and the data line DL may vary, and in this case, the second contact hole CNT2 may be divided into the data connection holes DCH1 and DCH2 or the power holes PH1 and PH2 shown in FIGS. 7 and 8. A more detailed description of the arrangement between the data lines DL and the first data connection lines DCL1 will be given later with reference to other drawings.

The first vertical line VDD_V may extend in the second direction DR2 and may be spaced apart from the data line DL in the first direction DR1. The first vertical line VDD_V may have a relatively larger width in the first direction DR1 than that of the first data connection line DCL1 and the data line DL. The first data connection lines DCL1 of the two adjacent sub-pixels SPX may be disposed between two different data lines DL, and the first vertical line VDD_V may be disposed between two different data lines DL. The first data connection lines DCL1 may be disposed between two data lines DL that are relatively adjacent to each other, while the first vertical line VDD_V may be disposed between two data lines DL that are relatively far apart. Accordingly, a distance between the first vertical line VDD_V and the data line DL may be smaller than a distance between the first vertical line VDD_V and the first data connection line DCL1. This arrangement may be in conformity with an arrangement relationship between a pair of first data connection lines DCL1 and a pair of data lines DL adjacent to each other.

The first vertical line VDD_V may be coupled (e.g., connected) to the first power line PL1 in the non-display area NDA, and the first power voltage may be applied thereto. The first vertical line VDD_V may be coupled (e.g., connected) to the voltage connection electrode VBE through the second contact hole CNT2 and may be electrically coupled (e.g., connected) to the fifth transistor ST5 through the voltage connection electrode VBE.

The second via layer VIA2 may be disposed on the second source/drain layer. The second via layer VIA2 may planarize a stepped portion formed by layers therebelow while protecting the layers therebelow.

In an embodiment, the first to third gate conductive layers, the first data conductive layer, and the second data conductive layer described above may be formed as a single layer or multiple layers made of any one of, or of an alloy of any one of, molybdenum (Mo), aluminum (Al), and chromium (Cr), gold (Au), titanium (Ti), nickel (Ni), neodymium (Nd) and copper (Cu). Each of the first to third gate insulating layers G11, G12, and G13, the first and second interlayer insulating layers IL1 and IL2, and the first passivation layer PV1 may be formed of a plurality of inorganic layers that are alternately stacked. For example, the first to third gate insulating layers G11, G12, and G13, the first and second interlayer insulating layers IL1 and IL2, and the first passivation layer PV1 may be formed as a double layer formed by stacking, or a multilayer formed by alternately stacking, inorganic layers including (e.g., being) at least one of silicon oxide ($SiO_x$), silicon nitride ($SiN_x$), or silicon oxynitride ($SiO_xN_y$). However, the present disclosure is not limited thereto. In some embodiments, the first and second interlayer insulating layers IL1 and IL2 may be made of an organic insulating material such as polyimide (PI) and/or the like.

The light emitting element ED and a pixel defining layer PDL may be disposed on the second via layer VIA2. The light emitting element ED may include the pixel electrode 171, the organic light emitting layer 172, and a common electrode 173. The light emitting elements ED disposed in the plurality of sub-pixels SPX may share the common electrode 173 with each other.

The pixel electrode 171 of the light emitting element ED may be disposed on the second via layer VIA2. The pixel electrode 171 of the light emitting element ED may be coupled (e.g., connected) to the ninth connection electrode BE9 through a third contact hole CNT3 penetrating the second via layer VIA2. The pixel electrode 171 may be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, and/or the like. The APC alloy is an alloy of silver (Ag), palladium (Pd) and copper (Cu).

The pixel defining layer PDL may be disposed on the second via layer VIA2 and may be disposed on a part of the pixel electrode 171. The pixel defining layer PDL may include an opening that exposes a part of the pixel electrode 171, and the organic light emitting layer 172 of the light emitting element ED may be disposed in the opening of the pixel defining layer PDL. An emission portion of the light emitting element ED may be defined by the opening of the pixel defining layer PDL, and in the emission portion, the pixel electrode 171, the organic light emitting layer 172, and the common electrode 173 may be sequentially stacked, so that holes from the pixel electrode 171 and electrons from the common electrode 173 may be recombined in the organic light emitting layer 172 to emit light. The pixel defining layer PDL may be formed of an organic layer such as acryl resin, epoxy resin, phenolic resin, polyamide resin, polyimide resin and/or the like.

A spacer SPC may be disposed on the pixel defining layer PDL. A mask may be mounted on the spacer SPC during a manufacturing process of the display panel 100. The spacer SPC may be formed of an organic layer such as acryl resin, epoxy resin, phenolic resin, polyamide resin, polyimide resin and/or the like.

The organic light emitting layer 172 may be disposed on the pixel electrode 171 of the light emitting element ED. The organic light emitting layer 172 may include (e.g., be) an organic material to emit light in a set or predetermined color. For example, the organic light emitting layer 172 may include a hole transporting layer, an organic material layer, and an electron transporting layer.

The common electrode 173 may be disposed on the organic light emitting layer 172 and the pixel defining layer PDL. The common electrode 173 may be formed to cover the organic light emitting layer 172. The common electrode 173 may be formed in common in emission portions EA. A capping layer may be formed on the common electrode 173.

In the top emission structure, the common electrode 173 may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the common electrode 173 is formed of a semi-transmissive conductive material, the light emission efficiency of each of the light emitting units can be increased due to a micro-cavity effect.

A thin film encapsulation layer TFE may be disposed on the light emitting element ED. The thin film encapsulation layer TFE may include at least one inorganic layer to prevent, reduce, or block oxygen and/or moisture from permeating into the light emitting element ED. In some embodiments, the thin film encapsulation layer TFE may include at least one organic layer to protect the light emitting element ED from foreign substances such as dust. In the drawings, it is illustrated that the thin film encapsulation layer TFE has a single-layer structure, but is not limited thereto. In some embodiments, the thin film encapsulation layer TFE may have a structure including an inorganic insulating layer and an organic insulating layer that are alternately arranged, or two different inorganic insulating layers and an organic insulating layer disposed therebetween.

Figure 12:
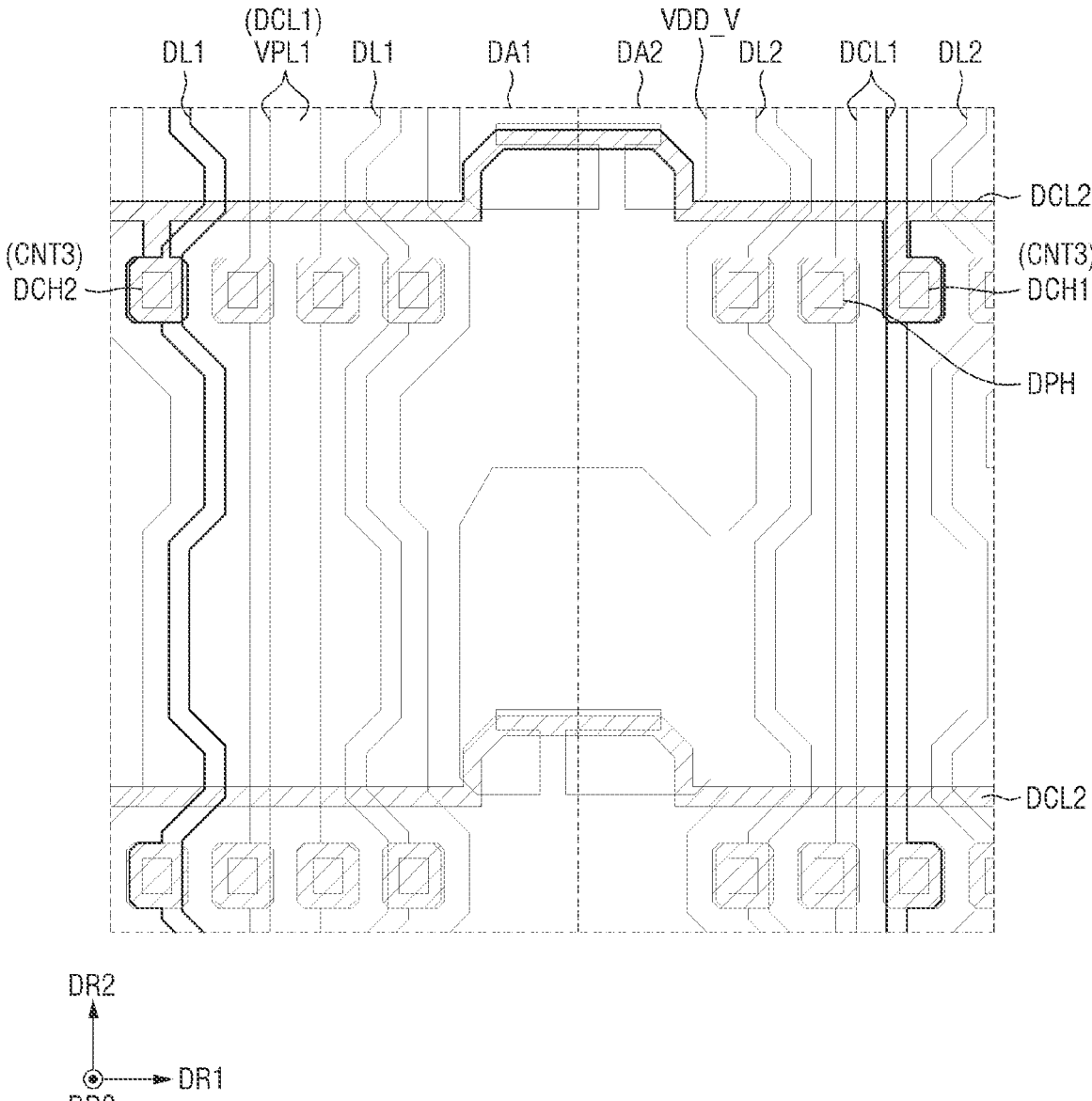
FIG. 12 is a schematic diagram illustrating an electrical connection between a data connection line and a data line in a display device according to one embodiment.

FIG. 12 is a schematic diagram illustrating an electrical connection between a data connection line and a data line in a display device according to one embodiment. FIG. 12 illustrates the arrangement of the data connection lines DCL1 and DCL2 and the data lines DL1 and DL2 in the sub-pixel SPX disposed in the first display area DA1 and the sub-pixel SPX disposed in the second display area DA2. In FIG. 12, the connection electrodes of the first source/drain layer are omitted, and some wires thereof and wires of the second source/drain layer are simply illustrated.

Referring to FIG. 12, the data line disposed in the sub-pixel SPX of the first display area DA1 may be the first data line DL1, and the data line disposed in the sub-pixel SPX of the second display area DA2 may be the second data line DL2. The first data connection line DCL1 disposed in the first display area DA1 may be the first vertical power line VPL1, and the first data connection line DCL1 disposed in the second display area DA2 may be a wire coupled (e.g., connected) to the second data connection line DCL2.

The first data lines DL1, the second data lines DL2, and the first data connection lines DCL1 disposed in each of the first display area DA1 and the second display area DA2 may be coupled (e.g., connected) to the third connection electrode BE3 through the second contact hole CNT2. Some of the plurality of third connection electrodes BE3 may be integrated with the second data connection line DCL2 to form an electrical connection, and some others thereof may be spaced apart from the second data connection line DCL2 or may remain in an island-shaped pattern.

For example, among the third connection electrodes BE3 disposed in the second display area DA2, the third connection electrode BE3 coupled (e.g., connected) to the first data connection line DCL1 may be integrated with the second data connection line DCL2. Among the third connection electrodes BE3 disposed in the first display area DA1, the third connection electrode BE3 coupled (e.g., connected) to the first data line DL1 may also be integrated with the second data connection line DCL2. Accordingly, the first data connection line DCL1 and the second data connection line DCL2 disposed in the second display area DA2, and the first data line DL1 disposed in the first display area DA1 may be electrically coupled (e.g., connected) to each other. The size of the non-display area NDA required in the lower side of the first display area DA1 may be reduced by utilizing (e.g., using) the electrical connection structure of the data connection lines DCL1 and DCL2 and the data lines DL1 and DL2.

In some embodiments, as described above, the pattern shape of the wires and the electrodes disposed in each sub-pixel SPX may be substantially the same, but their electrical connections may be different depending on their position in the display area DA. For example, the arrangement position and shape of wires between the first data lines DL1 disposed in the first display area DA1 and wires between the second data lines DL2 disposed in the second display area DA2 may be substantially the same. However, the wires in the first display area DA1 may be the first vertical power line VPL1 electrically coupled (e.g., connected) to the first power line PL1, and the wires disposed in the second display area DA2 may be the first data connection line DCL1.

A different signal may be applied to the first data connection line DCL1 of the display area DA other than the second display area DA2, but a data signal transmitted to the first data line DL1 may be applied to the first data connection line DCL1 of the second display area DA2. Accordingly, the type or kind of signal applied to the corresponding wire and the timing at which the signal is applied may be different from those of the wires in the other display areas DA. In particular, the first data connection line DCL1 may affect an electrical signal applied between other adjacent wires or electrodes, which may affect the amount of light emitted from the corresponding sub-pixel SPX and may cause a spot that is visually recognized from the outside. Even when the display device 10 according to one embodiment include a wire to which a different signal is applied depending on its position in the display area DA, it may have an arrangement structure of wires that does not affect the light emitting characteristic of the sub-pixel SPX by the corresponding wire.

Figure 13:
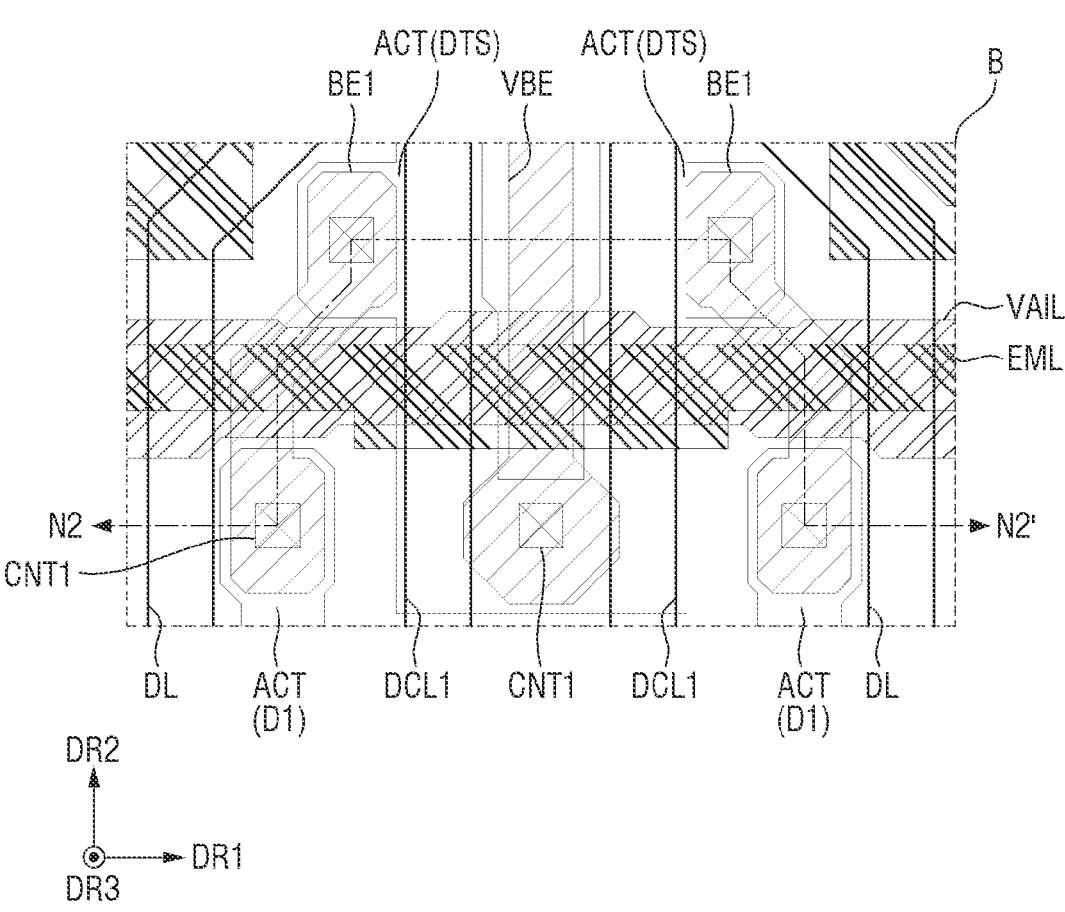
FIG. 13 is a plan view illustrating part B of FIGS. 9 and 10.
Figure 14:
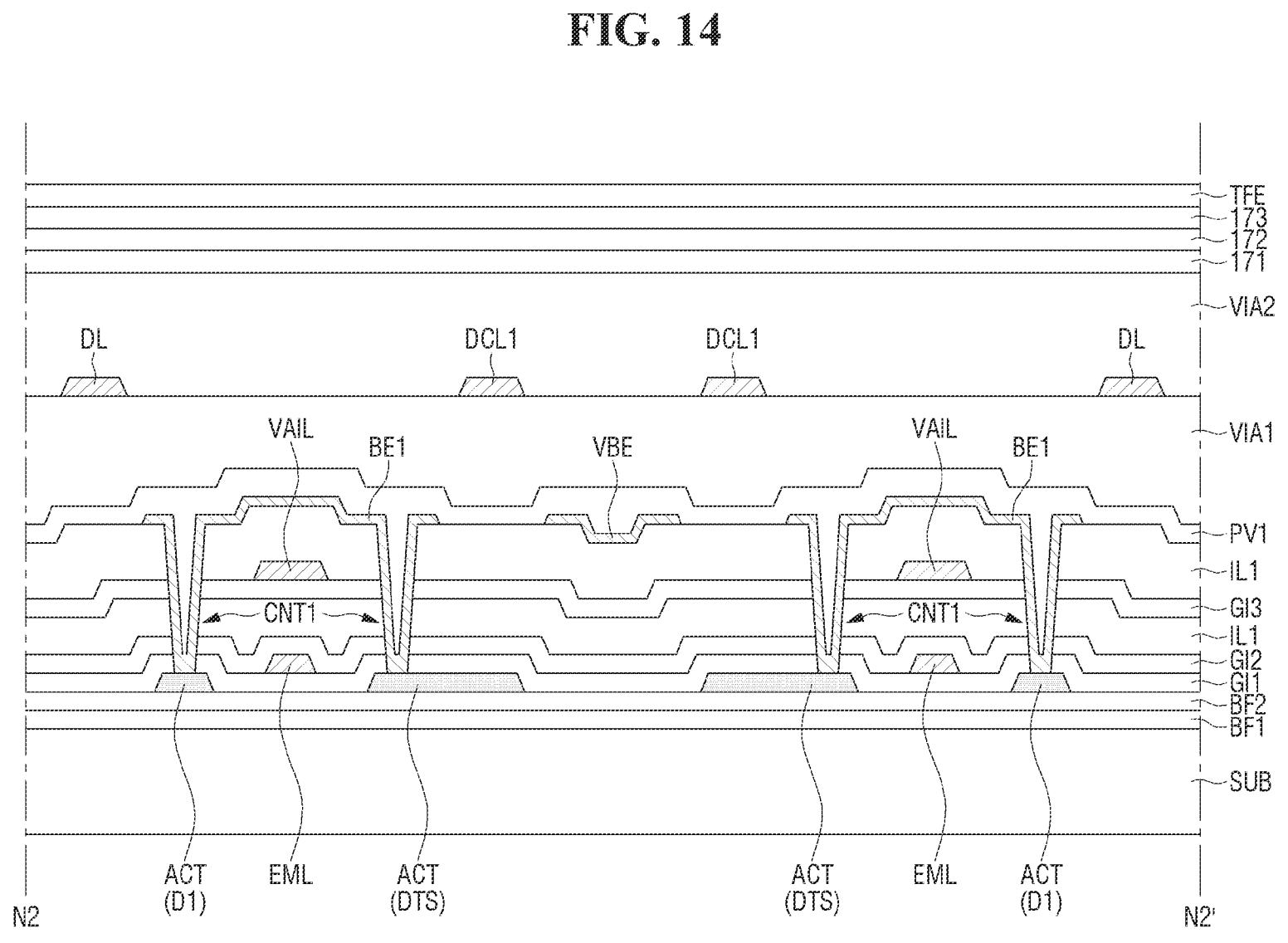

FIG. 13 is a plan view illustrating part B of FIGS. 9 and 10. FIG. 14 is a cross-sectional view taken along line N2-N2' of FIG. 13.

FIG. 13 is a diagram of portion B shown in FIGS. 9 and 10, and illustrates a region in which the first connection electrode BE1, the first data connection line DCL1, and the data line DL in each sub-pixel SPX are disposed. FIG. 13 shows the relative arrangement of the first semiconductor layer, the first gate conductive layer, the third gate conductive layer, the first source/drain layer, and the second source/drain layer. The sub-pixels SPX shown in FIG. 13 may be disposed in the second display area DA2, and the data line DL may be the second data line DL2.

According to one embodiment, in the display device 10, the data lines DL and the first data connection lines DCL1 to which a data signal is applied may be disposed so as not to overlap the first connection electrode BE1 coupled (e.g., connected) to the driving transistor DT and one electrode of the first transistor ST1. The first data connection lines DCL1 extending in the second direction DR2 may be spaced apart from the first connection electrodes BE1 in the first direction DR1 in the plan view, and may be disposed so as not to overlap each of them in the third direction DR3, which is the thickness direction. The data lines DL extending in the second direction DR2 may be spaced apart from the first connection electrodes BE1 in the first direction DR1 in the plan view, and may be disposed so as not to overlap each of them in the third direction DR3, which is the thickness direction.

Referring to FIGS. 9 and 13, the first connection electrode BE1 may be coupled (e.g., connected) to each of the first electrode DTS of the driving transistor DT and the second electrode D1 of the first transistor ST1. When the sub-pixels SPX shown in FIG. 13 are disposed in the first display area DA1, the first data connection lines DCL1 may be electrically coupled (e.g., connected) to the data lines DL1 disposed in the first display area DA1, and a data signal applied to another sub-pixel SPX instead of the sub-pixel SPX in which the first data connection line DCL1 is disposed may be applied to the first data connection lines DCL1. Each of the data lines DL of FIG. 13 may be the second data line DL2 of the second display area DA2.

When a data signal is applied to the first data connection line DCL1 when the sub-pixel SPX emits light, parasitic capacitance may be formed between the first connection electrodes BE1 disposed in different layers. The parasitic capacitance formed between the first data connection line DCL1 and the first connection electrode BE1 may increase the potential of the first electrode DTS of the driving transistor DT. In some embodiments, when a scan signal is applied through the write scan line GWL to turn on the second transistor ST2, the potential of the first electrode DTS of the driving transistor DT may further increase, and when a scan signal is applied through the control scan lines GCL1 and GCL2 to turn on the third transistor ST3, the potential of the gate electrode GDT of the driving transistor DT may also increase.

The parasitic capacitance formed between the first data connection line DCL1 and the first connection electrode BE1 may cause potential changes of the source electrode (or first electrode DTS) and the gate electrode of the driving transistor DT, which may affect the amount of light emitted from the corresponding sub-pixel SPX. In the display area DA, the sub-pixels SPX in which the parasitic capacitance is formed may appear relatively dark, and an externally visible spot may occur due to an insufficient amount of light emitted from the plurality of sub-pixels SPX.

In order to prevent such a spot from occurring, or to reduce the likelihood of such occurrence, by the arrangement of the first data connection line DCL1, the display device 10 according to one embodiment may have a structure that reduces or minimizes the parasitic capacitance that may be formed between the first data connection line DCL1 and the first connection electrode BE1. For example, an arrangement structure in which the first data connection line DCL1 avoids (e.g., in which the first data connection line DCL1 is separated from, or spaced apart from, in the plan view) the first connection electrode BE1 coupled (e.g., connected) to the first electrode DTS of the driving transistor DT may be designed.

As described above, the first data connection lines DCL1 and the data lines DL may be disposed adjacent to a boundary between two sub-pixels (e.g., the first sub-pixel and second sub-pixel of FIGS. 9 and 10) adjacent to each other in the first direction DR1. Because the first semiconductor layers of two sub-pixels SPX have a symmetrical structure with respect to the boundary between two sub-pixels SPX, the first connection electrode BE1 may also be disposed adjacent to the boundary.

In a structure in which the first data connection lines DCL1 disposed at the boundary between the two sub-pixels SPX adjacent to each other in the first direction DR1 are positioned between the data lines DL adjacent to each other, the first connection electrode BE1 may be disposed in a region that does not overlap the first data connection line DCL1 and the data line DL. For example, the first connection electrode BE1 may be separated from, or spaced apart from, each of the first data connection line DCL1 and the data line DL in the plan view. Each of the first connection electrodes BE1 may be disposed between (e.g., between in the plan view) one first data connection line DCL1 and one data line DL.

For example, the first connection electrode BE1 disposed in the left sub-pixel SPX of FIG. 13 may be positioned between the data line DL and the first data connection line DCL1, and for example, may be positioned to the right side of the data line DL and to the left side of the first data connection line DCL1. The arrangement structure of electrodes and wires in the right sub-pixel SPX of FIG. 13 may be symmetrical to that of the left sub-pixel SPX, and the first connection electrode BE1 disposed in the right sub-pixel SPX may be positioned between the first data connection line DCL1 and the data line DL, and for example, may be positioned to the left side of the data line DL and to the right side of the first data connection line DCL1.

The first data connection line DCL1 may be disposed to extend in the second direction DR2 irrespective of its position, whereas the data line DL may have a shape of extending in the second direction DR2, bypassing the first connection electrode BE1, and being bent in the first direction DR1. For example, the data line DL may curve around the first connection electrode BE1 as it extends in the second direction DR2. In some examples, the data line DL may have a serpentine shape configured such that the data line DL periodically curves around first connection electrodes BE1 that are arranged along the second direction DR2. A distance between the first data connection line DCL1 and the data line DL may vary depending on the position, and the greatest (e.g., maximum) distance therebetween may be a width sufficient to allow the first connection electrode BE1 to be disposed (e.g., to be disposed between the first data connection line DCL1 and the data line DL).

As the first data connection line DCL1 is disposed so as not to overlap the first connection electrode BE1 in the thickness direction (e.g., in the plan view), the formation of parasitic capacitance between the first connection electrode BE1 of the first source/drain layer and the first data connection line DCL1 of the second source/drain layer may be reduced or minimized. As the data lines DL are also arranged not to overlap the first connection electrode BE1, the formation of parasitic capacitance therebetween may also be reduced or minimized. When parasitic capacitance between the first connection electrodes BE1 is hardly formed when a data signal is applied to the first data connection line DCL1, the potential change of the first electrode DTS of the driving transistor DT may be reduced, and an effect on the amount of light emitted from the corresponding sub-pixel SPX may be reduced. Accordingly, the display device 10 may prevent a spot from occurring, or reduce the likelihood of such occurrence, in the display area DA due to the arrangement of the first data connection line DCL1.

However, in the display device 10, because parasitic capacitance between the first connection electrodes BE1 may not be formed (or may be reduced) when a data signal is applied to the first data connection line DCL1, the first connection electrode BE1 and the data line DL may not necessarily be disposed without overlapping. The display device 10 may have a structure in which a bent portion of the data line DL is reduced to increase straightness. In some cases, the data line DL and the first connection electrode BE1 may overlap each other in the thickness direction (e.g., in the plan view). This will be described later in more detail with reference to another embodiment.

In some embodiments, the voltage connection electrode VBE may be disposed between two adjacent first connection electrodes BE1. A part of the voltage connection electrode VBE may overlap the first data connection line DCL1 in the thickness direction (e.g., in the plan view). The voltage connection electrode VBE may be coupled (e.g., connected) to the first vertical line VDD_V to which the first power voltage is applied, and the first power voltage may be applied when the sub-pixel SPX emits light. In FIG. 13, it is illustrated that the voltage connection electrode VBE hardly overlaps the first data connection line DCL1, or overlaps only a part thereof, but the present disclosure is not limited thereto.

In some embodiments, the voltage connection electrode VBE may have a large portion overlapping the first data connection line DCL1, and may prevent, reduce, or suppress the formation of parasitic capacitance between the first connection electrode BE1 and the first data connection line DCL1. In some embodiments, the second initialization voltage line VAIL of the third gate conductive layer may prevent, reduce, or suppress the formation of parasitic capacitance between the first connection electrode BE1 and the first data connection line DCL1, while overlapping the first data connection line DCL1 and the first semiconductor layer ACT in the thickness direction (e.g., in the plan view). This will be described in more detail later with reference to another embodiment.

Figure 15:
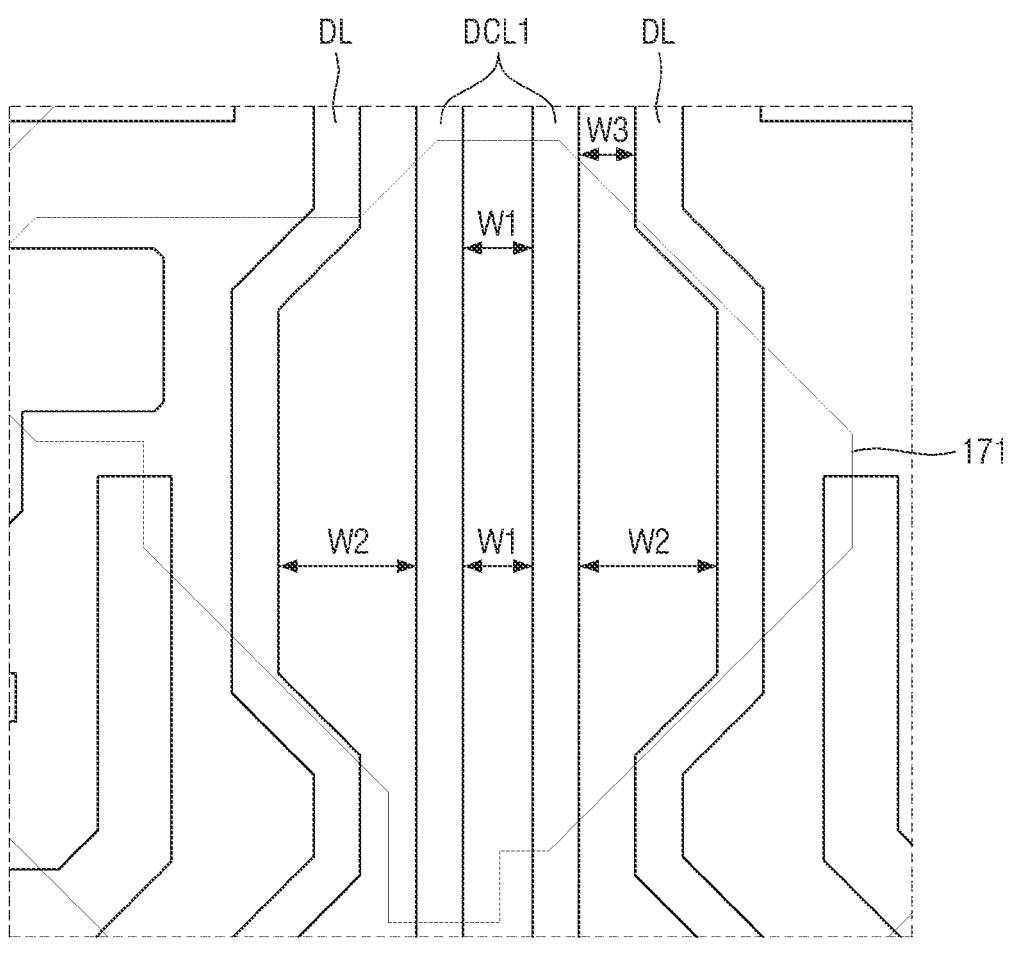
FIG. 15 is a plan view illustrating a pixel electrode disposed in one sub-pixel of a display device according to one embodiment.

FIG. 15 is a plan view illustrating a pixel electrode disposed in one sub-pixel of a display device according to one embodiment. FIG. 15 illustrates a relative planar arrangement of the pixel electrode 171, the first data connection line DCL1, and the data line DL.

Referring to FIG. 15, according to one embodiment, the first data connection lines DCL1 and the data lines DL of the sub-pixel SPX may be disposed to overlap the pixel electrode 171 of the light emitting element ED. As the first data connection lines DCL1 and the data lines DL are disposed to be spaced apart from each other, and the data line DL is disposed to bypass the first connection electrode BE1, a distance between the data line DL and the first data connection line DCL1 may vary depending on the position (e.g., depending on the position along the second direction DR2).

For example, a separation distance W2 between the first data connection line DCL1 and the data line DL at a portion where they overlap the pixel electrode 171 may be greater than a separation distance W3 therebetween at a portion where they do not overlap the pixel electrode 171. The separation distance W3 between the first data connection line DCL1 and the data line DL at a portion where they do not overlap the pixel electrode 171 may be substantially the same as the distance W1 between the first data connection lines DCL1. In each sub-pixel SPX, the first connection electrode BE1 may be disposed to overlap the pixel electrode 171, and the distance between the data line DL and the first data connection line DCL1 may vary at a portion where the data line DL extends while bypassing the first connection electrode BE1. As shown in FIGS. 13 and 15, the separation distance W2 between the first data connection line DCL1 and the data line DL at a portion where they are spaced apart from each other with the first connection electrode BE1 therebetween may be greater than the separation distance W3 therebetween at other portions.

However, the separation distance W2 between the first data connection line DCL1 and the data line DL at a portion where they overlap the pixel electrode 171 may be maintained substantially constant at least in the lower portion of the pixel electrode 171. For example, a portion of the data line DL extending in the second direction DR2 and partially bent may be positioned adjacent to an outer boundary of the pixel electrode 171. Although the display device 10 has a structure in which the first data connection lines DCL1 adjacent to each other are disposed between the data lines DL, a change in a distance between the two different wires at a portion where they overlap the pixel electrode 171 may be small. Accordingly, there is little effect on the pixel electrode 171 of each sub-pixel SPX by the arrangement structure of the data line DL and the first data connection line DCL1, and the change in the amount of light emitted from the light emitting element ED may be small.

Hereinafter, other embodiments of the display device 10 will be described with reference to other drawings.

Figure 16:
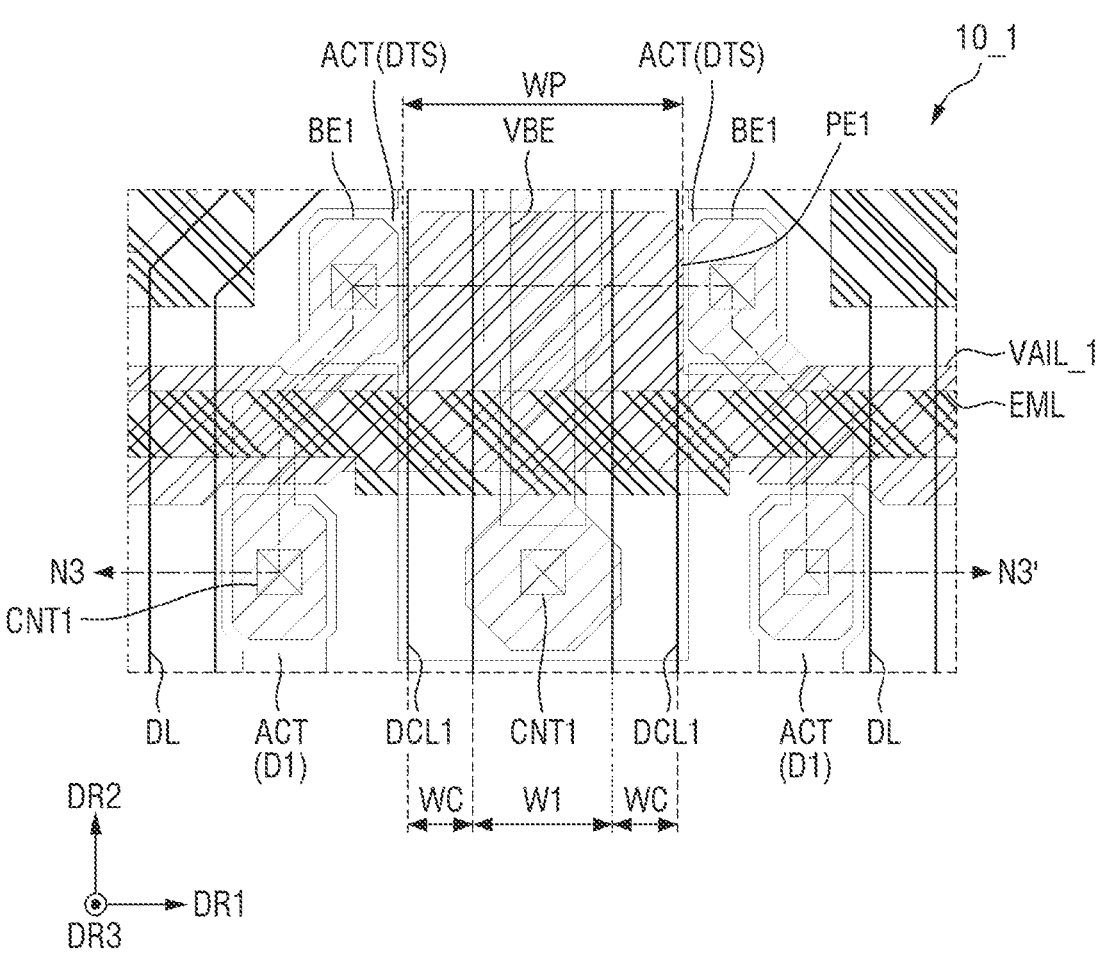
FIG. 16 is a plan view illustrating a portion of a display device according to another embodiment.
Figure 17:
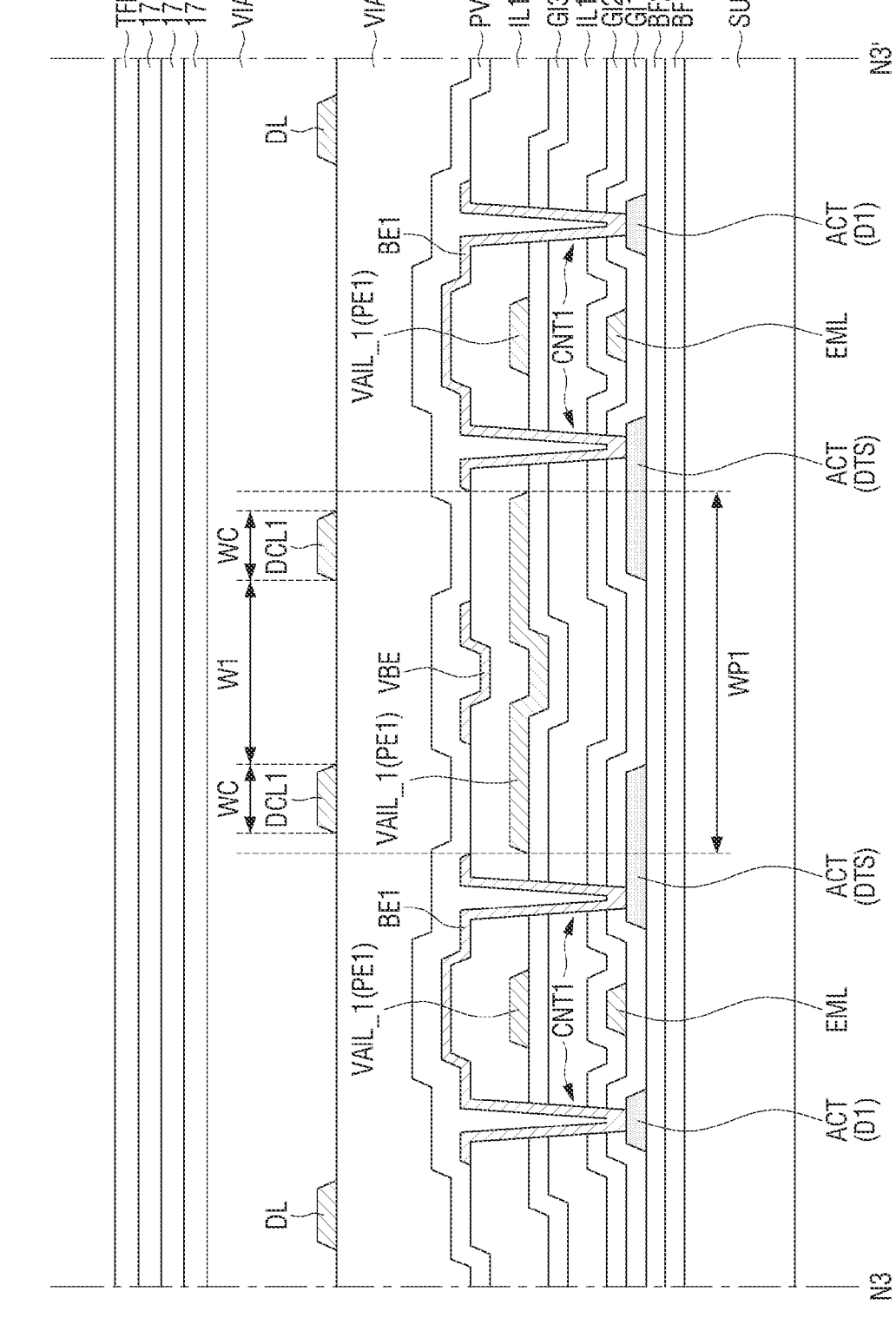
FIG. 17 is a cross-sectional view taken along line N3-N3' of FIG. 16.

FIG. 16 is a plan view illustrating a part of a display device according to another embodiment. FIG. 17 is a cross-sectional view taken along line N3-N3' of FIG. 16.

Referring to FIGS. 16 and 17, in a display device 10_1 according to this embodiment, a second initialization voltage line VAIL_1 may include a protrusion PE1 extending in the first direction DR1 and protruding in the second direction DR2 (e.g., protruding in the second direction DR2 from a main body of the second initialization voltage line VAIL_1, and having a width extending along the first direction DR1), and the protrusion PE1 of the second initialization voltage line VAIL_1 may be disposed to overlap the first data connection lines DCL1 in the thickness direction (e.g., in the plan view) between two adjacent first connection electrodes BE1 in the plan view. The protrusion PE1 of the second initialization voltage line VAIL_1 may be disposed to overlap the first electrode DTS of the driving transistor DT in the thickness direction (e.g., in the plan view), and may prevent, reduce, or suppress parasitic capacitance from being formed between the first electrode DTS of the driving transistor DT and the first data connection line DCL1.

The protrusion PE1 of the second initialization voltage line VAIL_1 may be disposed at a boundary between two adjacent sub-pixels SPX. The protrusion PE1 may be disposed between the first connection electrodes BE1 while overlapping each of the first data connection lines DCL1 of the two sub-pixels SPX. A width WP of the protrusion PE1 in the first direction DR1 may be greater than widths WC of two first data connection lines DCL1 spaced apart from each other, and may be greater than the sum of the widths WC of the two different first data connection lines DCL1 and the distance W1 between them. Accordingly, the protrusion PE1 may be disposed to cover all of the first data connection lines DCL1 in a width direction, which is the first direction DR1.

The protrusion PE1 of the second initialization voltage line VAIL_1 may overlap the first electrode DTS of the driving transistor DT of the first semiconductor layer. The first data connection lines DCL1 of the second source/drain layer may partially overlap the first electrode DTS of the driving transistor DT. However, the second initialization voltage line VAIL_1 of the third gate conductive layer, which is an intermediate layer between them, may include the protrusion PE1 to prevent, reduce, or suppress parasitic capacitance from being forming between the first data connection line DCL1 and the first electrode DTS of the driving transistor DT.

Figure 18:
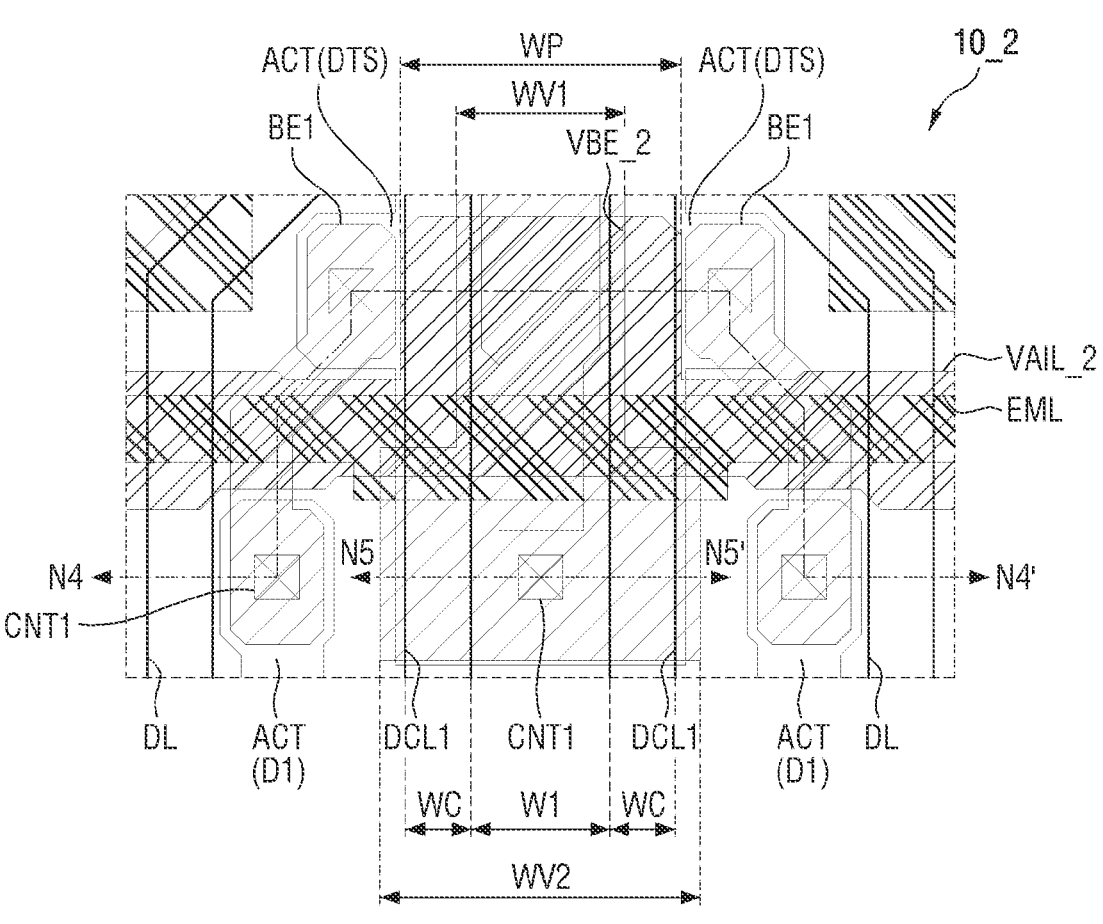
FIG. 18 is a plan view illustrating a portion of a display device according to still another embodiment.
Figure 19:
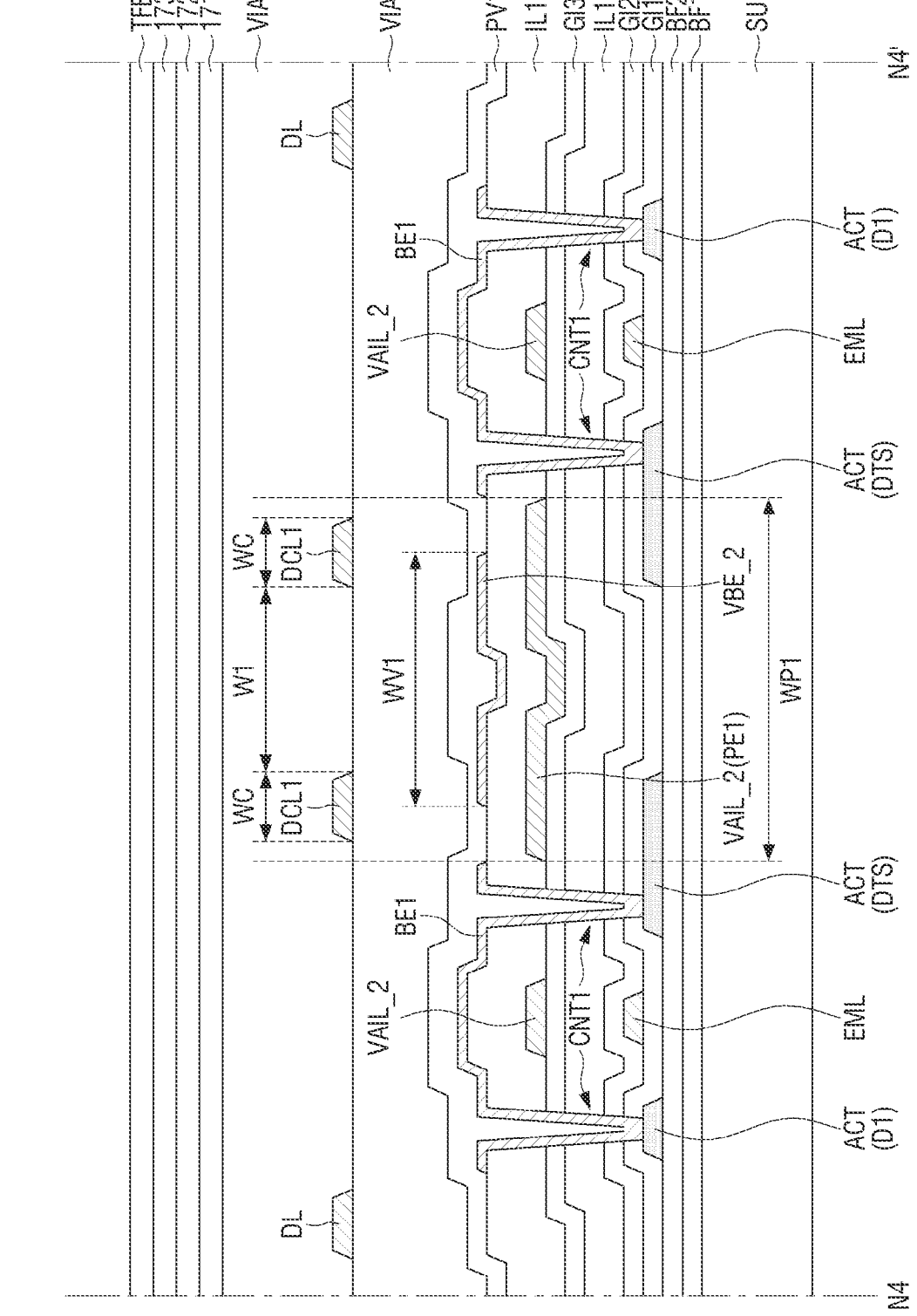
FIG. 19 is a cross-sectional view taken along line N4-N4' of FIG. 18.
Figure 20:
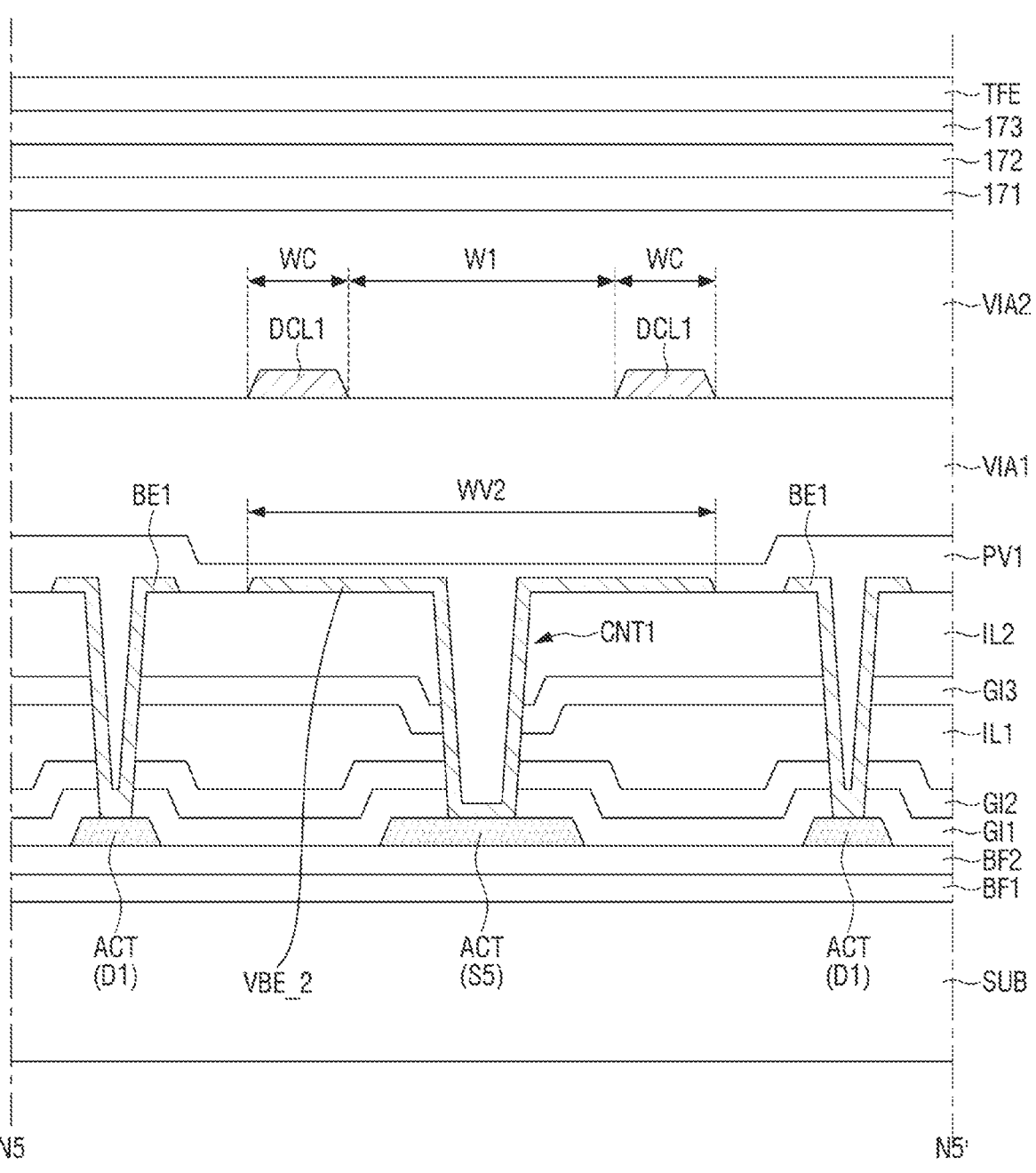
FIG. 20 is a cross-sectional view taken along line N5-N5' of FIG. 18.

FIG. 18 is a plan view illustrating a part of a display device according to still another embodiment. FIG. 19 is a cross-sectional view taken along line N4-N4' of FIG. 18. FIG. 20 is a cross-sectional view taken along line N5-N5' of FIG. 18.

Referring to FIGS. 18 to 20, in a display device 10_2 according to this embodiment, a voltage connection electrode VBE_2 may be disposed to overlap the first data connection lines DCL1 in the thickness direction (e.g., in the plan view) between two adjacent first connection electrodes BE1 in plan view. The voltage connection electrode VBE_2 may be disposed in the first source/drain layer which is an intermediate layer between the first data connection line DCL1 and the first electrode DTS of the driving transistor DT, and may prevent, reduce, or suppress parasitic capacitance from being formed between the first data connection line DCL1 and the first electrode DTS of the driving transistor DT. In some embodiments, the voltage connection electrode VBE_2 may be disposed on the same layer as the first connection electrode BE1 to prevent, reduce, or suppress parasitic capacitance from being formed between the first data connection line DCL1 and the side portion of the first connection electrode BE1.

The voltage connection electrode VBE_2 may be disposed at a boundary between two adjacent sub-pixels SPX. The voltage connection electrode VBE_2 may partially overlap each of the two adjacent first data connection lines DCL1, and may be disposed between the first connection electrodes BE1 disposed in substantially the same layer.

A width WV1, WV2 of the voltage connection electrode VBE_2 in the first direction DR1 may vary depending on the position (e.g., the position along the second direction DR2). The voltage connection electrode VBE_2 may be disposed in the first source/drain layer, which is the same as the layer of the first connection electrode BE1, may be spaced apart from the first connection electrode BE1, and may have a width sufficient to partially overlap the first data connection lines DCL1. For example, the voltage connection electrode VBE_2 may have a relatively small smallest (e.g., minimum) line width WV1 (e.g., width in the first direction DR1) between portions where the first connection electrode BE1 is coupled (e.g., connected) to the first electrode DTS of the driving transistor DT. However, the smallest (e.g., minimum) line width WV1 of the voltage connection electrode VBE_2 may be greater than the distance W1 between the first data connection lines DCL1 such that the voltage connection electrode VBE_2 overlaps the first data connection line DCL1 at least between the first connection electrodes BE1.

On the other hand, the voltage connection electrode VBE_2 may have a relatively large greatest (e.g., maximum) line width WV2 (e.g., width in the first direction DR1) between portions where the first connection electrode BE1 overlaps the second electrode D1 of the first transistor ST1. The greatest (e.g., maximum) line width WV2 of the voltage connection electrode VBE_2 may be greater than the widths WC of two first data connection lines DCL1 spaced apart from each other, and may be greater than the sum of the widths WC of the two first data connection lines DCL1 and the distance W1 between them. Accordingly, the voltage connection electrode VBE_2 may be disposed to cover all of the first data connection lines DCL1 in a portion having the greatest (e.g., maximum) line width WV2.

Figure 21:
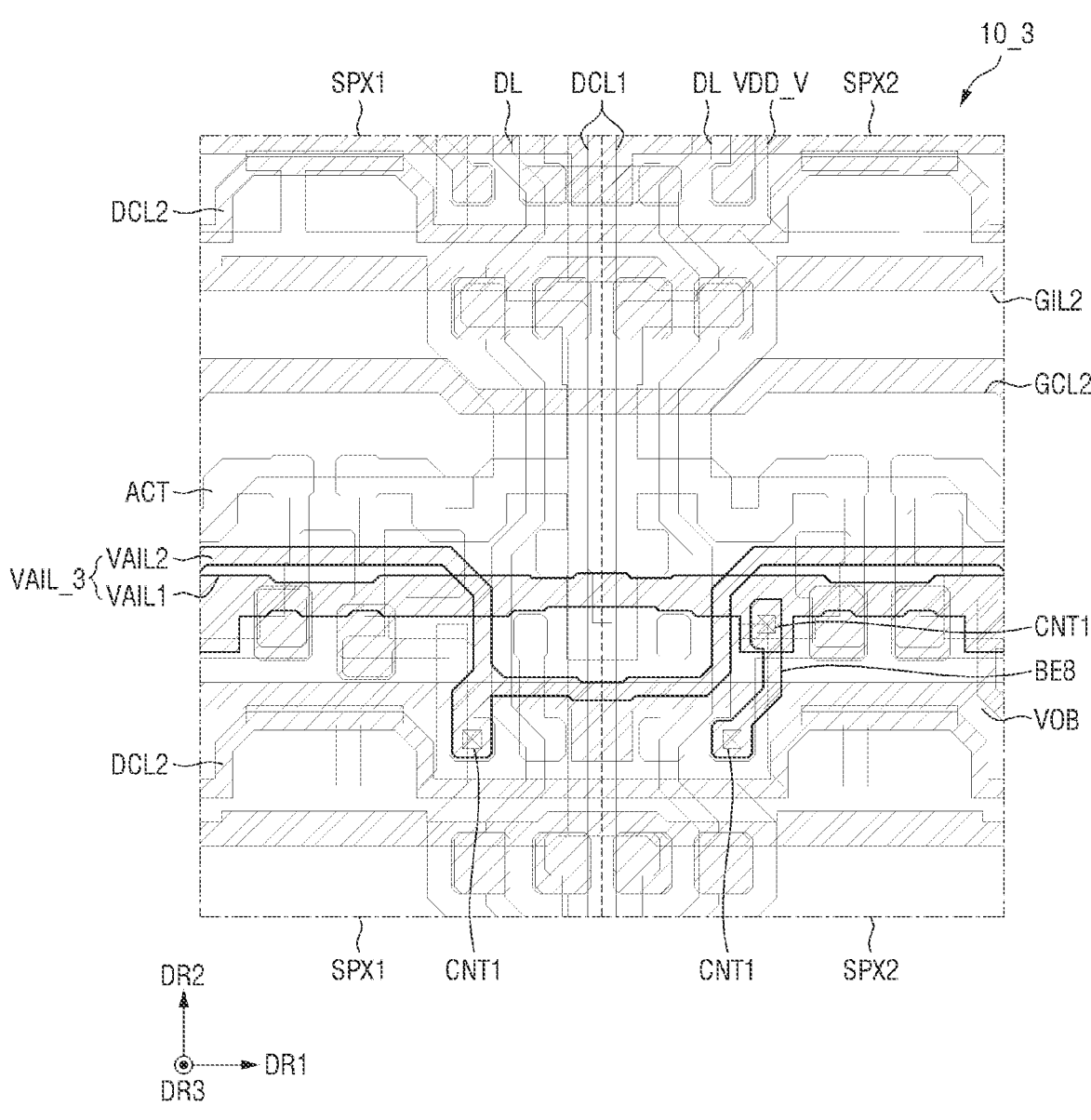
FIG. 21 is a layout diagram illustrating two adjacent sub-pixels in a display device according to still another embodiment.
Figure 22:
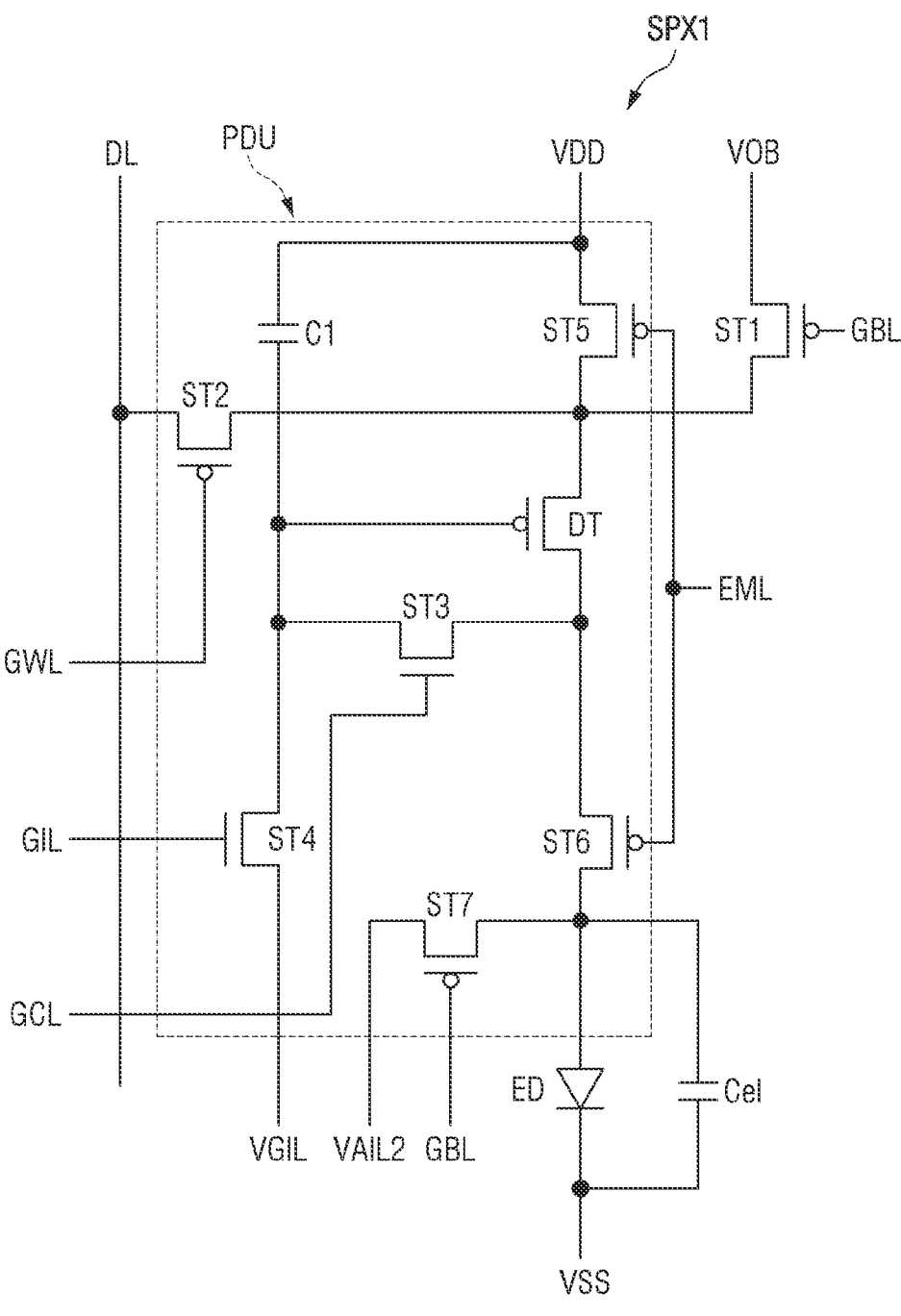
FIG. 22 is a pixel circuit diagram of a first sub-pixel of FIG. 21.
Figure 23:
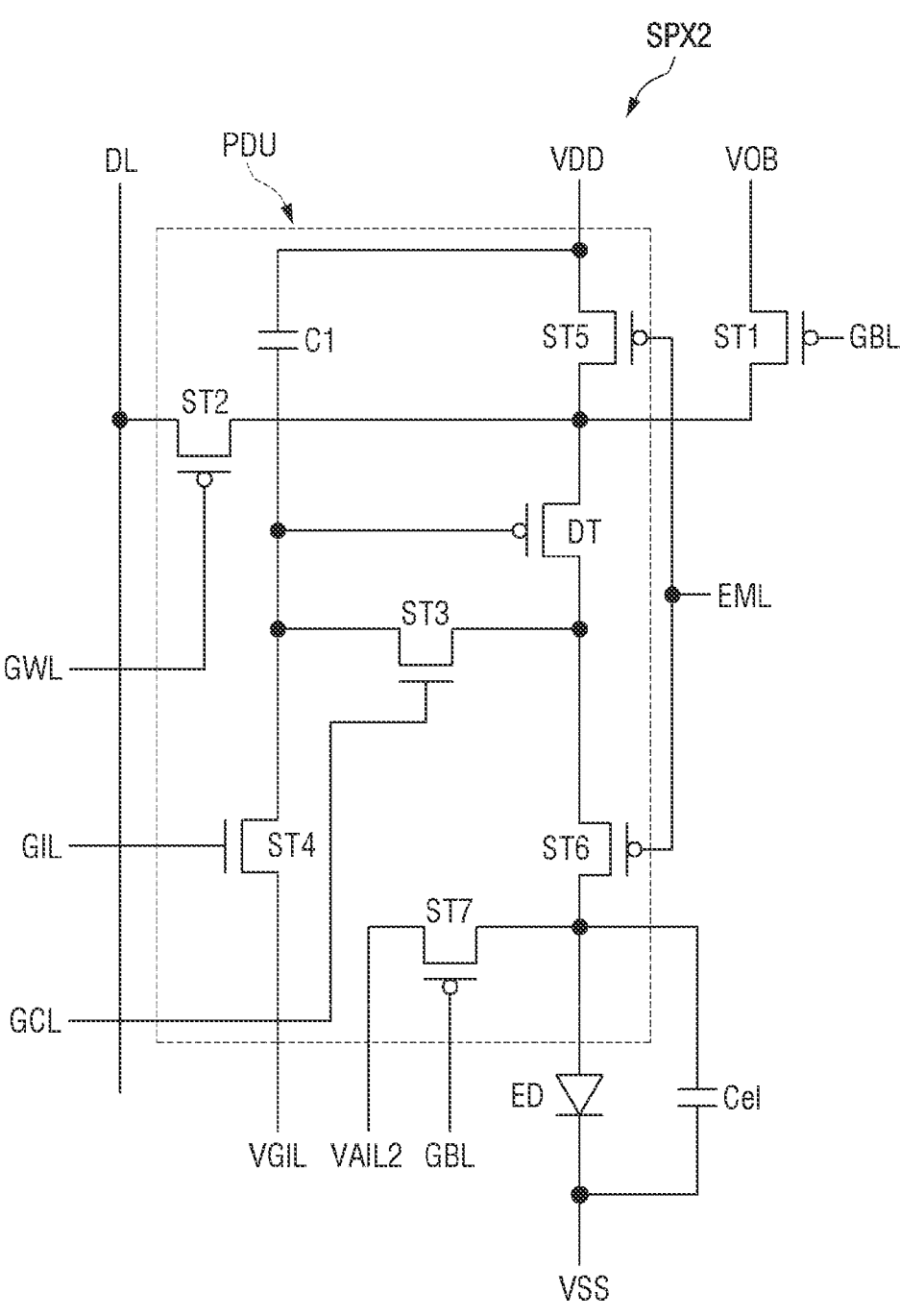
FIG. 23 is a pixel circuit diagram of a second sub-pixel of FIG. 21.

FIG. 21 is a layout diagram illustrating two adjacent sub-pixels in a display device according to still another embodiment. FIG. 22 is a pixel circuit diagram of a first sub-pixel of FIG. 21. FIG. 23 is a pixel circuit diagram of a second sub-pixel of FIG. 21.

Referring to FIGS. 21 to 23, in a display device 10_3 according to this embodiment, a second initialization voltage line VAIL_3 may include a plurality of sub-initialization voltage lines VAIL1 and VAIL2 disposed in different layers. For example, the second initialization voltage line VAIL_3 may include a first sub-initialization voltage line VAIL1 disposed in the third gate conductive layer as in the embodiment of FIGS. 9 and 10, and a second sub-initialization voltage line VAIL2 disposed in the first source/drain layer, which is an upper layer thereof. The first sub-initialization voltage line VAIL1 may be coupled (e.g., connected) to the second sub-pixel SPX2 of FIG. 21, and the second sub-initialization voltage line VAIL2 may be coupled (e.g., connected) to the first sub-pixel SPX1 of FIG. 21. In the display device 103, the second initialization voltage lines VAIL_3 coupled (e.g., connected) to different sub-pixels SPX1 and SPX2 may be wires of different layers.

The arrangement and electrical connection relationship of the first sub-initialization voltage line VAIL1 are substantially the same as described above with reference to FIGS. 9 and 10. However, because the first sub-initialization voltage line VAIL1 is not coupled (e.g., connected) to the first sub-pixel SPX1 of FIG. 21, the eighth connection electrode BE8 for coupling (e.g., connecting) the first sub-initialization voltage line VAIL1 to the first electrode S7 of the seventh transistor ST7 may not be disposed in the first sub-pixel SPX1.

The second sub-initialization voltage line VAIL2 may be disposed in the first source/drain layer and may substantially extend in the first direction DR1. Compared to the first sub-initialization voltage line VAIL1 having a generally linear shape extending in the first direction DR1, the second sub-initialization voltage line VAIL2 may have a shape that is partially bent to have a recess portion.

For example, in the plan view, the second sub-initialization voltage line VAIL2 may extend in the first direction DR1 at the upper side of the first sub-initialization voltage line VAIL1, and may be bent in the second direction DR2 toward a portion where the first electrode S7 of the seventh transistor ST7 of the first semiconductor layer is positioned. The second sub-initialization voltage line VAIL2 may be directly coupled (e.g., connected) to the first electrode S7 of the seventh transistor ST7 in the first sub pixel SPX1, and may be bent again in the first direction DR1. In the second sub-pixel SPX2, because the eighth connection electrode BE8 is positioned on the first electrode S7 of the seventh transistor ST7, the second sub-initialization voltage line VAIL2 may, in order to bypass the eighth connection electrode BE8, be bent in the second direction DR2 and then bent again in the first direction DR1 to extend.

Different colors of light may be emitted from different sub-pixels SPX, and characteristics of a voltage applied to a corresponding sub-pixel SPX may be different depending on the color of light emitted from the corresponding sub-pixel SPX. Accordingly, the display device 10_3 may include different sub-initialization voltage lines VAIL1 and VAIL2 so that different initialization voltages may be applied to the pixel electrodes 171 of different sub-pixels SPX.

Figure 24:
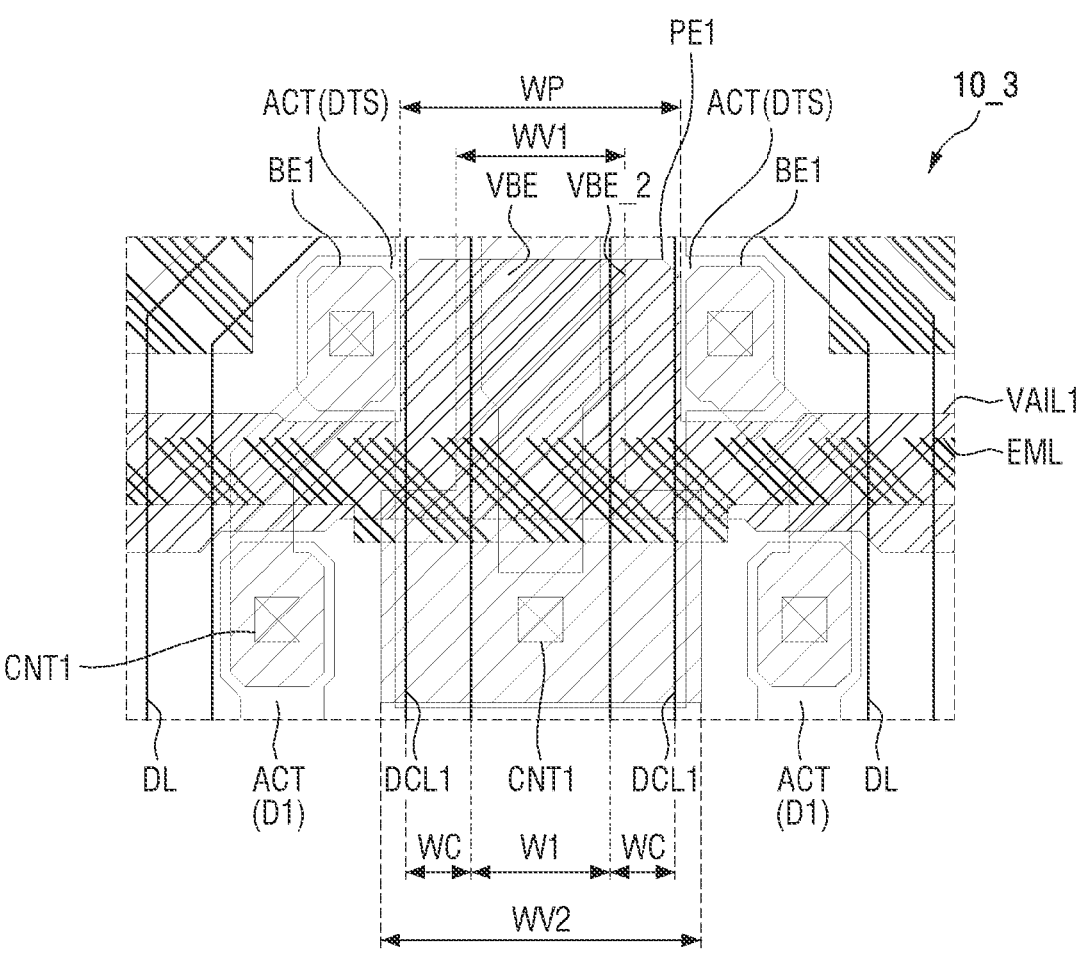
FIG. 24 is a plan view illustrating a part of a display device according to still another embodiment.

FIG. 24 is a plan view illustrating a part of a display device according to still another embodiment.

Referring to FIG. 24, in a display device 10_4 according to this embodiment, the second initialization voltage line VAIL may include different sub-initialization voltage lines VAIL_1 and VAIL_2, among which the first sub-initialization voltage line VAIL1 disposed in the third gate conductive layer may include a protrusion PE1 to overlap the first data connection line DCL1 in the thickness direction (e.g., in the plan view). A description thereof is the same as described above with reference to FIG. 16, and thus a more detailed description thereof will not be provided or may not be repeated.

Figure 25:
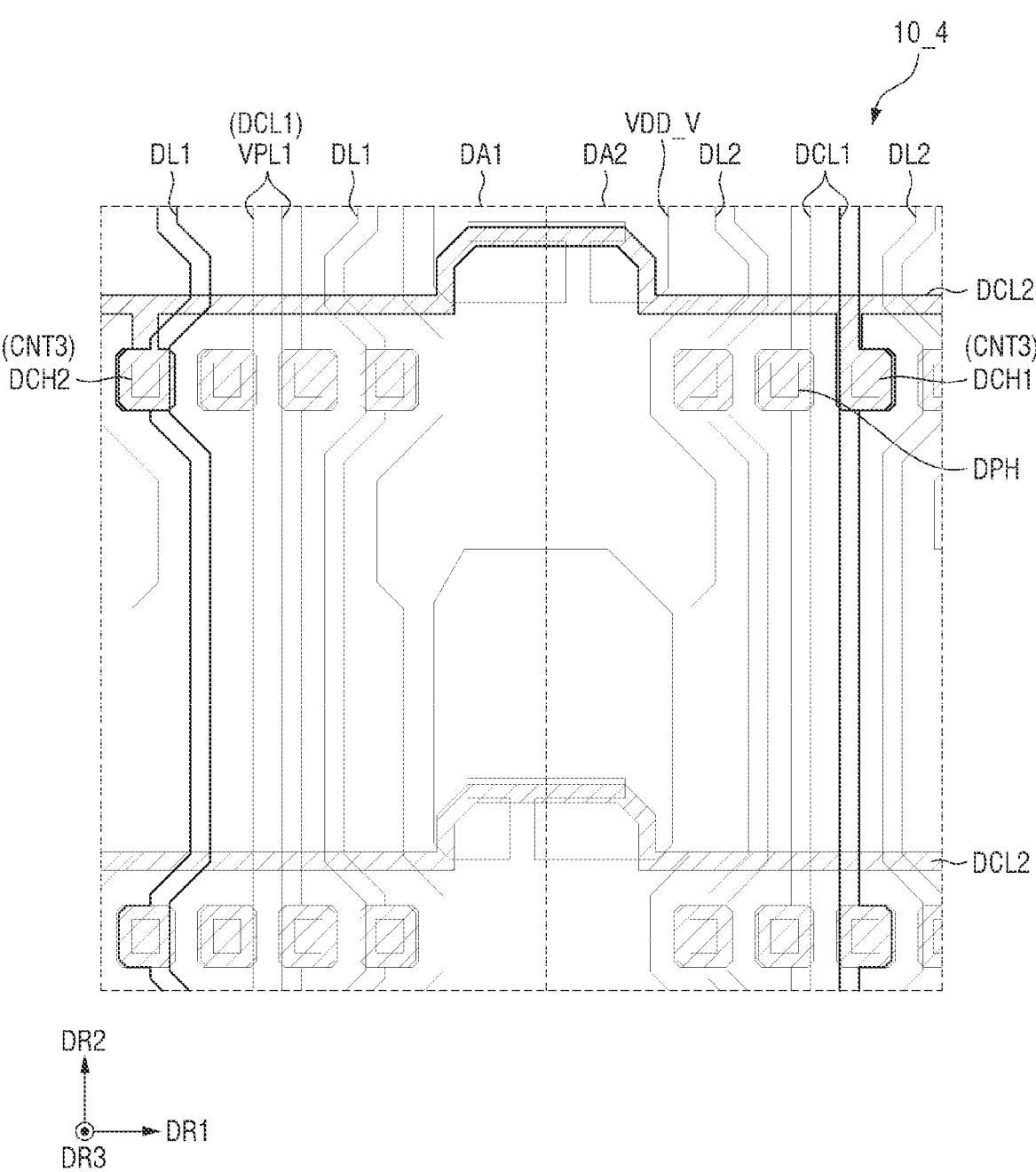
FIG. 25 is a schematic diagram illustrating an electrical connection between a data connection line and a data line in a display device according to still another embodiment.
Figure 26:
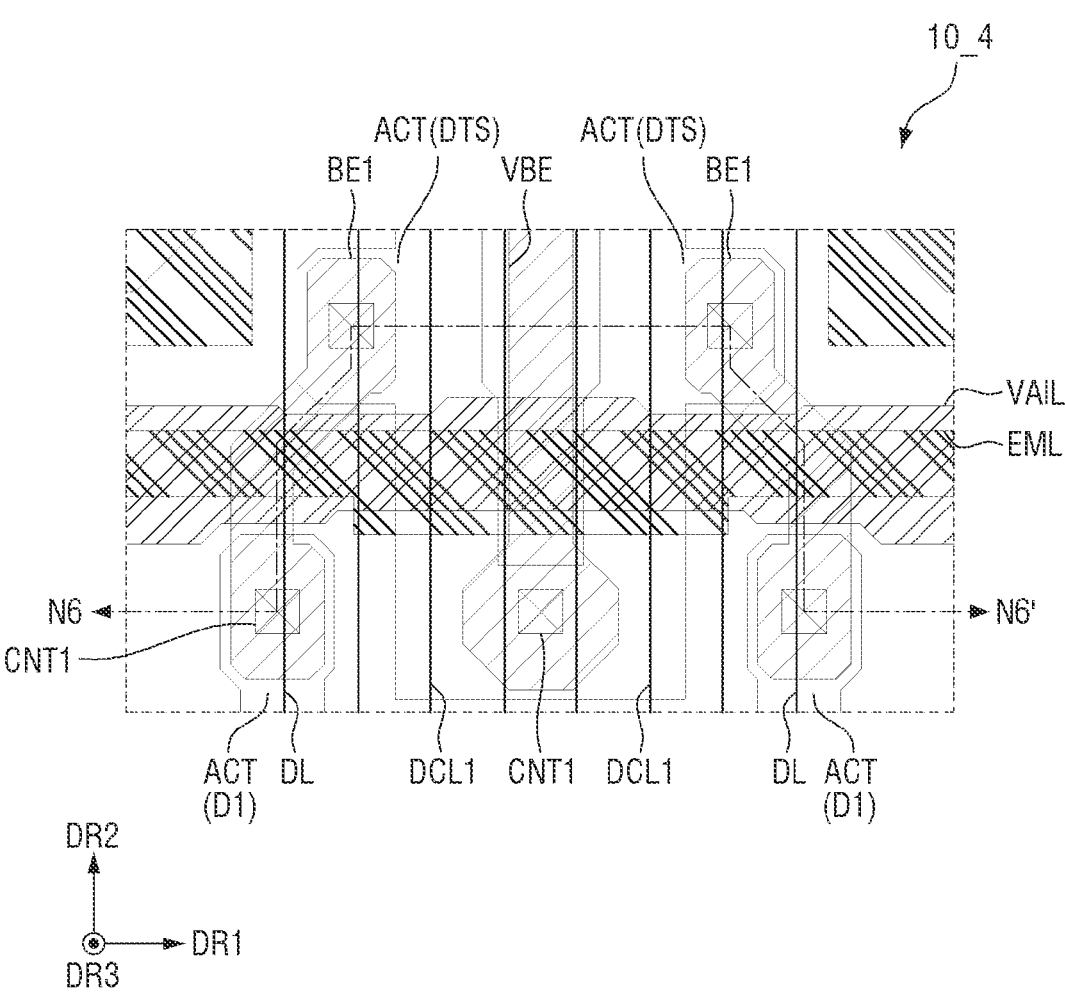
FIG. 26 is a plan view showing a part of the display device of FIG. 25.
Figure 27:
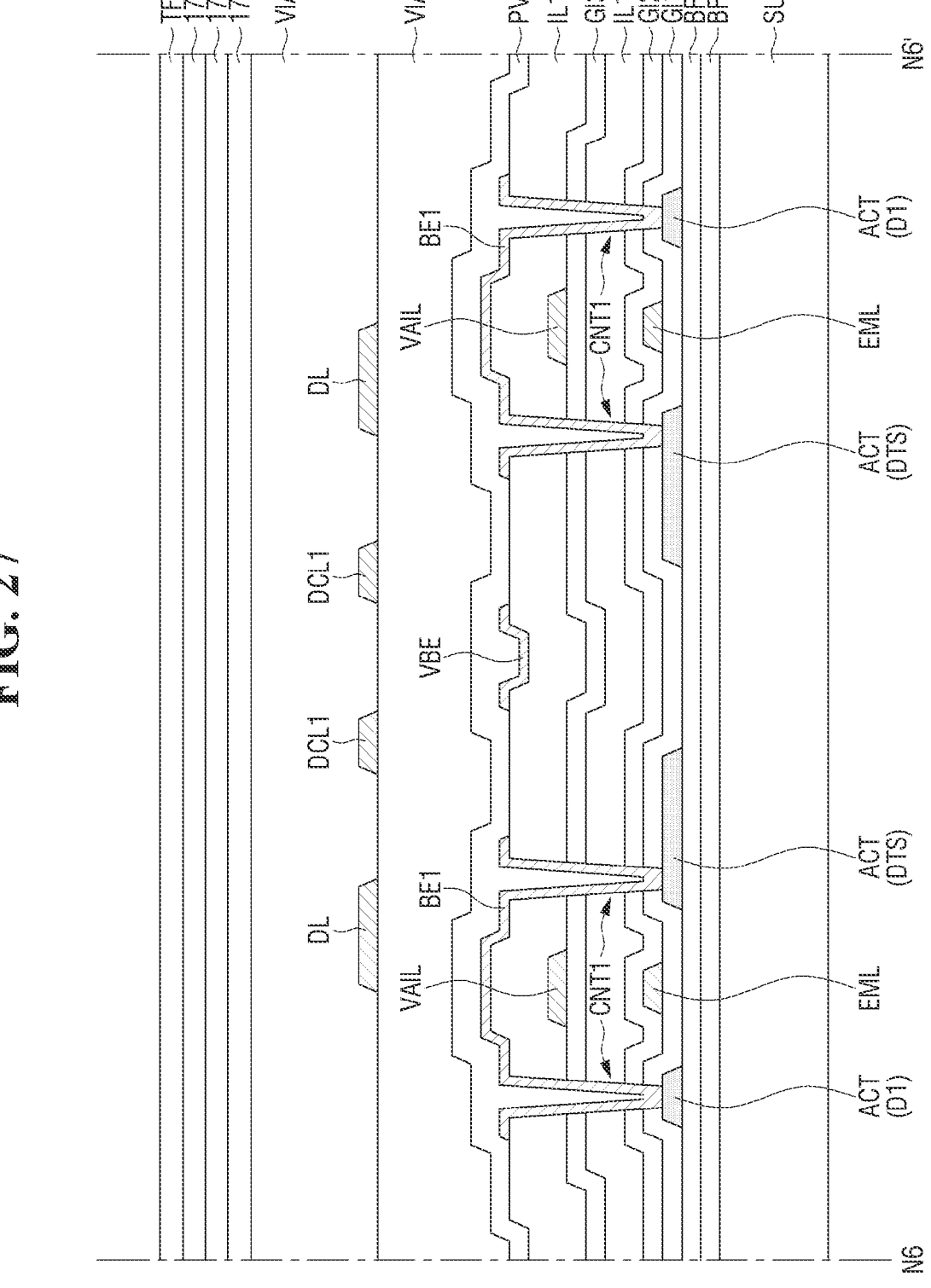
FIG. 27 is a cross-sectional view taken along line N6-N6' in FIG. 26.

FIG. 25 is a schematic diagram illustrating an electrical connection between a data connection line and a data line in a display device according to still another embodiment. FIG. 26 is a plan view showing a part of the display device of FIG. 25. FIG. 27 is a cross-sectional view taken along line N6-N6' in FIG. 26.

Referring to FIGS. 25 to 27, in the display device 10_4 according to this embodiment, the first connection electrode BE1 may be disposed to partially overlap the data line DL without overlapping the first data connection line DCL1. The first connection electrode BE1 disposed in the left sub-pixel SPX of FIG. 13 may be disposed to the left side of the first data connection line DCL1. The arrangement structure of electrodes and wires in the right sub-pixel SPX of FIG. 13 may be symmetrical to that of the left sub-pixel SPX, and the first connection electrode BE1 disposed in the right sub-pixel SPX may be disposed to the right side of the first data connection line DCL1. In the left and right sub-pixels SPX, the first connection electrodes BE1 may each overlap the data line DL in the thickness direction (e.g., in the plan view). This embodiment is different from the embodiment of FIGS. 12 to 15 in that the shape of the data line DL is different.

The first data connection line DCL1 may be disposed to extend in the second direction DR2 irrespective of its position, and the data lines DL may have a shape of extending in the second direction DR2 and being partially bent at a portion where the second data connection hole DCH2 is disposed. Similarly to the first data connection line DCL1, the data line DL may have a shape extending in the second direction DR2 except for a portion where the second data connection hole DCH2 is disposed. Accordingly, the first data connection line DCL1 may not overlap the first connection electrode BE1, and the data line DL may overlap the first connection electrode BE1.

As the display device above, in the display device 10, because parasitic capacitance between the first connection electrodes BE1 may not be formed when a data signal is applied to the first data connection line DCL1, the first connection electrode BE1 and the data line DL may not necessarily be disposed without overlapping.

Figure 28:
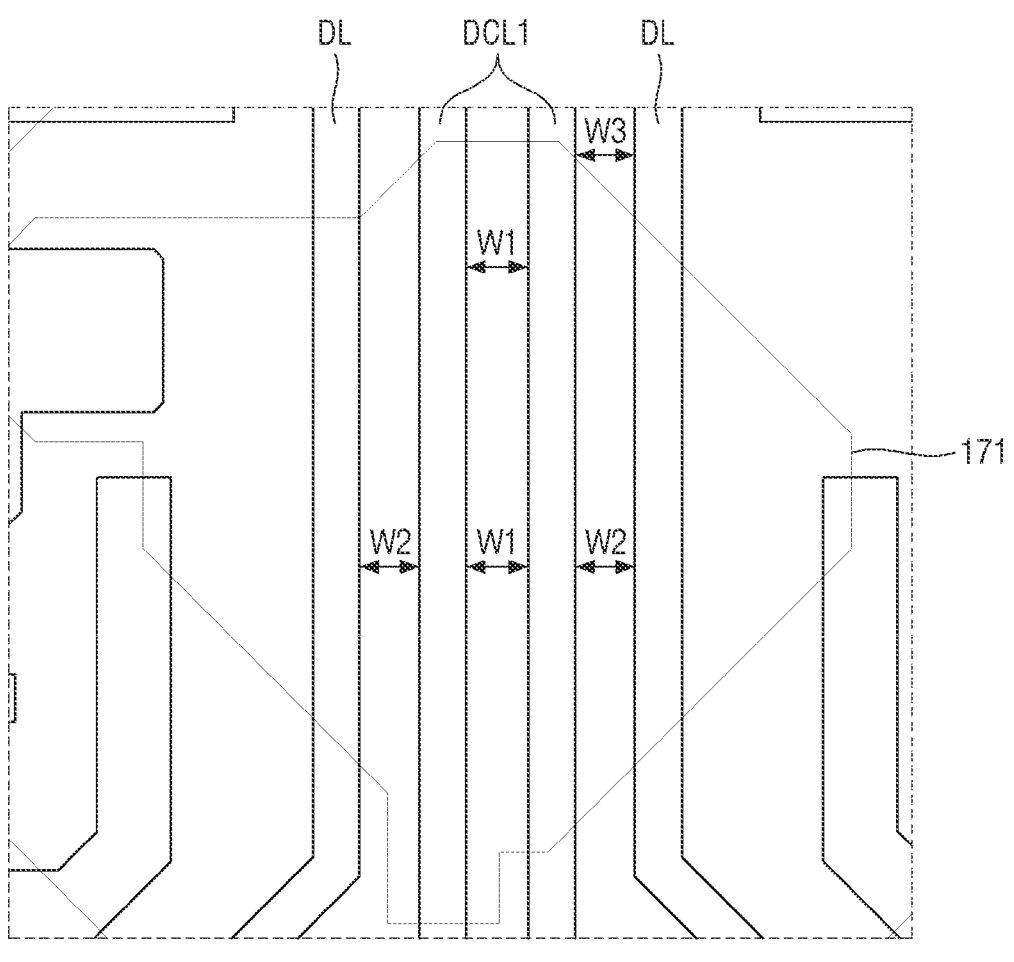
FIG. 28 is a plan view illustrating a pixel electrode disposed in a plurality of sub-pixels of the display device of FIG. 25.

FIG. 28 is a plan view illustrating a pixel electrode disposed in a plurality of sub-pixels of the display device of FIG. 25. FIG. 28 illustrates a relative planar arrangement of the pixel electrode 171, the first data connection line DCL1, and the data line DL in the display device 10_4 of FIG. 25.

Referring to FIG. 28, the first data connection lines DCL1 and the data lines DL of the sub-pixel SPX may be disposed to overlap the pixel electrode 171 of the light emitting element ED. As the first data connection lines DCL1 and the data lines DL are disposed to be spaced apart from each other, and the data line DL has a substantially linear shape extending in the second direction DR2, a distance between the data line DL and the first data connection line DCL1 may be substantially constant regardless of the position.

For example, the separation distance W2 between the first data connection line DCL1 and the data line DL at a portion where they overlap the pixel electrode 171 may be substantially the same as the separation distance W3 therebetween at a portion where they do not overlap the pixel electrode 171. The separation distance W3 between the first data connection line DCL1 and the data line DL at a portion where they do not overlap the pixel electrode 171 may be substantially the same as the distance W1 between the first data connection lines DCL1. In each sub-pixel SPX, the first connection electrode BE1 may be disposed to overlap the pixel electrode 171, and unlike the embodiment of FIG. 15, the distance between the data line DL and the first data connection line DCL1 may be maintained constant even at a portion where the data line DL overlaps the first connection electrode BE1. As shown in FIGS. 26 and 27, the distance between the first data connection line DCL1 and the data lines DL may be constant regardless of the arrangement of the first connection electrode BE1.

Figure 29:
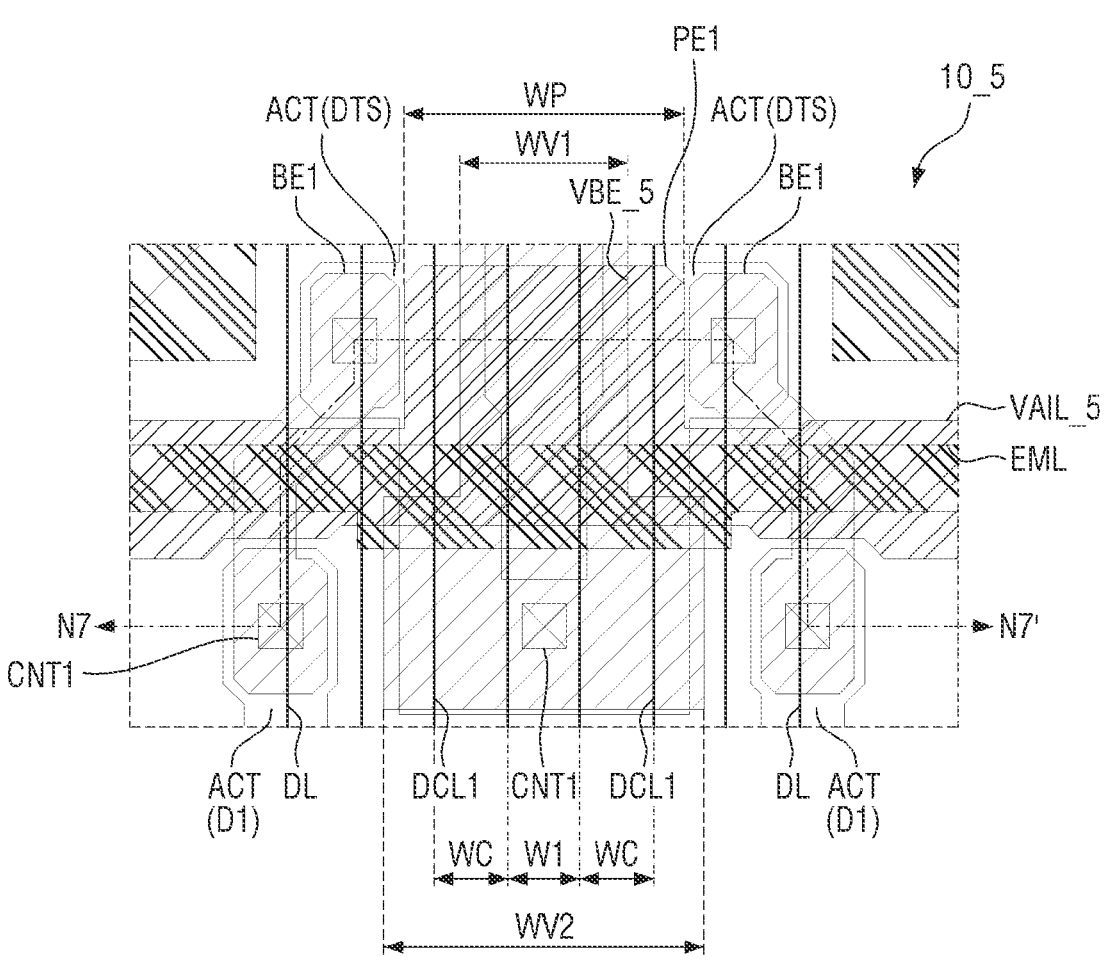
FIG. 29 is a plan view illustrating a part of a display device according to still another embodiment.
Figure 30:
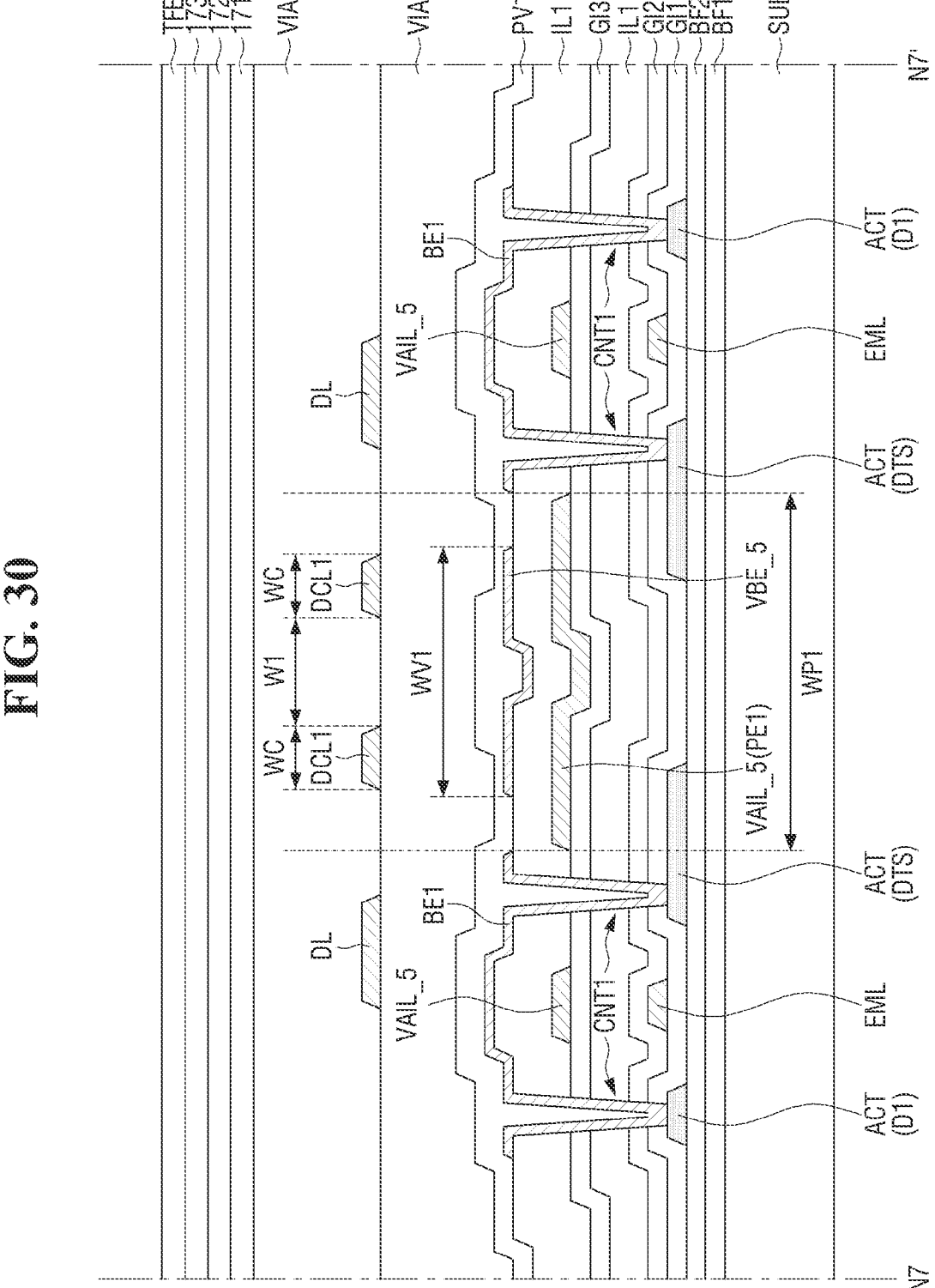
FIG. 30 is a cross-sectional view taken along line N7-N7' in FIG. 29.

FIG. 29 is a plan view illustrating a part of a display device according to still another embodiment. FIG. 30 is a cross-sectional view taken along line N7-N7' in FIG. 29.

Referring to FIGS. 29 and 30, a display device 10_5 according to this embodiment may be configured such that, similarly to the display device 10_4 of FIGS. 25 to 28, the data line DL has a substantially linear shape and is disposed to overlap the first connection electrode BE1, a second initialization voltage line VAIL_5 extends in the first direction DR1 and includes a protrusion PE1 protruding in the second direction DR2, and a voltage connection electrode VBE_5 is disposed to overlap the first data connection lines DCL1 in the thickness direction (e.g., in the plan view) between two adjacent first connection electrodes BE1 in the plan view. This embodiment may have a structure in which the embodiment of FIGS. 25 to 28 and the embodiment of FIGS. 16 and 18 are combined. The display device 10_5 includes the data line DL having a linear shape and overlapping the first connection electrode BE1, and the protrusion PE1 of the second initialization voltage line VAIL_5, thereby preventing, reducing, or suppressing parasitic capacitance from being formed between the first electrode DTS of the driving transistor DT and the first data connection lines DCL1. In some embodiments, the voltage connection electrode VBE_5 may be disposed between the first connection electrodes BE1 to prevent, reduce, or suppress parasitic capacitance from being formed between the first data connection line DCL1 and the side portion of the first connection electrode BE1. Because descriptions of these structures may each independently be the same as those described above, more detailed descriptions will not be provided or may not be repeated.

As described above, the display device 10 according to one embodiment may have one or more suitable wiring and electrode arrangement structures to prevent, reduce, or suppress formation of parasitic capacitance between the first connection electrode BE1 and the first data connection lines DCL1. The above-described embodiments may have a structure to reduce parasitic capacitance through a shielding structure between the first data connection line DCL1 and the first connection electrode BE1 or the arrangement structure of the first data connection line DCL1. However, the present disclosure is not limited thereto. In the display device 10, the parasitic capacitance may be reduced through a shielding structure between the first data connection line DCL1 and the first connection electrode BE1 by changing the structure of the first connection electrode BE1.

Figure 31:
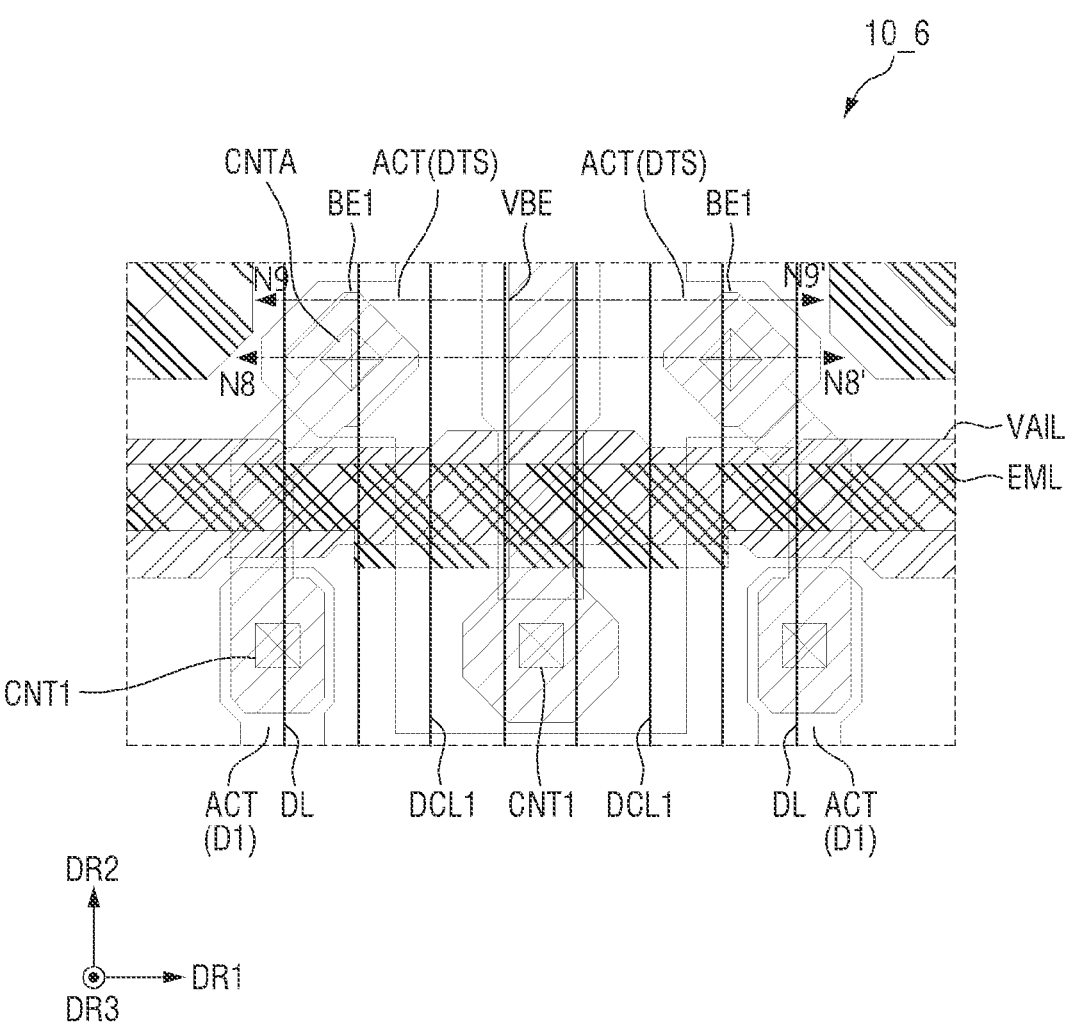
FIG. 31 is a plan view illustrating a part of a display device according to still another embodiment.
Figure 32:
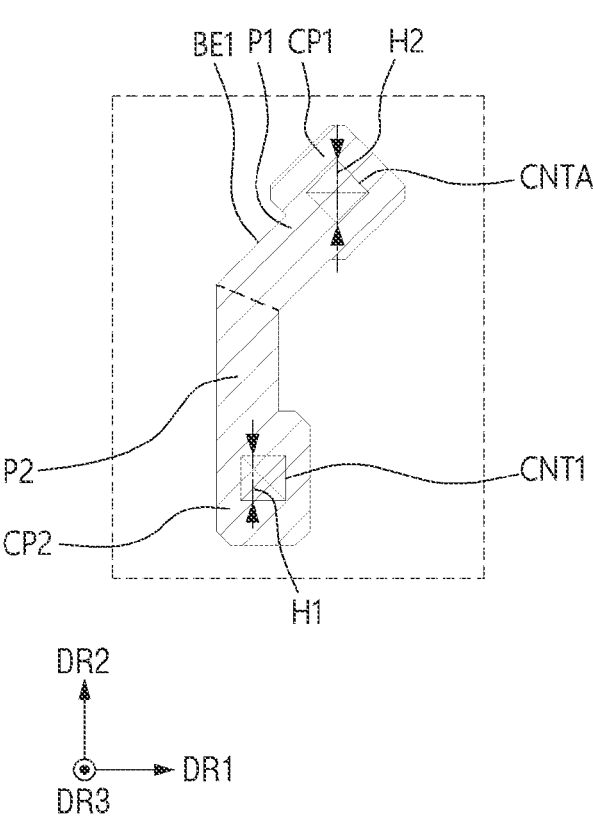
FIG. 32 is a plan view illustrating the first connection electrode of FIG. 31.

FIG. 31 is a plan view illustrating a part of a display device according to still another embodiment. FIG. 32 is a plan view illustrating the first connection electrode of FIG. 31.

Referring to FIGS. 31 and 32, in a display device 10_6 according to one embodiment, a portion of the first connection electrode BE1 in contact with the first electrode DTS of the driving transistor DT and a portion of the first connection electrode BE1 in contact with the second electrode D1 of the first transistor ST1 may have different planar structures and contact hole structures. In the display device 106, the first connection electrode BE1 may include a first portion P1 extending in a diagonal direction or an oblique direction, and a second portion P2 coupled (e.g., connected) to the first portion P1 and parallel (e.g., substantially parallel) to a vertical direction or the second direction DR2. The first portion P1 of the first connection electrode BE1 may be in contact with the first electrode DTS of the driving transistor DT, and the second portion P2 thereof may be in contact with the second electrode D1 of the first transistor ST1. A part where an electrode contact hole CNTA is formed in the first portion P1 of the first connection electrode BE1 may be more adjacent to (e.g., may be closer to) the first data connection line DCL1 than a part where the first contact hole CNT1 is formed in the second portion P2 of the first connection electrode BE1. The first portion P1 of the first connection electrode BE1 may form parasitic capacitance with the first data connection line DCL1, and the first portion P1 may have a shape that reduces or minimizes the parasitic capacitance.

For example, contact portions CP1 and CP2 in which the electrode contact hole CNTA and the first contact hole CNT1 are formed in the first portion P1 and the second portion P2 of the first connection electrode BE1, respectively, may have a shape having a larger area in the plan view or a larger width than other portions. As shown in the drawing, first and second contact portions CP1 and CP2 in which the electrode contact hole CNTA and the first contact hole CNT1 are formed in the first portion P1 and the second portion P2 of the first connection electrode BE1 may each have a larger width than other portions and may have a rectangular shape in the plan view. This structure may be for securing a space where the electrode contact hole CNTA and the first contact hole CNT1 can be formed in the first connection electrode BE1.

In the first portion P1 of the first connection electrode BE1, each lateral side of the first contact portion CP1 in which the electrode contact hole CNTA is formed may not be parallel (e.g., may be substantially non-parallel) to the first data connection line DCL1. For example, the first portion P1 of the first connection electrode BE1 may have a shape extending in the diagonal direction or the oblique direction crossing (e.g., intersecting) the first and second directions DR1 and DR2. Each lateral side of the first contact portion CP1 of the first portion P1 may also extend in a diagonal direction crossing (e.g., intersecting) the first and second directions DR1 and DR2. In an embodiment, the inclination of the first portion P1 with respect to the first direction DR1, which is a horizontal direction, or to the second direction DR2, which is a vertical direction, may be in a range of about 30° to about 60°, or in a range of about 45°.

On the other hand, in the second portion P2 of the first connection electrode BE1, each lateral side of the second contact portion CP2 in which the first contact hole CNT1 is formed may be parallel (e.g., substantially parallel) to the first data connection line DCL1. For example, the second portion P2 of the first connection electrode BE1 may have a shape extending in the second direction DR2. Some of the lateral sides of the second contact portion CP2 of the second portion P2 may extend in the second direction DR2. In an embodiment in which the first data connection line DCL1 is disposed to extend in the second direction DR2, each lateral side in the first portion P1 of the first connection electrode BE1 may not be parallel (e.g., may be substantially non-parallel) to the first data connection line DCL1, and each lateral side in the second portion P2 thereof may be parallel (e.g., substantially parallel) to the first data connection line DCL1.

According to one embodiment, the first portion P1 of the first connection electrode BE1 may have a shape in which the distance from the first data connection line DCL1 varies depending on the position in the first contact portion CP1 in which the electrode contact hole CNTA is formed. The first connection electrode BE1 may be disposed adjacent to the first data connection line DCL1 to form the parasitic capacitance, but the magnitude of the parasitic capacitance may be reduced because the distance from the first data connection line DCL1 varies depending on the position.

Figure 33:
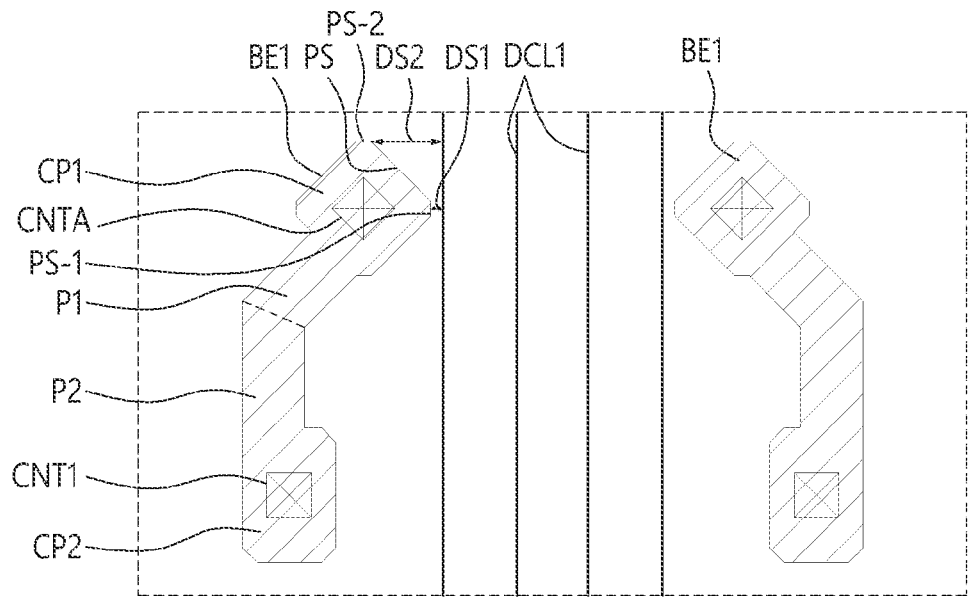
FIG. 33 is a plan view illustrating the arrangement of a first connection electrode and first data connection lines of FIG. 31.
Figure 34:
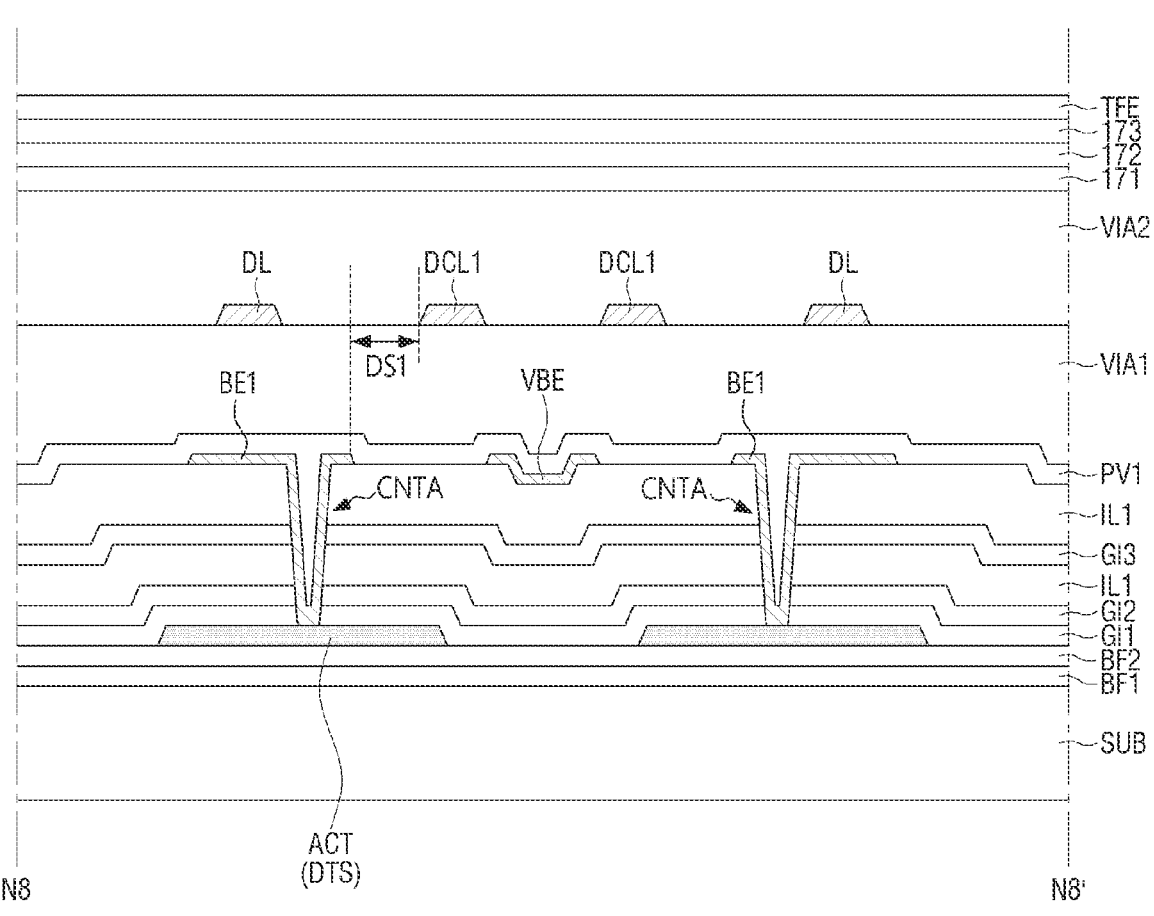
FIG. 34 is a cross-sectional view taken along line N8-N8' of FIG. 31.
Figure 35:
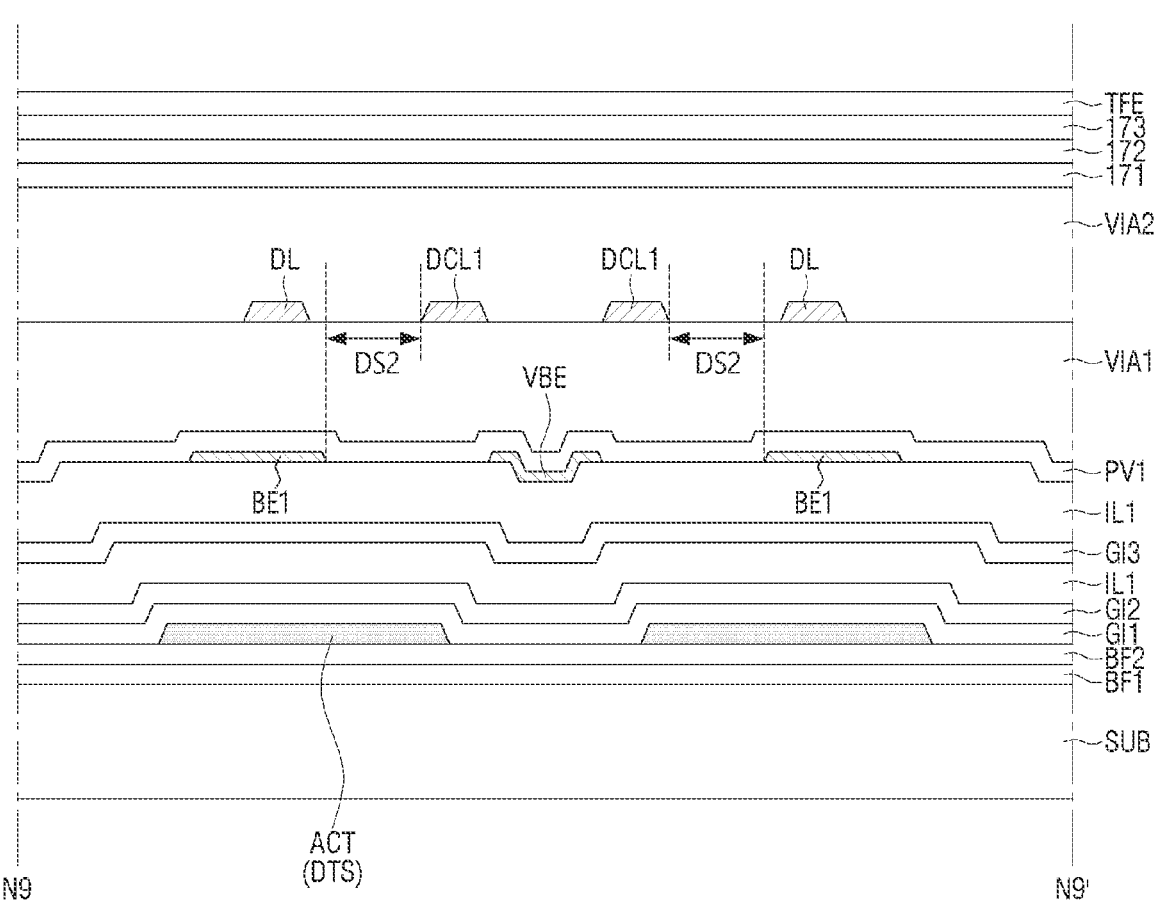
FIG. 35 is a cross-sectional view taken along line N9-N9' of FIG. 31.

FIG. 33 is a plan view illustrating the arrangement of a first connection electrode and first data connection lines of FIG. 31. FIG. 34 is a cross-sectional view taken along line N8-N8' of FIG. 31. FIG. 35 is a cross-sectional view taken along line N9-N9' of FIG. 31. FIG. 34 shows a cross section traversing the center of the electrode contact hole CNTA of the first portion P1 of the first connection electrode BE1. FIG. 35 shows a cross section traversing the shortest part in the second direction DR2 of the first portion P1 of the first connection electrode BE1.

Referring to FIGS. 33 to 35 in addition to FIGS. 31 and 32, as the first connection electrode BE1 has a shape in which the first portion P1 extends in the diagonal direction, the lateral sides of the first contact portion CP1 where the electrode contact hole CNTA is disposed may also extend in diagonal directions, and distances between the edges of the first contact portion CP1 of the first portion P1 and the first data connection line DCL1 may be different from each other. For example, the first contact portion CP1 of the first portion P1 may include a first lateral side PS facing the first data connection line DCL1, and both (e.g., opposite) ends PS-1 and PS-2 of the first lateral side PS may have different distances DS1 and DS2, respectively, from the first data connection line DCL1. A first point PS-1 (or first end) adjacent to the first data connection line DCL1 between the both (e.g., simultaneously) ends of the first lateral side PS of the first portion P1 may be closer to the first data connection line DCL1 than a second point PS-2 (or second end) opposite to the first point PS-1 between the both (e.g., opposite) ends of the first lateral side PS. A first distance DS1 between the first point PS-1 of the first portion P1 and the first data connection line DCL1 may be smaller than a second distance DS2 between the second point PS-2 of the first portion P1 and the first data connection line DCL1. FIG. 34 may be a cross section passing through the first point PS-1 of the first portion P1, and FIG. 35 may be a cross section passing through the second point PS-2 of the first portion P1.

The first contact portion CP1 of the first portion P1 of the first connection electrode BE1 and the first data connection line DCL1 may be disposed adjacent to each other, so that the parasitic capacitance may be formed between them. However, as the first portion P1 has a shape extending in the diagonal direction, the parasitic capacitance with the first data connection line DCL1 may be formed to be greatest at the first point PS-1 of the first contact portion CP1, while the magnitude of the parasitic capacitance may decrease at other points due to the larger distance from the first data connection line DCL1.

In the manufacturing process of the display device 10_6, a patterning process for forming the first connection electrode BE1 may cause a deviation in the position of the first connection electrode BE1 depending on a process deviation. The process deviation may change the distances DS1 and DS2 between the first connection electrode BE1 and the first data connection line DCL1, which may also affect the formation of the parasitic capacitance between the first connection electrode BE1 and the first data connection line DCL1. In order to prevent, reduce, or suppress unintentional formation of the parasitic capacitance caused by the process deviation, in the display device 10_6 according to one embodiment, the first connection electrode BE1 may include the first portion P1 extending in the diagonal direction, so that the distance DS1, DS2 between the first connection electrode BE1 and the first data connection line DCL1 may change, and the magnitude of the parasitic capacitance formed therebetween may be reduced. In particular, because the first portion P1 of the first connection electrode BE1 has different distances DS1 and DS2 from the first data connection line DCL1 depending on the position, even though the first connection electrode BE1 is disposed adjacent to the first data connection line DCL1 due to the process deviation, a change in the magnitude of the parasitic capacitance formed therebetween may be small.

The first connection electrode BE1 may include the first portion P1 extending in the diagonal direction and the second portion P2 extending in the second direction DR2 or vertical direction, and in the contact portions CP1 and CP2 thereof, the electrode contact hole CNTA and the first contact hole CNT1 may be formed. The electrode contact hole CNTA and the first contact hole CNT1 may each penetrate the first to third gate insulating layers G11, G12, and G13, the first interlayer insulating layer IL1, and the second interlayer insulating layer IL2. However, the shapes of the electrode contact hole CNTA and the first contact hole CNT1 in plan view may be different depending on the extension directions of the first portion P1 and the second portion P2 of the first connection electrode BE1.

According to one embodiment, the display device 10_6 may include the electrode contact hole CNTA formed to be inclined at a certain angle compared to the first contact hole CNT1, and a greatest (e.g., maximum) width H1 of the first contact hole CNT1 measured in the second direction DR2 may be smaller than a greatest (e.g., maximum) width H2 of the electrode contact hole CNTA measured in the second direction DR2. For example, the contact hole CNTA may have a same (e.g., substantially same) shape as the first contact hole CNT1, and may be rotated relative to the first contact hole CNT1 by a set angular difference (e.g., about 45 degrees). Because the first contact hole CNT1 and the electrode contact hole CNTA pass through the same layers, their greatest (e.g., maximum) diameters or widths may be the same. However, the electrode contact hole CNTA may be formed to be inclined with respect to the first contact hole CNT1 by an angle of inclination of the first portion P1 with respect to the second portion P2. Accordingly, a width H1 of the first contact hole CNT1 and a width H2 of the electrode contact hole CNTA measured in substantially the same direction may be different from each other. In the drawing, it is illustrated that the first contact hole CNT1 and the electrode contact hole CNTA each have a rectangular shape in the plan view. A first width H1 of the first contact hole CNT1 measured in the second direction DR2 may be the same (e.g., substantially the same) as the length of one lateral side of the first contact hole CNT1, while a second width H2 of the electrode contact hole CNTA measured in the second direction DR2 may be greater than the length of one lateral side of the electrode contact hole CNTA.

However, the present disclosure is not limited thereto. In some embodiments, the first contact hole CNT1 and the electrode contact hole CNTA may have a shape close to a circle in the plan view. Nevertheless, because the electrode contact hole CNTA is formed to be inclined at a certain angle compared to the first contact hole CNT1, the widths of the electrode contact hole CNTA and the first contact hole CNT1 measured to pass through their centers in the second direction DR2 may be different from each other.

In some embodiments, the extension direction of the long axis of the electrode contact hole CNTA may be different from the extension direction of the long axis of the first contact hole CNT1. In an embodiment in which the electrode contact hole CNTA and the first contact hole CNT1 have an elliptical shape close to a circle, the extension directions of the long axes of the electrode contact hole CNTA and the first contact hole CNT1 may be different from each other, and an angle between the extension directions of the above long axes may be the same (e.g., substantially same) as an angle between the extension directions of the first and second portions P1 and P2 of the first connection electrode BE1.

According to one embodiment, as the first data connection line DCL1 is disposed so as not to overlap the first connection electrode BE1 in the thickness direction, and the first connection electrode BE1 includes the first portion P1 whose pattern shape extends in the diagonal direction in the plan view, the formation of the parasitic capacitance may be reduced or minimized between the first connection electrode BE1 of the first source/drain layer and the first data connection line DCL1 of the second source/drain layer. When parasitic capacitance between the first connection electrodes BE1 is hardly formed when a data signal is applied to the first data connection line DCL1, the potential change of the first electrode DTS of the driving transistor DT may be reduced, and an effect on the amount of light emitted from the corresponding sub-pixel SPX may be reduced. Accordingly, the display device 10 may prevent or reduce a spot from occurring, or may reduce the likelihood of such occurrence, in the display area DA due to the arrangement of the first data connection line DCL1.

Figure 36:
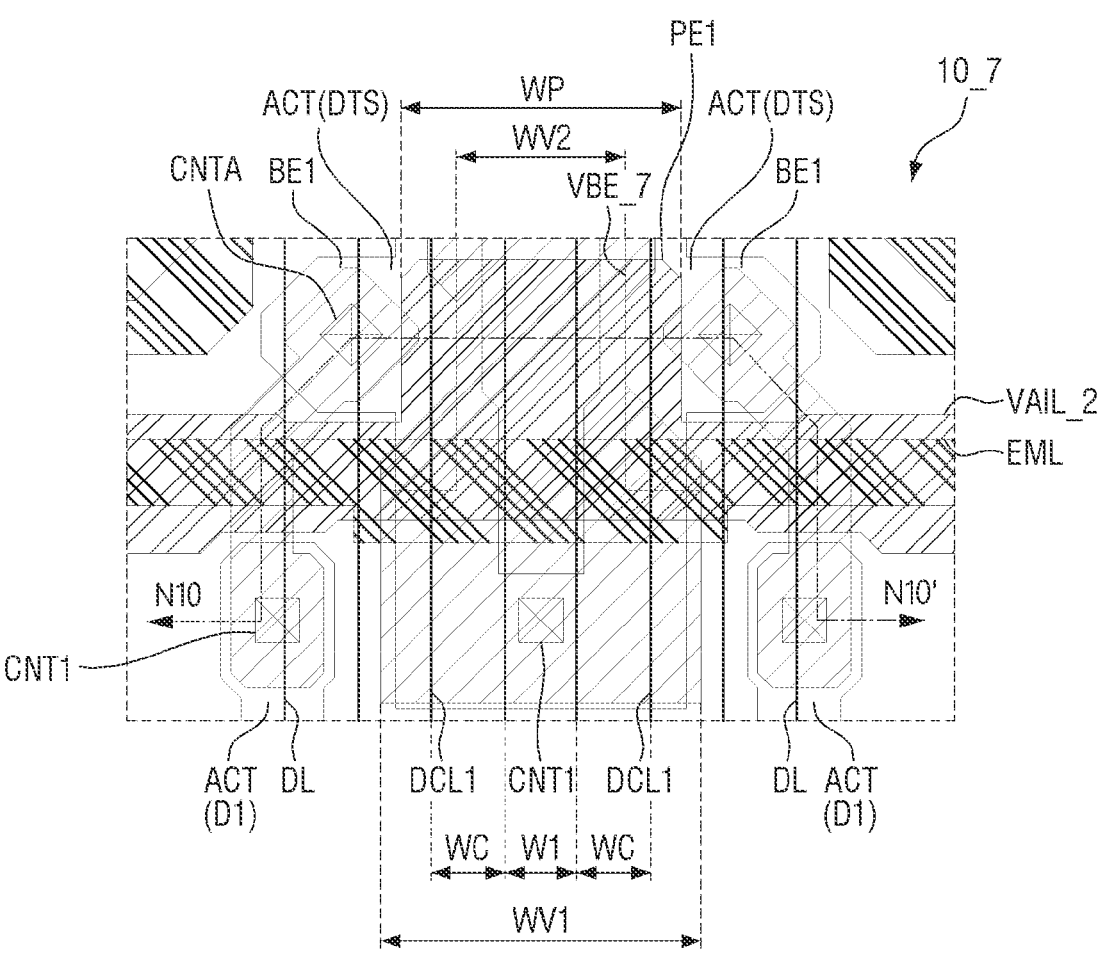
FIG. 36 is a plan view illustrating a part of a display device according to still another embodiment.
Figure 37:
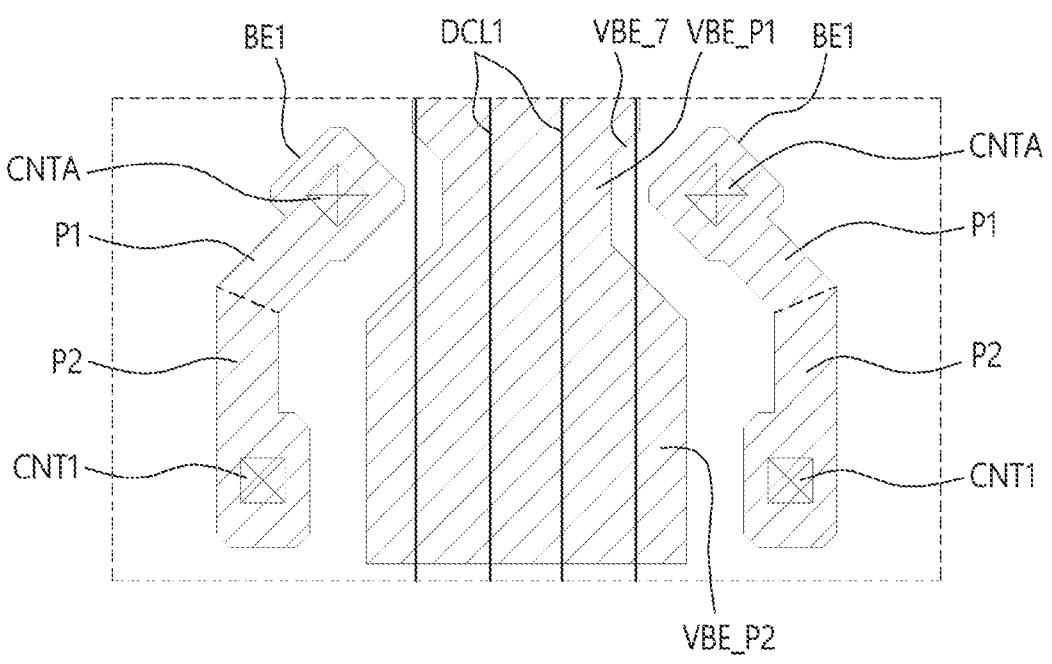
FIG. 37 is a plan view illustrating the arrangement of a first connection electrode and first data connection lines of FIG. 36.
Figure 38:
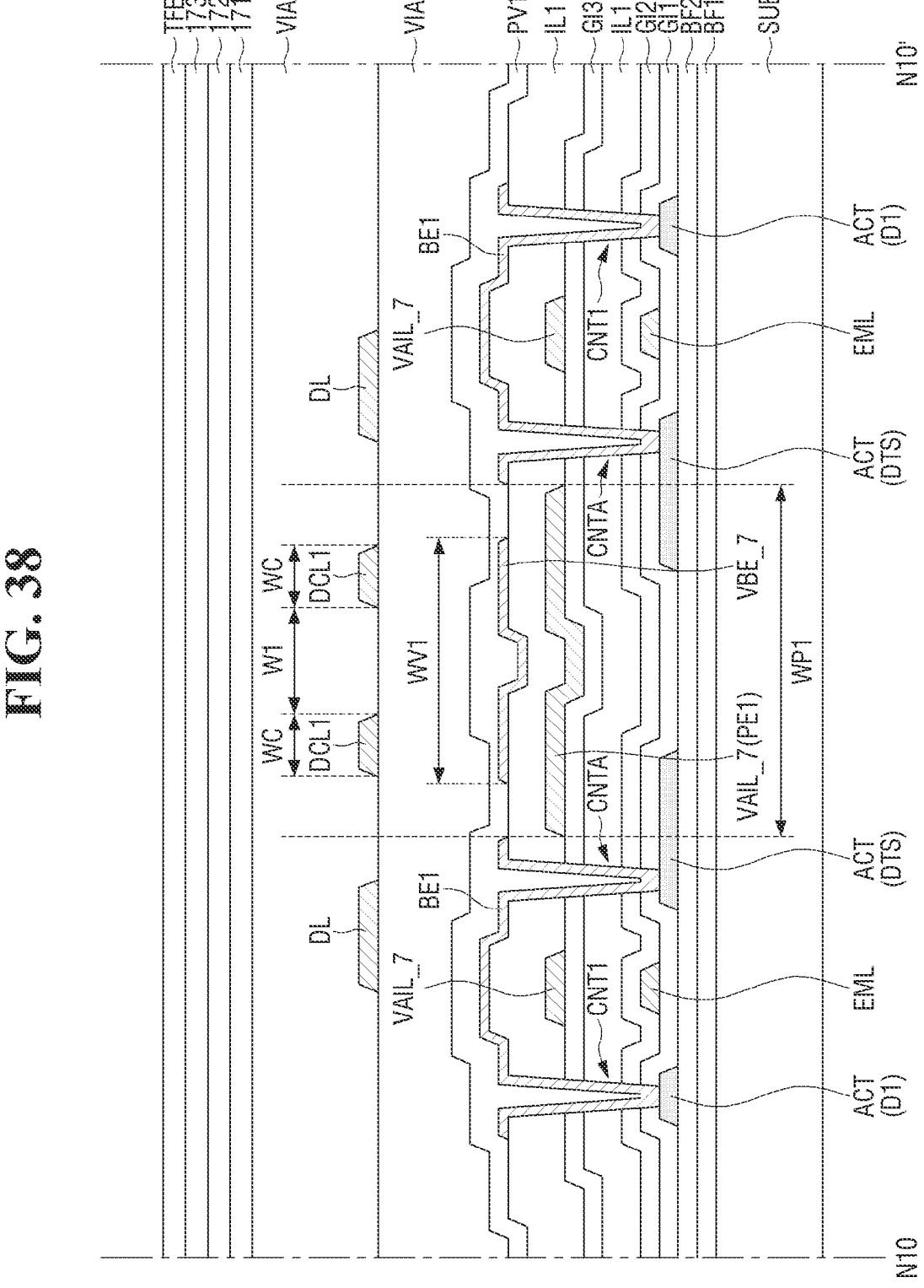
FIG. 38 is a cross-sectional view taken along line N10-N10' of FIG. 36.

FIG. 36 is a plan view illustrating a part of a display device according to still another embodiment. FIG. 37 is a plan view illustrating the arrangement of a first connection electrode and first data connection lines of FIG. 36. FIG. 38 is a cross-sectional view taken along line N10-N10' of FIG. 36.

Referring to FIGS. 36 to 38, in a display device 10_7 according to one embodiment, the first connection electrode BE1 may include a first portion P1 extending in the diagonal direction, and similarly to the display devices 10_1 and 10_2 of FIGS. 16 and 18, a second initialization voltage line VAIL_7 may include the protrusion PE1 extending in the first direction DR1 and protruding in the second direction DR2. In some embodiments, a voltage connection electrode VBE_7 may be disposed to overlap the first data connection lines DCL1 in the thickness direction (e.g., in the plan view) between two adjacent first connection electrodes BE1 in the plan view. This embodiment may have a structure in which the embodiment of FIGS. 31 to 35 and the embodiment of FIGS. 16 and 18 are combined (e.g., in which at least some features from each of these embodiments are combined). In the display device 10_7, because the first connection electrode BE1 includes the first portion P1 extending in the diagonal direction, a distance between the first data connection line DCL1 and the first connection electrode BE1 varies depending on the position, and the second initialization voltage line VAIL_7 includes the protrusion PE1, it is possible to prevent, reduce, or suppress the parasitic capacitance from being formed between the first electrode DTS of the driving transistor DT and the first data connection lines DCL1.

In some embodiments, as the voltage connection electrode VBE_7 is disposed between the first connection electrodes BE1, the parasitic capacitance may be prevented, reduce, or suppressed from being formed between the side surface of the first connection electrode BE1 and the first data connection line DCL1. However, as a difference between the present embodiment and the embodiment of FIG. 18, the voltage connection electrode VBE_7 may have a partially recessed pattern shape corresponding to the shape of the first connection electrode BE1 extending in the diagonal direction. Because the first connection electrode BE1 and the voltage connection electrode VBE_7 are disposed on the same conductive layer, interference may occur between them depending on the pattern shape of the first connection electrode BE1. In order to prevent or reduce this, the voltage connection electrode VBE_7 may be disposed between the first connection electrodes BE1, and may be partially recessed corresponding to the shape of the first contact portion CP1 of the first portion P1 of the first connection electrode BE1. In one embodiment, the width of a portion VBE_P1 of the voltage connection electrode VBE_7 disposed between the first portions P1 of the first connection electrode BE1 may be smaller than the width of a portion VBE_P2 of the voltage connection electrode VBE_7 disposed between the second portions P2. In some embodiments, the width of a portion of the voltage connection electrode VBE_7 adjacent to the first portion P1 of the first connection electrode BE1 may be smaller than the width of a portion of the voltage connection electrode VBE_7 adjacent to the second portion P2. The voltage connection electrode VBE_7 may have a structure that prevents or suppresses the formation of the parasitic capacitance on the side surfaces of the first connection electrode BE1 and the first data connection line DCL1, and prevents or reduces physical interference with the first connection electrode BE1. In some embodiments, because the structures of the protrusion PE1 of the second initialization voltage line VAIL_7 and the voltage connection electrode VBE_7 may each independently be the same as those described above, more detailed descriptions thereof will not be provided or may not be repeated.

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the [device] may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the example embodiments of the present disclosure.

In concluding the detailed description, those skilled in the art will appreciate that many variations and modifications can be made to the example embodiments without substantially departing from the principles of the present disclosure. Therefore, the disclosed example embodiments of the present disclosure are utilized in a generic and descriptive sense only and not for purposes of limitation.

What is claimed is:

1. A display device comprising:
a display area having a plurality of sub-pixels arranged in a first direction and in a second direction crossing the first direction, and a non-display area around the display area;
a plurality of data lines in the display area and extending in the second direction;
first data connection lines in the display area and extending in the second direction, a first data connection line of the first data connection lines being in a sub-pixel of the plurality of sub-pixels and spaced in the first direction from a data line of the plurality of data lines in the sub-pixel; and
second data connection lines in the display area, extending in the first direction, and coupled to at least one of the first data connection lines,
wherein the sub-pixel comprises a first connection electrode coupled to a first electrode of a driving transistor of the sub-pixel, and
the first connection electrode does not overlap, in a plan view parallel to the first and second directions, the first data connection line and is between, in the plan view, the first data connection line and the data line.

2. The display device of claim 1, wherein the first connection electrode does not overlap, in the plan view, the data line, and a part of the first data connection line overlaps, in the plan view, the first electrode of the driving transistor.

3. The display device of claim 1, further comprising an initialization voltage line extending in the first direction and comprising a protrusion protruding in the second direction to be adjacent to the first connection electrode,
wherein the protrusion of the initialization voltage line overlaps, in the plan view, the first data connection line.

4. The display device of claim 3, wherein a width of the protrusion of the initialization voltage line is greater than a width of the first data connection line.

5. The display device of claim 1, further comprising a plurality of first vertical lines extending in the second direction, a first vertical line of the plurality of first vertical lines being spaced in the first direction from the first data connection line and from the data line,
wherein a distance between the first vertical line and the data line is smaller than a distance between the first vertical line and the first data connection line.

6. The display device of claim 5, further comprising a voltage connection electrode in the sub-pixel and coupled to the first vertical line,
wherein at least a part of the voltage connection electrode overlaps, in the plan view, the first data connection line.

7. The display device of claim 6, wherein the voltage connection electrode overlaps, in the plan view, the first electrode of the driving transistor.

8. The display device of claim 6, wherein a greatest line width of the voltage connection electrode is greater than a width of the first data connection line.

9. The display device of claim 1, further comprising:
a bias voltage line extending in the first direction; and
a first transistor coupled to the bias voltage line,
wherein the first transistor is coupled to the first connection electrode.

10. The display device of claim 1, wherein the display area comprises a first display area and a second display area adjacent to the first display area in the first direction, and the plurality of data lines comprise first data lines in the first display area and coupled to the second data connection lines, and second data lines in the second display area and not directly coupled to the second data connection lines.

11. The display device of claim 10, wherein at least some of the first data connection lines are electrically coupled to the first data lines through the second data connection lines.

12. The display device of claim 10, further comprising:
first fan-out lines in the non-display area and coupled to the first data connection lines; and
second fan-out lines in the non-display area and coupled to the second data lines.

13. The display device of claim 10, further comprising:
a plurality of vertical dummy patterns in the second display area and spaced from the first data connection lines in the second direction; and
a plurality of horizontal dummy patterns spaced from the second data connection lines in the first direction.

14. The display device of claim 10, further comprising:
a horizontal power line extending in the first direction in the display area and spaced from the second data connection lines in the second direction; and
a vertical power line extending in the second direction in the first display area and spaced from the first data lines.

15. The display device of claim 1, wherein the first connection electrode overlaps, in the plan view, the data line, and
a part of the first data connection line overlaps, in the plan view, the first electrode of the driving transistor.

16. A display device comprising:
a first sub-pixel and a second sub-pixel, each comprising a driving transistor and a first connection electrode coupled to a first electrode of the driving transistor, and being adjacent to each other in a first direction;
a plurality of first data connection lines in the first sub-pixel and the second sub-pixel, spaced from each other in the first direction, and extending in a second direction crossing the first direction;
a plurality of data lines spaced from each other in the first direction with the plurality of first data connection lines interposed therebetween and extending in the second direction;
a second data connection line extending in the first direction, in the first sub-pixel and the second sub-pixel, and coupled to any one of the first data connection lines; and
a plurality of first vertical lines extending in the second direction and spaced from the plurality of data lines in the first direction,
wherein the first connection electrode of the first sub-pixel is between, in a plan view parallel to the first and second directions, a first data connection line corresponding to the first sub-pixel of the plurality of first data connection lines and a data line corresponding to the first sub-pixel of the plurality of data lines, and the first connection electrode of the second sub-pixel is between, in the plan view, a first data connection line corresponding to the second sub-pixel of the plurality of first data connection lines and a data line corresponding to the second sub-pixel of the plurality of data lines.

17. The display device of claim 16, wherein a distance between the first data connection line corresponding to the first sub-pixel and the first data connection line corresponding to the second sub-pixel is smaller than a distance between the data line corresponding to the first sub-pixel and the data line corresponding to the second sub-pixel.

18. The display device of claim 17, wherein the first data connection line corresponding to the first sub-pixel and the first data connection line corresponding to the second sub-pixel are between the first connection electrodes of the first sub-pixel and the second sub-pixel.

19. The display device of claim 16, wherein the first data connection lines corresponding to the first and second sub-pixels respectively overlap, in the plan view, the corresponding first electrode of the driving transistor without overlapping, in the plan view, the corresponding first connection electrode.

20. The display device of claim 16, further comprising an initialization voltage line extending in the first direction and in the first sub-pixel and the second sub-pixel, wherein the initialization voltage line is between the first connection electrodes of the first sub-pixel and the second sub-pixel, and comprises a protrusion protruding in the second direction.

21. The display device of claim 20, wherein the protrusion overlaps, in the plan view, the first data connection lines corresponding to the first sub-pixel and the second sub-pixel, and a width of the protrusion is greater than a width of the first data connection lines corresponding to the first sub-pixel and the second sub-pixel.

22. The display device of claim 21, wherein the width of the protrusion is greater than a distance between the first data connection line corresponding to the first sub-pixel and the first data connection line corresponding to the second sub-pixel.

23. The display device of claim 16, further comprising a voltage connection electrode coupled to a first vertical line of the plurality of first vertical lines, and between the first data connection lines corresponding to the first sub-pixel and the second sub-pixel, wherein the voltage connection electrode overlaps, in the plan view, the first data connection lines corresponding to the first sub-pixel and the second sub-pixel.

24. The display device of claim 23, wherein the voltage connection electrode overlaps, in the plan view, each of the first electrode of the driving transistor of the first sub-pixel and the first electrode of the driving transistor of the second sub-pixel.

25. The display device of claim 23, wherein a smallest line width of the voltage connection electrode is greater than a distance between the first data connection lines corresponding to the first sub-pixel and the second sub-pixel.

26. The display device of claim 23, wherein a greatest line width of the voltage connection electrode is greater than a sum of widths of each of the first data connection lines corresponding to the first sub-pixel and the second sub-pixel and a distance between the first data connection lines corresponding to the first sub-pixel and the second sub-pixel.

27. The display device of claim 16, further comprising a first sub-initialization voltage line extending in the first direction and coupled to the second sub-pixel, and a second sub-initialization voltage line extending in the first direction and coupled to the first sub-pixel.

28. The display device of claim 27, further comprising a second connection electrode on a same layer as the second sub-initialization voltage line and in the second sub-pixel to be coupled to the first sub-initialization voltage line.

29. The display device of claim 16, wherein a distance between the first data connection line corresponding to the first sub-pixel and the first data connection line corresponding to the second sub-pixel is equal to a distance between the data line corresponding to the first sub-pixel and the data line corresponding to the second sub-pixel.

30. The display device of claim 20, wherein the data lines corresponding to the first sub-pixel and the second sub-pixel respectively overlap, in the plan view, the first connection electrodes of the first sub-pixel and the second sub-pixel.

31. A display device comprising:

a display area having a plurality of sub-pixels arranged in a first direction and in a second direction crossing the first direction, and a non-display area around the display area;

a plurality of data lines in the display area and extending in the second direction;

first data connection lines in the display area, extending in the second direction, and spaced in the first direction from a data line of the plurality of data lines in a sub-pixel of the plurality of sub-pixels; and second data connection lines in the display area, extending in the first direction, and coupled to at least one of the first data connection lines, wherein the sub-pixel comprises a first connection electrode coupled to a first electrode of a driving transistor of the sub-pixel, and wherein the first connection electrode does not overlap, in a plan view parallel to the first and second directions, a first data connection line of the first data connection lines in the sub-pixel, and comprises a first portion extending primarily in a diagonal direction crossing the first direction and the second direction, and a second portion coupled to the first portion and extending primarily in the second direction, wherein the first connection electrode is between, in the plan view, the first data connection line and the data line.

32. The display device of claim 31, wherein the first connection electrode comprises a first contact portion in the first portion and in which an electrode contact hole is, and a second contact portion in the second portion and in which a first contact hole is, and each lateral side of the first contact portion is not parallel to the first data connection line.

33. The display device of claim 32, wherein the first contact portion comprises a first lateral side, and a distance between the first data connection line and a first end of the first lateral side is smaller than a distance between the first data connection line and a second end of the first lateral side.

34. The display device of claim 32, wherein at least some of lateral sides of the second contact portion are parallel to the first data connection line.

35. The display device of claim 32, wherein a greatest width of the electrode contact hole in the second direction is different from a greatest width of the first contact hole in the second direction.

36. The display device of claim 32, wherein an extension direction of a long axis of the electrode contact hole is different from an extension direction of a long axis of the first contact hole.

37. The display device of claim 31, wherein an angle between an extension direction of the first portion of the first connection electrode and an extension direction of the second portion of the first connection electrode is in a range of about 30° to about 60°.

38. The display device of claim 31, wherein at least a part of the first connection electrode overlaps, in the plan view, the data line, and a part of the first data connection line overlaps, in the plan view, the first electrode of the driving transistor.

39. The display device of claim 31, further comprising an initialization voltage line extending in the first direction and comprising a protrusion protruding in the second direction to be adjacent to the first connection electrode, wherein the protrusion of the initialization voltage line overlaps, in the plan view, the first data connection line.

40. The display device of claim 39, wherein a width of the protrusion of the initialization voltage line is greater than a width of the first data connection line.

41. The display device of claim 31, further comprising a voltage connection electrode in the sub-pixel and overlapping, in the plan view, the first data connection line, wherein the voltage connection electrode overlaps, in the plan view, the first electrode of the driving transistor.

42. The display device of claim 41, wherein a greatest line width of the voltage connection electrode is greater than a width of the first data connection line.

43. The display device of claim 41, wherein at least a part of the voltage connection electrode has a recessed shape corresponding to the first portion of the first connection electrode.

44. The display device of claim 43, wherein a width of a portion of the voltage connection electrode adjacent to the first portion of the first connection electrode is smaller than a width of a portion of the voltage connection electrode adjacent to the second portion of the first connection electrode.

* * * * *